(12) United States Patent
Ziemba et al.

(10) Patent No.: US 12,354,832 B2
(45) Date of Patent: Jul. 8, 2025

(54) HIGH VOLTAGE PLASMA CONTROL

(71) Applicant: Eagle Harbor Technologies, Inc., Seattle, WA (US)

(72) Inventors: Timothy Ziemba, Bainbridge Island, WA (US); Kenneth Miller, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 139 days.

(21) Appl. No.: 18/477,174

(22) Filed: Sep. 28, 2023

(65) Prior Publication Data

US 2024/0120170 A1    Apr. 11, 2024

Related U.S. Application Data

(60) Provisional application No. 63/411,600, filed on Sep. 29, 2022.

(51) Int. Cl.
| | |
|---|---|
| H01J 37/24 | (2006.01) |
| H01J 37/32 | (2006.01) |
| H01J 49/24 | (2006.01) |
| H02M 3/335 | (2006.01) |

(52) U.S. Cl.
CPC ...... *H01J 37/241* (2013.01); *H01J 37/32422* (2013.01); *H02M 3/33573* (2021.05)

(58) Field of Classification Search
None
See application file for complete search history.

(56) References Cited

U.S. PATENT DOCUMENTS

| | | |
|---|---|---|
| 3,339,108 A | 8/1967 | Holtje |
| 4,070,589 A | 1/1978 | Martinkovic |
| 4,076,996 A | 2/1978 | Maehara et al. |

(Continued)

FOREIGN PATENT DOCUMENTS

| | | |
|---|---|---|
| CA | 2292526 A1 | 12/1999 |
| CN | 101534071 A | 9/2009 |

(Continued)

OTHER PUBLICATIONS

Final Office Action in U.S. Appl. No. 15/623,464, dated Mar. 27, 2018, 18 pages.

(Continued)

*Primary Examiner* — Wei (Victor) Y Chan

(57) ABSTRACT

A high voltage pulsing power system is disclosed that include a DC power supply, a switch circuit electrically coupled with the DC power supply, a droop control circuit coupled with the switch circuit, and/or an output. The switch circuit includes a plurality of switch modules and produces a plurality of pulses. The droop control circuit includes a droop diode, a droop inductor, and a droop element. The droop diode may be electrically coupled in series between the switch circuit and the transformer primary that allows the negative pulse portion of the pulses to pass from the switching circuit to the transformer primary. The droop inductor and he droop element may be arranged in series across the droop diode to allow the negative pulse portion of the pulses to pass from the switching circuit to the transformer primary and/or store energy from the negative pulse portion of the pulses.

18 Claims, 28 Drawing Sheets

(56) References Cited

U.S. PATENT DOCUMENTS

| | | | |
|---|---|---|---|
| 4,438,331 A | 3/1984 | Davis | |
| 4,504,895 A | 3/1985 | Steigerwald | |
| 4,692,851 A | 9/1987 | Attwood | |
| 4,885,074 A | 12/1989 | Susko et al. | |
| 4,924,191 A | 5/1990 | Erb et al. | |
| 4,992,919 A | 2/1991 | Lee et al. | |
| 5,038,051 A | 8/1991 | Firman et al. | |
| 5,072,191 A | 12/1991 | Nakajima et al. | |
| 5,118,969 A | 6/1992 | Ikezi et al. | |
| 5,140,510 A | 8/1992 | Myers | |
| 5,313,481 A | 5/1994 | Cook et al. | |
| 5,321,597 A | 6/1994 | Alacoque | |
| 5,325,021 A | 6/1994 | Duckworth et al. | |
| 5,392,043 A | 2/1995 | Ribner | |
| 5,392,187 A | 2/1995 | Baliga | |
| 5,418,707 A | 5/1995 | Shimer et al. | |
| 5,451,846 A | 9/1995 | Peterson et al. | |
| 5,483,731 A | 1/1996 | Prendel et al. | |
| 5,488,552 A | 1/1996 | Sakamoto et al. | |
| 5,610,452 A | 3/1997 | Shimer et al. | |
| 5,623,171 A | 4/1997 | Nakajima | |
| 5,629,844 A | 5/1997 | Krichtafovitch et al. | |
| 5,656,123 A | 8/1997 | Salimian et al. | |
| 5,729,562 A | 3/1998 | Birx et al. | |
| 5,796,598 A | 8/1998 | Nowak et al. | |
| 5,808,504 A | 9/1998 | Chikai et al. | |
| 5,895,558 A | 4/1999 | Spence | |
| 5,905,646 A | 5/1999 | Crewson et al. | |
| 5,930,125 A | 7/1999 | Hitchcock et al. | |
| 5,933,335 A | 8/1999 | Hitchcock et al. | |
| 5,947,300 A | 9/1999 | Lange | |
| 5,968,377 A | 10/1999 | Yuasa et al. | |
| 6,059,935 A | 5/2000 | Spence | |
| 6,066,901 A | 5/2000 | Burkhart et al. | |
| 6,087,871 A | 7/2000 | Kardo-Syssoev et al. | |
| 6,205,074 B1 | 3/2001 | Van Buskirk et al. | |
| 6,222,321 B1 | 4/2001 | Scholl et al. | |
| 6,233,161 B1 | 5/2001 | Balakrishnan et al. | |
| 6,238,387 B1 | 5/2001 | Miller, III | |
| 6,239,403 B1 | 5/2001 | Dible et al. | |
| 6,252,354 B1 | 6/2001 | Collins et al. | |
| 6,253,704 B1 | 7/2001 | Savas | |
| 6,300,720 B1 | 10/2001 | Birx | |
| 6,359,542 B1 | 3/2002 | Widmayer et al. | |
| 6,362,604 B1 | 3/2002 | Cravey | |
| 6,392,187 B1 | 5/2002 | Johnson | |
| 6,416,638 B1 * | 7/2002 | Kuriyama | H01J 37/3444 |
| | | | 204/298.03 |
| 6,480,399 B2 | 11/2002 | Balakrishnan et al. | |
| 6,483,731 B1 | 11/2002 | Isurin et al. | |
| 6,496,047 B1 | 12/2002 | Iskander et al. | |
| 6,518,195 B1 | 2/2003 | Collins et al. | |
| 6,577,135 B1 | 6/2003 | Matthews et al. | |
| 6,741,120 B1 | 5/2004 | Tan | |
| 6,741,484 B2 | 5/2004 | Crewson et al. | |
| 6,815,633 B1 | 11/2004 | Chen et al. | |
| 6,831,377 B2 | 12/2004 | Yampolsky et al. | |
| 6,897,574 B2 | 5/2005 | Vaysse | |
| 6,947,300 B2 | 9/2005 | Pai et al. | |
| 7,061,230 B2 | 6/2006 | Kleine et al. | |
| 7,180,082 B1 | 2/2007 | Hassanein et al. | |
| 7,256,637 B2 | 8/2007 | Iskander et al. | |
| 7,291,545 B2 | 11/2007 | Collins et al. | |
| 7,307,375 B2 | 12/2007 | Smith et al. | |
| 7,319,579 B2 | 1/2008 | Inoue et al. | |
| 7,354,501 B2 | 4/2008 | Gondhalekar et al. | |
| 7,393,765 B2 | 7/2008 | Hanawa et al. | |
| 7,396,746 B2 | 7/2008 | Walther et al. | |
| 7,492,138 B2 | 2/2009 | Zhang et al. | |
| 7,512,433 B2 | 3/2009 | Bernhart et al. | |
| 7,521,370 B2 | 4/2009 | Hoffman | |
| 7,549,461 B2 | 6/2009 | Kroliczek et al. | |
| 7,601,619 B2 | 10/2009 | Okumura et al. | |
| 7,605,385 B2 | 10/2009 | Bauer | |
| 7,615,931 B2 | 11/2009 | Hooke et al. | |
| 7,767,433 B2 | 8/2010 | Kuthi et al. | |
| 7,901,930 B2 | 3/2011 | Kuthi et al. | |
| 7,936,544 B2 | 5/2011 | Beland | |
| 7,943,006 B2 | 5/2011 | Hoffman | |
| 7,948,185 B2 | 5/2011 | Smith et al. | |
| 7,989,987 B2 | 8/2011 | McDonald | |
| 8,093,797 B2 | 1/2012 | Tyldesley | |
| 8,093,979 B2 | 1/2012 | Wilson | |
| 8,115,343 B2 | 2/2012 | Sanders et al. | |
| 8,120,207 B2 | 2/2012 | Sanders et al. | |
| 8,129,653 B2 | 3/2012 | Kirchmeier et al. | |
| 8,143,790 B2 | 3/2012 | Smith et al. | |
| 8,222,936 B2 | 7/2012 | Friedman et al. | |
| 8,259,476 B2 | 9/2012 | Ben-Yaakov et al. | |
| 8,410,889 B2 | 4/2013 | Garrity et al. | |
| 8,436,602 B2 | 5/2013 | Sykes | |
| 8,450,985 B2 | 5/2013 | Gray et al. | |
| 8,471,642 B2 | 6/2013 | Hill | |
| 8,575,843 B2 | 11/2013 | Moore et al. | |
| 8,723,591 B2 | 5/2014 | Lee et al. | |
| 8,773,184 B1 | 7/2014 | Petrov et al. | |
| 8,828,254 B2 | 9/2014 | Inoue et al. | |
| 8,847,433 B2 | 9/2014 | Vandermey | |
| 8,963,377 B2 | 2/2015 | Ziemba et al. | |
| 9,067,788 B1 | 6/2015 | Spielman et al. | |
| 9,070,396 B1 | 6/2015 | Katchmart et al. | |
| 9,084,334 B1 | 7/2015 | Gefter et al. | |
| 9,122,350 B2 | 9/2015 | Kao et al. | |
| 9,122,360 B2 | 9/2015 | Xu et al. | |
| 9,155,590 B2 | 10/2015 | Mathur | |
| 9,287,086 B2 | 3/2016 | Brouk et al. | |
| 9,287,092 B2 | 3/2016 | Brouk et al. | |
| 9,306,533 B1 | 4/2016 | Mavretic | |
| 9,329,256 B2 | 5/2016 | Dolce | |
| 9,349,603 B2 | 5/2016 | Inoue et al. | |
| 9,417,739 B2 | 8/2016 | Cordeiro et al. | |
| 9,435,029 B2 | 9/2016 | Brouk et al. | |
| 9,493,765 B2 | 11/2016 | Krishnaswamy et al. | |
| 9,515,633 B1 | 12/2016 | Long et al. | |
| 9,601,283 B2 | 3/2017 | Ziemba et al. | |
| 9,655,221 B2 | 5/2017 | Ziemba et al. | |
| 9,706,630 B2 | 7/2017 | Miller et al. | |
| 9,729,122 B2 | 8/2017 | Mavretic | |
| 9,767,988 B2 | 9/2017 | Brouk et al. | |
| 9,811,119 B2 | 11/2017 | Seo | |
| 9,881,772 B2 | 1/2018 | Marakhatanov et al. | |
| 9,960,763 B2 | 5/2018 | Miller et al. | |
| 9,966,231 B2 | 5/2018 | Boswell et al. | |
| 10,009,024 B2 | 6/2018 | Gan et al. | |
| 10,020,800 B2 | 7/2018 | Prager et al. | |
| 10,027,314 B2 | 7/2018 | Prager et al. | |
| 10,044,278 B2 | 8/2018 | Kondo et al. | |
| 10,217,608 B2 | 2/2019 | Mavretic | |
| 10,224,822 B2 | 3/2019 | Miller et al. | |
| 10,301,587 B2 | 5/2019 | Krishnaswamy et al. | |
| 10,304,661 B2 | 5/2019 | Ziemba et al. | |
| 10,373,755 B2 | 8/2019 | Prager et al. | |
| 10,373,804 B2 | 8/2019 | Koh et al. | |
| 10,381,949 B2 | 8/2019 | Hamerski et al. | |
| 10,382,022 B2 | 8/2019 | Prager et al. | |
| 10,448,494 B1 | 10/2019 | Dorf et al. | |
| 10,448,495 B1 | 10/2019 | Dorf et al. | |
| 10,460,910 B2 | 10/2019 | Ziemba et al. | |
| 10,460,911 B2 | 10/2019 | Ziemba et al. | |
| 10,483,089 B2 | 11/2019 | Ziemba et al. | |
| 10,483,090 B2 | 11/2019 | Bhutta et al. | |
| 10,510,575 B2 | 12/2019 | Kraus et al. | |
| 10,555,412 B2 | 2/2020 | Dorf et al. | |
| 10,600,619 B2 | 3/2020 | Inoue et al. | |
| 10,607,814 B2 | 3/2020 | Ziemba et al. | |
| 10,631,395 B2 | 4/2020 | Sanders et al. | |
| 10,659,019 B2 | 5/2020 | Slobodov et al. | |
| 10,707,864 B2 | 7/2020 | Miller et al. | |
| 10,734,906 B2 | 8/2020 | Miller et al. | |
| 10,777,388 B2 | 9/2020 | Ziemba et al. | |
| 10,791,617 B2 | 9/2020 | Dorf et al. | |
| 10,796,887 B2 | 10/2020 | Prager et al. | |
| 10,804,886 B2 | 10/2020 | Miller et al. | |
| 10,811,230 B2 | 10/2020 | Ziemba et al. | |

(56) References Cited

U.S. PATENT DOCUMENTS

| | | |
|---|---|---|
| 10,876,241 B2 | 12/2020 | Hu et al. |
| 10,892,140 B2 | 1/2021 | Ziemba et al. |
| 10,892,141 B2 | 1/2021 | Ziemba et al. |
| 10,896,809 B2 | 1/2021 | Ziemba et al. |
| 10,903,047 B2 | 1/2021 | Ziemba et al. |
| 10,916,408 B2 | 2/2021 | Dorf et al. |
| 10,978,955 B2 | 4/2021 | Ziemba et al. |
| 10,978,995 B2 | 4/2021 | Itasaka et al. |
| 10,985,740 B2 | 4/2021 | Prager et al. |
| 10,991,553 B2 | 4/2021 | Ziemba et al. |
| 11,004,660 B2 | 5/2021 | Prager et al. |
| 11,101,108 B2 | 8/2021 | Slobodov et al. |
| 11,171,568 B2 | 11/2021 | Miller et al. |
| 11,222,767 B2 | 1/2022 | Ziemba et al. |
| 11,284,500 B2 | 3/2022 | Dorf et al. |
| 11,350,495 B2 | 5/2022 | Chen et al. |
| 11,404,246 B2 | 8/2022 | Ziemba et al. |
| 11,404,247 B2 | 8/2022 | Bowman et al. |
| 11,476,145 B2 | 10/2022 | Rogers et al. |
| 11,689,107 B2 | 6/2023 | Ziemba et al. |
| 11,690,671 B1 | 7/2023 | Mickelsen |
| 11,725,138 B2 | 8/2023 | Kim et al. |
| 11,810,761 B2 | 11/2023 | Slobodov et al. |
| 11,824,542 B1 | 11/2023 | Henson et al. |
| 11,883,666 B2 | 1/2024 | Swoyer |
| 2001/0008552 A1 | 7/2001 | Harada et al. |
| 2001/0033500 A1 | 10/2001 | Hummert et al. |
| 2002/0016617 A1 | 2/2002 | Oldham |
| 2002/0140464 A1 | 10/2002 | Yampolsky et al. |
| 2002/0180276 A1 | 12/2002 | Sakuma et al. |
| 2002/0186577 A1 | 12/2002 | Kirbie |
| 2003/0021125 A1 | 1/2003 | Rufer et al. |
| 2003/0021131 A1 | 1/2003 | Nadot et al. |
| 2003/0054647 A1 | 3/2003 | Suemasa et al. |
| 2003/0071035 A1 | 4/2003 | Brailove |
| 2003/0137791 A1 | 7/2003 | Arnet et al. |
| 2003/0169107 A1 | 9/2003 | LeChevalier |
| 2003/0227280 A1 | 12/2003 | Vinciarelli |
| 2004/0085784 A1 | 5/2004 | Salama et al. |
| 2004/0149217 A1 | 8/2004 | Collins et al. |
| 2004/0263412 A1 | 12/2004 | Pribyl |
| 2004/0264521 A1 | 12/2004 | Ness et al. |
| 2005/0152159 A1 | 7/2005 | Isurin et al. |
| 2005/0184669 A1 | 8/2005 | Chistyakov |
| 2005/0270096 A1 | 12/2005 | Coleman |
| 2006/0018074 A1 | 1/2006 | Inoue et al. |
| 2006/0048894 A1 | 3/2006 | Yamazaki et al. |
| 2006/0187607 A1 | 8/2006 | Mo |
| 2006/0192774 A1 | 8/2006 | Yasumura |
| 2006/0210020 A1 | 9/2006 | Takahashi et al. |
| 2006/0274887 A1 | 12/2006 | Sakamoto et al. |
| 2007/0018504 A1 | 1/2007 | Wiener et al. |
| 2007/0114981 A1 | 5/2007 | Vasquez et al. |
| 2007/0115705 A1 | 5/2007 | Gotzenberger et al. |
| 2007/0212811 A1 | 9/2007 | Hanawa et al. |
| 2007/0235412 A1 | 10/2007 | Fischer |
| 2008/0062733 A1 | 3/2008 | Gay |
| 2008/0106151 A1 | 5/2008 | Ryoo et al. |
| 2008/0143260 A1 | 6/2008 | Tuymer et al. |
| 2008/0198634 A1 | 8/2008 | Scheel et al. |
| 2008/0231337 A1 | 9/2008 | Krishnaswamy et al. |
| 2008/0252225 A1 | 10/2008 | Kurachi et al. |
| 2008/0272706 A1 | 11/2008 | Kwon et al. |
| 2009/0016549 A1 | 1/2009 | French et al. |
| 2009/0108759 A1 | 4/2009 | Tao et al. |
| 2009/0255800 A1 | 10/2009 | Koshimizu |
| 2009/0322307 A1 | 12/2009 | Ide |
| 2010/0007358 A1 | 1/2010 | Schaerrer et al. |
| 2010/0141224 A1 | 6/2010 | Ilic et al. |
| 2010/0148847 A1 | 6/2010 | Schurack et al. |
| 2010/0284208 A1 | 11/2010 | Nguyen et al. |
| 2011/0001438 A1 | 1/2011 | Chemel et al. |
| 2011/0133651 A1 | 6/2011 | Chistyakov et al. |
| 2011/0140607 A1 | 6/2011 | Moore et al. |
| 2011/0190755 A1 | 8/2011 | Mathur et al. |
| 2011/0309748 A1 | 12/2011 | Xia |
| 2012/0016282 A1 | 1/2012 | Van Brunt et al. |
| 2012/0052599 A1 | 3/2012 | Brouk et al. |
| 2012/0081350 A1 | 4/2012 | Sano et al. |
| 2012/0155613 A1 | 6/2012 | Caiafa et al. |
| 2012/0228263 A1 | 9/2012 | Ui et al. |
| 2013/0024784 A1 | 1/2013 | Lifton |
| 2013/0027848 A1 | 1/2013 | Said |
| 2013/0029492 A1 | 1/2013 | Inoue et al. |
| 2013/0059448 A1 | 3/2013 | Marakhtanov et al. |
| 2013/0075390 A1 | 3/2013 | Ashida |
| 2013/0092529 A1 | 4/2013 | Singh et al. |
| 2013/0113650 A1 | 5/2013 | Behbahani et al. |
| 2013/0138097 A1 | 5/2013 | Mathur et al. |
| 2013/0146443 A1 | 6/2013 | Papa et al. |
| 2013/0174105 A1 | 7/2013 | Nishio et al. |
| 2013/0175573 A1 | 7/2013 | Mayer et al. |
| 2013/0175575 A1 | 7/2013 | Ziemba et al. |
| 2013/0213935 A1 | 8/2013 | Liao et al. |
| 2013/0320953 A1 | 12/2013 | Cassel et al. |
| 2014/0009969 A1 | 1/2014 | Yuzurihara et al. |
| 2014/0021180 A1 | 1/2014 | Vogel |
| 2014/0077611 A1 | 3/2014 | Young et al. |
| 2014/0109886 A1 | 4/2014 | Singleton et al. |
| 2014/0118414 A1 | 5/2014 | Seo et al. |
| 2014/0146571 A1 | 5/2014 | Ryoo et al. |
| 2014/0268968 A1 | 9/2014 | Richardson |
| 2014/0349418 A1 | 11/2014 | Inoue et al. |
| 2014/0354343 A1 | 12/2014 | Ziemba et al. |
| 2015/0028932 A1 | 1/2015 | Ziemba et al. |
| 2015/0076372 A1 | 3/2015 | Ziemba et al. |
| 2015/0084509 A1 | 3/2015 | Yuzurihara et al. |
| 2015/0130525 A1 | 5/2015 | Miller et al. |
| 2015/0155086 A1 | 6/2015 | Matsuura |
| 2015/0184284 A1 | 7/2015 | Elghazzali et al. |
| 2015/0206716 A1 | 7/2015 | Kim et al. |
| 2015/0256086 A1 | 9/2015 | Miller et al. |
| 2015/0303914 A1 | 10/2015 | Ziemba et al. |
| 2015/0311680 A1 | 10/2015 | Burrows et al. |
| 2015/0318846 A1 | 11/2015 | Prager et al. |
| 2016/0020070 A1 | 1/2016 | Kim et al. |
| 2016/0020072 A1 | 1/2016 | Brouk et al. |
| 2016/0020672 A1 | 1/2016 | Shuck et al. |
| 2016/0182001 A1 | 6/2016 | Zeng et al. |
| 2016/0211153 A1 | 7/2016 | Terauchi et al. |
| 2016/0220670 A1 | 8/2016 | Kalghatgi et al. |
| 2016/0225587 A1 | 8/2016 | Inoue et al. |
| 2016/0241234 A1 | 8/2016 | Mavretic |
| 2016/0269195 A1 | 9/2016 | Coenen et al. |
| 2016/0327029 A1 | 11/2016 | Ziemba et al. |
| 2016/0327089 A1 | 11/2016 | Adam et al. |
| 2016/0358755 A1 | 12/2016 | Long et al. |
| 2017/0083810 A1 | 3/2017 | Ielmini et al. |
| 2017/0104469 A1 | 4/2017 | Mavretic |
| 2017/0125517 A1 | 5/2017 | Tapily et al. |
| 2017/0126049 A1 | 5/2017 | Pan et al. |
| 2017/0154726 A1 | 6/2017 | Prager et al. |
| 2017/0243731 A1 | 8/2017 | Ziemba et al. |
| 2017/0294842 A1 | 10/2017 | Miller et al. |
| 2017/0311431 A1 | 10/2017 | Park |
| 2017/0314133 A1 | 11/2017 | Kim et al. |
| 2017/0330729 A1 | 11/2017 | Mavretic |
| 2017/0359886 A1 | 12/2017 | Binderbauer et al. |
| 2017/0366173 A1 | 12/2017 | Miller et al. |
| 2018/0041183 A1 | 2/2018 | Mavretic et al. |
| 2018/0226896 A1 | 8/2018 | Miller et al. |
| 2018/0286636 A1 | 10/2018 | Ziemba et al. |
| 2018/0315581 A1 | 11/2018 | Hayami et al. |
| 2018/0315583 A1 | 11/2018 | Luere et al. |
| 2018/0323576 A1 | 11/2018 | Crawford et al. |
| 2018/0374689 A1 | 12/2018 | Abraham et al. |
| 2019/0074806 A1 | 3/2019 | Scott et al. |
| 2019/0080884 A1 | 3/2019 | Ziemba et al. |
| 2019/0088518 A1* | 3/2019 | Koh .............. C23C 16/505 |
| 2019/0131110 A1 | 5/2019 | Ziemba et al. |
| 2019/0157044 A1 | 5/2019 | Ziemba et al. |
| 2019/0157980 A1 | 5/2019 | Ji et al. |
| 2019/0172683 A1 | 6/2019 | Mavretic et al. |
| 2019/0172685 A1 | 6/2019 | Van Zyl et al. |

(56) References Cited

U.S. PATENT DOCUMENTS

| | | |
|---|---|---|
| 2019/0180982 A1 | 6/2019 | Brouk et al. |
| 2019/0228952 A1 | 7/2019 | Dorf et al. |
| 2019/0236426 A1 | 8/2019 | Zhang et al. |
| 2019/0267212 A1 | 8/2019 | Mavretic |
| 2019/0295821 A1 | 9/2019 | Shoeb et al. |
| 2019/0326092 A1 | 10/2019 | Ogasawara et al. |
| 2019/0348258 A1 | 11/2019 | Koh et al. |
| 2019/0350072 A1 | 11/2019 | Dorf et al. |
| 2019/0393791 A1 | 12/2019 | Ziemba et al. |
| 2020/0035457 A1 | 1/2020 | Ziemba et al. |
| 2020/0035458 A1 | 1/2020 | Ziemba et al. |
| 2020/0036367 A1 | 1/2020 | Slobodov et al. |
| 2020/0037468 A1 | 1/2020 | Ziemba et al. |
| 2020/0043702 A1 | 2/2020 | Ziemba et al. |
| 2020/0051786 A1 | 2/2020 | Ziemba et al. |
| 2020/0126760 A1 | 4/2020 | Ziemba et al. |
| 2020/0130092 A1 | 4/2020 | Henry |
| 2020/0144030 A1 | 5/2020 | Prager et al. |
| 2020/0154556 A1 | 5/2020 | Dorf et al. |
| 2020/0161092 A1 | 5/2020 | Inoue et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0219702 A1 | 7/2020 | Prager et al. |
| 2020/0227230 A1 | 7/2020 | Ziemba et al. |
| 2020/0244254 A1 | 7/2020 | Slobodov et al. |
| 2020/0352017 A1 | 11/2020 | Dorf et al. |
| 2020/0378605 A1 | 12/2020 | Lacoste |
| 2020/0396820 A1 | 12/2020 | de Vries et al. |
| 2021/0013011 A1 | 1/2021 | Prager et al. |
| 2021/0091759 A1 | 3/2021 | Prager et al. |
| 2021/0152163 A1 | 5/2021 | Miller et al. |
| 2021/0210313 A1 | 7/2021 | Ziemba et al. |
| 2021/0288582 A1 | 9/2021 | Ziemba et al. |
| 2022/0013329 A1 | 1/2022 | Bowman et al. |
| 2024/0088877 A1 | 3/2024 | Henson et al. |
| 2024/0138908 A1 | 5/2024 | Stewart et al. |

FOREIGN PATENT DOCUMENTS

| | | |
|---|---|---|
| CN | 103890897 A | 6/2014 |
| CN | 103458600 B | 7/2016 |
| CN | 106537776 A | 3/2017 |
| CN | 210056212 U | 2/2020 |
| CN | 112511136 A | 3/2021 |
| CN | 113179029 A | 7/2021 |
| CN | 113630107 A | 11/2021 |
| CN | 114649972 A | 6/2022 |
| CN | 115065342 A | 9/2022 |
| CN | 115395926 A | 11/2022 |
| EP | 0174164 A2 | 3/1986 |
| EP | 0840350 A2 | 5/1998 |
| EP | 0947048 A1 | 10/1999 |
| EP | 1128557 A2 | 8/2001 |
| EP | 1515430 A1 | 3/2005 |
| EP | 3167549 B1 | 3/2019 |
| FR | 2771563 A1 | 5/1999 |
| JP | H09120956 A | 5/1997 |
| JP | H09129621 A | 5/1997 |
| JP | H10223952 A | 8/1998 |
| JP | H11164552 A | 6/1999 |
| JP | H11172436 A | 6/1999 |
| JP | 2000268996 A | 9/2000 |
| JP | 2000306891 A | 11/2000 |
| JP | 2001181830 A | 7/2001 |
| JP | 2002222801 A | 8/2002 |
| JP | 2002324698 A | 11/2002 |
| JP | 2002359979 A | 12/2002 |
| JP | 2004101788 A | 4/2004 |
| JP | 2004340036 A | 12/2004 |
| JP | 2007203088 A | 8/2007 |
| JP | 2009263778 A | 11/2009 |
| JP | 2012065547 A | 3/2012 |
| JP | 2013135159 A | 7/2013 |
| JP | 5770628 B2 | 8/2015 |
| JP | 2015531025 A | 10/2015 |
| JP | 2015220929 A | 12/2015 |
| JP | 5852380 B2 | 2/2016 |
| JP | 2016134461 A | 7/2016 |
| JP | 2016181343 A | 10/2016 |
| JP | 2017501298 A | 1/2017 |
| JP | 2017504955 A | 2/2017 |
| JP | 6310601 B1 | 4/2018 |
| JP | 2019197890 A | 11/2019 |
| JP | 2020501351 A | 1/2020 |
| JP | 2020529180 A | 10/2020 |
| KR | 20200036947 A | 4/2020 |
| TW | 200739723 A | 10/2007 |
| TW | I380151 B | 12/2012 |
| TW | 1474601 B | 2/2015 |
| TW | 201515525 A | 4/2015 |
| TW | I564928 B | 1/2017 |
| WO | 9738479 A1 | 10/1997 |
| WO | 9960679 A1 | 11/1999 |
| WO | 0193419 A1 | 12/2001 |
| WO | 2010069317 A1 | 6/2010 |
| WO | 2014036000 A1 | 3/2014 |
| WO | 2016171582 A1 | 10/2016 |
| WO | 2017126662 A1 | 7/2017 |
| WO | 2018008310 A1 | 1/2018 |
| WO | 2018034771 A1 | 2/2018 |
| WO | 2018186901 A1 | 10/2018 |
| WO | 2019040949 A1 | 2/2019 |
| WO | 2020146436 A1 | 7/2020 |
| WO | 2020160497 A1 | 8/2020 |
| WO | 2021003319 A1 | 1/2021 |

OTHER PUBLICATIONS

International Search Report and Written Opinion as issued in connection with International Patent Application No. PCT/US2018/016993, mailed Apr. 18, 2018, 11 pages.
Non-Final Office Action in U.S. Appl. No. 15/889,586 dated Sep. 12, 2018, 18 pages.
Notice of Allowance in U.S. Appl. No. 14/798,154 dated Jun. 1, 2018, 05 pages.
International Search Report and Written Opinion as issued in connection with International Patent Application No. PCT/US2018/025440, mailed Jun. 25, 2018, 24 pages.
Notice of Allowance in U.S. Appl. No. 15/623,464, dated Oct. 17, 2018, 7 pages.
International Search Report and Written Opinion as issued in connection with International Patent Application No. PCT/US2018/048206, mailed Nov. 1, 2018, 10 pages.
Non Final Office Action in U.S. Appl. No. 15/941,731, dated Nov. 16, 2018, 17 pages.
Non-Final Office Action in U.S. Appl. No. 15/921,650 dated Nov. 28, 2018, 11 pages.
Non Final Office Action in U.S. Appl. No. 16/178,538, dated Jan. 11, 2019, 27 pages.
Non Final Office Action in U.S. Appl. No. 16/250,765, dated Mar. 29, 2019, 11 pages.
Notice of Allowance in U.S. Appl. No. 16/114,195, dated Apr. 3, 2019, 9 pages.
Notice of Allowance in U.S. Appl. No. 15/921,650 dated Apr. 4, 2019, 7 pages.
Non Final Office Action in U.S. Appl. No. 16/178,565, dated Apr. 4, 2019, 10 pages.
Final Office Action in U.S. Appl. No. 15/889,586 dated May 2, 2019, 19 pages.
Final Office Action in U.S. Appl. No. 15/941,731, dated May 3, 2019, 16 pages.
Final Office Action in U.S. Appl. No. 16/178,538 dated Jun. 7, 2019, 17 pages.
Notice of Allowance in U.S. Appl. No. 16/250,765, dated Jul. 10, 2019, 9 pages.
Final Office Action in U.S. Appl. No. 16/178,565, dated Jul. 12, 2019, 11 pages.
Notice of Allowance in U.S. Appl. No. 16/178,538 dated Jul. 17, 2019, 10 pages.

(56) References Cited

OTHER PUBLICATIONS

Notice of Allowance in U.S. Appl. No. 15/941,731, dated Jul. 17, 2019, 12 pages.
Non-Final Office Action in U.S. Appl. No. 15/889,586 dated Sep. 6, 2019, 17 pages.
Invitation to pay additional fees as issued in connection with International Patent Application No. PCT/US2019/043932, mailed Sep. 30, 2019, 2 pages.
International Preliminary Report on Patentability in connection with International Patent Application No. PCT/US2018/025440, mailed Oct. 1, 2019, 10 pages.
Invitation to pay additional fees as issued in connection with International Patent Application No. PCT/US2019/043988, mailed Oct. 10, 2019, 2 pages.
International Search Report and Written Opinion as issued in connection with International Patent Application No. PCT/US2019/043933, mailed Oct. 25, 2019, 9 pages.
Invitation to pay additional fees as issued in connection with International Patent Application No. PCT/US2019/046067, mailed Oct. 29, 2019, 2 pages.
Notice of Allowance in U.S. Appl. No. 16/178,565, dated Nov. 14, 2019, 5 pages.
Non Final Office Action in U.S. Appl. No. 15/945,722, dated Nov. 15, 2019, 13 pages.
International Search Report and Written Opinion as issued in connection with International Patent Application No. PCT/US2019/043932, mailed Dec. 5, 2019, 16 pages.
International Search Report and Written Opinion as issued in connection with International Patent Application No. PCT/US2019/043988, mailed Dec. 10, 2019, 13 pages.
Non Final Office Action in U.S. Appl. No. 16/250,157 dated Dec. 19, 2019, 6 pages.
International Search Report and Written Opinion as issued in connection with International Patent Application No. PCT/US2019/046067, mailed Jan. 3, 2020, 13 pages.
Notice of Allowance in U.S. Appl. No. 16/525,357, dated Jan. 14, 2020, 8 pages.
Non-Final Office Action in U.S. Appl. No. 16/599,318, dated Jan. 16, 2020, 11 pages.
Non-Final Office Action in U.S. Appl. No. 16/722,085, dated Mar. 6, 2020, 5 pages.
Final Office Action in U.S. Appl. No. 15/889,586 dated Mar. 18, 2020, 18 pages.
Non-Final Office Action in U.S. Appl. No. 16/523,840, dated Mar. 19, 2020, 6 pages.
Restriction Requirement in U.S. Appl. No. 16/537,513, dated Apr. 1, 2020, 7 pages.
Notice of Allowance in U.S. Appl. No. 15/945,722, dated Apr. 3, 2020, 7 pages.
Non-Final Office Action in U.S. Appl. No. 16/736,971, dated Apr. 7, 2020, 14 pages.
International Search Report and Written Opinion as issued in connection with International Patent Application No. PCT/US2019/013988, mailed Apr. 9, 2020, 8 pages.
Notice of Allowance in U.S. Appl. No. 16/250,157 dated Apr. 13, 2020, 8 pages.
Non-Final Office Action in U.S. Appl. No. 16/457,791 dated Apr. 15, 2020, 12 pages.
Non-Final Office Action in U.S. Appl. No. 16/524,950, dated Apr. 16, 2020, 8 pages.
Final Office Action in U.S. Appl. No. 16/736,971, dated Apr. 17, 2020, 6 pages.
International Search Report and Written Opinion as issued in connection with International Patent Application No. PCT/US2020/016253, mailed Apr. 29, 2020, 7 pages.
Restriction Requirement in U.S. Appl. No. 16/524,967, dated Apr. 29, 2020, 6 pages.
Advisory Action in U.S. Appl. No. 16/736,971, dated May 12, 2020, 5 pages.
Non-Final Office Action in U.S. Appl. No. 16/722,115, dated May 14, 2020, 6 pages.
Notice of Reason for Refusal for JP Patent Application No. 2023-520043, mailed on Apr. 2, 2024, 8 pages.
Office Action in KR Patent application No. 2023-7028274 dated Apr. 19, 2024, 4 pages.
Office Action in KR Patent application No. 2023-7029360 dated Apr. 19, 2024, 10 pages.
Non-Final Office Action in U.S. Appl. No. 18/493,515 dated May 6, 2024, 8 pages.
Bland, M.J., et al., "A High Power RF Power Supply for High Energy Physics Applications," Proceedings of 2005 the Particle Accelerator Conference, IEEE pp. 4018-4020 (May 16-20, 2005).
Dammertz, G., et al., "Development of Multimegawatt Gyrotrons for Fusion Plasma Heating and current Drive," IEEE Transactions on Electron Devices, vol. 52, No. 5, pp. 808-817 (Apr. 2005) (Abstract).
Garwin, R., "Pulsed Power Peer Review Committee Report," Sandia National Laboratories Report, SAND2000-2515, pp. 3-38 (Oct. 2000).
Gaudet, J.A., et al., "Research issues in Developing Compact Pulsed Power for High Peak Power Applications on Mobile Platforms," Proceedings of the IEEE, vol. 92, No. 7, pp. 1144-1165 (Jul. 2004).
Goodman, E. A., "Characteristics of sheet windings in transformers", IEEE Engineering, vol. 82, No. 11, pp. 673-676 (Nov. 1963) (Abstract).
In, Y., et al., "On the roles of direct feedback and error field correction in stabilizing resistive-wall modes," Nuclear 2 Fusion, vol. 50, No. 4, pp. 1-5 (2010).
Kim, J.H., et al., "High Voltage Pulsed Power Supply Using IGBT Stacks," IEEE Transactions on Dielectrics and Electrical insulation, vol. 14, No. 4, pp. 921-926 (Aug. 2007).
Locher, R., "Introduction to Power MOSFETs and their Applications (Application Note 558)," Fairchild Semiconductor, 15 pages (Oct. 1998).
Locher, R.E., and Pathak, A.D., "Use of BiMOSFETs in Modern Radar Transmitters," IEEE International Conference on Power Electronics and Drive Systems, pp. 776-782 (2001).
Pokryvailo, A., et al., "A 1KW Pulsed Corona System for Pollution Control Applications," 14th IEEE International Pulsed Power Conference, Dallas, TX, USA (Jun. 15-18, 2003).
Pokryvailo, A., et al., "High-Power Pulsed Corona for Treatment of Pollutants in Heterogeneous Media," IEEE Transactions on Plasma Science, vol. 34, No. 5, pp. 1731-1743 (Oct. 2006) (Abstract).
Prager, J.R. et al., "A High Voltage Nanosecond Pulser with Variable Pulse Width and Pulse Repetition Frequency control For Nonequilibrium Plasma Applications", 41st International Conference on Plasma Sciences held with 2014 IEEE International Conference on High-Power Particle Beams, May 25-29, 2014, 6, Washington, D.C.
Pustylnik, M., et al., "High-voltage nanosecond pulses in a low-pressure radiofrequency discharge", Physical Review E, vol. 87, No. 6, pp. 1-9 (2013).
Quinley, M., et al., "High Voltage Nanosecond Pulser Operating at 30 kW and 400 KHz" APS-GEC-2018, 1 page (2018).
Rao, X., et al., "Combustion Dynamics of Plasma-Enhanced Premixed and Nonpremixed Flames," IEEE Transactions on Plasma Science, vol. 38, No. 12, pp. 3265-3271 (Dec. 2010).
Reass, W.A., et al., "Progress Towards a 20 KV, 2 KA Plasma Source Ion Implantation Modulator for Automotive Production of Diamond Film on Aluminum," Submitted to 22nd International Power Symposium, Boca Raton, FL, 6 pages (Jun. 24-27, 1996).
Sanders, J.M., et al., "Scalable, compact, nanosecond pulse generator with a high repetition rate for biomedical applications requiring intense electric fields," 2009 IEEE Pulsed Power Conference, Washington, DC, 2 pages (Jun. 28, 2009-Jul. 2, 2009) (Abstract).
Schamiloglu, E., et al., "Scanning the Technology: Modem Pulsed Power: Charlie Martin and Beyond," Proceedings of the IEEE, vol. 92, No. 7 , pp. 1014-1020 (Jul. 2004).
Scoville, J.T., et al., "The Resistive Wall Mode Feedback Control System on DIII-D," IEEE/NPSS 18th Symposium on fusion Engineering, Albuquerque, NM, Oct. 25-29, 1999, General Atomics Report GAA23256, 7 pages (Nov. 1999).

(56) References Cited

OTHER PUBLICATIONS

Singleton, D.R., et al., "Compact Pulsed-Power System for Transient Plasma Ignition," IEEE Transactions on Plasma Science, vol. 37, No. 12, pp. 2275-2279 (2009) (Abstract).
Singleton, D.R., et al., "Low Energy Compact Power Modulators for Transient Plasma Ignition," IEEE Transactions on Dielectrics and Electrical Insulation, vol. 18, No. 4, pp. 1084-1090 (Aug. 2011) (Abstract).
Starikovskiy, A., and Aleksandrov, N., "Plasma-assisted ignition and combustion," Progress in Energy and Combustion Science, vol. 39, No. 1, pp. 61-110 (Feb. 2013).
Wang, F., et al., "Compact High Repetition Rate Pseudospark Pulse Generator," IEEE Transactions on Plasma Science, vol. 33, No. 4, pp. 1177-1181 (Aug. 2005) (Abstract).
Zavadtsev, D.A., et al., "Compact Electron Linear Accelerator RELUS-5 for Radiation Technology Application," 10th European Particle Accelerator Conference, Edinburgh, UK, pp. 2385-2387 (Jun. 26-30, 2006).
Zhu, Z., et al., "High Voltage pulser with a fast fall-time for plasma immersion ion implantation," Review of Scientific Instruments, vol. 82, No. 4, pp. 045102-1-045102-4 (Apr. 2011).
International Search Report and Written Opinion as issued in connection with International Patent Application No. PCT/US2014/040929, mailed Sep. 15, 2014, 10 pages.
International Search Report and Written Opinion as issued in connection with International Patent Application No. PCT/US2014/065832, mailed Feb. 20, 2015, 13 pages.
Invitation to pay additional fees in PCT Application No. PCT/US2015/018349 mailed on May 15, 2015, 2 pages.
International Search Report and Written Opinion as issued in connection with International Patent Application No. PCT/US2015/018349, mailed Jul. 14, 2015, 15 pages.
International Search Report and Written Opinion as issued in connection with International Patent Application No. PCT/US2015/040204, mailed Oct. 6, 2015, 12 pages.
Non-Final Office Action in U.S. Appl. No. 14/542,487 dated Nov. 23, 2015, 11 pages.
Non-Final Office Action in U.S. Appl. No. 14/798,154 dated Jan. 5, 2016, 13 pages.
Final Office Action in U.S. Appl. No. 14/542,487 dated Feb. 12, 2016, 11 pages.
Non-Final Office Action in U.S. Appl. No. 14/542,487 dated Apr. 8, 2016, 12 pages.
International Preliminary Report on Patentability in PCT Application No. PCT/US2014/065832 mailed on May 17, 2016, 7 pages.
Non Final Office Action in U.S. Appl. No. 14/635,991, dated Jul. 29, 2016, 17 pages.
International Preliminary Report on Patentability in PCT Application No. PCT/US2015/018349 mailed on Sep. 6, 2016, 8 pages.
Final Office Action in U.S. Appl. No. 14/798,154 dated Oct. 6, 2016, 14 pages.
Final Office Action in U.S. Appl. No. 14/542,487 dated Dec. 12, 2016, 13 pages.
International Preliminary Report on Patentability in PCT Application No. PCT/US2015/040204 mailed on Jan. 17, 2017, 7 pages.
Final Office Action in U.S. Appl. No. 14/635,991, dated Jan. 23, 2017, 22 pages.
Advisory Action in U.S. Appl. No. 14/542,487 dated Mar. 28, 2017, 03 pages.
Notice of Allowance in U.S. Appl. No. 14/635,991, dated May 4, 2017, 07 pages.
Non-Final Office Action in U.S. Appl. No. 14/798,154 dated May 26, 2017, 16 pages.
Non-Final Office Action in U.S. Appl. No. 14/542,487 dated Jun. 5, 2017, 12 pages.
Partial Supplementary European Search Report received Jul. 28, 2017 in related foreign application No. 14861818.4, 12 Pages.
Non Final Office Action in U.S. Appl. No. 15/623,464, dated Nov. 7, 2017, 18 pages.
Final Office Action in U.S. Appl. No. 14/542,487 dated Dec. 19, 2017, 07 pages.
Final Office Action in U.S. Appl. No. 14/798,154 dated Dec. 28, 2017, 06 pages.
Notice of Allowance in U.S. Appl. No. 14/542,487 dated Mar. 21, 2018, 05 pages.
Extended European Search Report for Application No. 21876672.3 received Sep. 3, 2024, 9 pages.
Notice of Allowance in U.S. Appl. No. 18/493,515 mailed on Nov. 4, 2024, 9 pages.
Restriction Requirement in U.S. Appl. No. 18/642,777, dated Nov. 8, 2024, 7 pages.
Non-Final Office Action in U.S. Appl. No. 18/512,002 dated Dec. 23, 2024, 9 pages.
Kim, Y., et al., "The Design of Inverter Power System for Plasma Generator", 2005 International Conference on Electrical Machines and Systems, vol. 2, pp. 1309-1312 (2005).
First Office Action in CN Patent application No. 201980051988.5 dated Aug. 6, 2024, 22 pages.
Notice of Reason for Refusal for JP Patent Application No. 2023-176000, mailed on Sep. 17, 2024, 4 pages.
Office Action in KR Patent application No. 2023-7031086 dated Oct. 10, 2024, 22 pages.
International Search Report and Written Opinion, as issued in connection with International Patent Application No. PCT/US2024/015658, mailed Aug. 5, 2024, 11 pages.
Non-Final Office Action in U.S. Appl. No. 16/555,948, dated May 15, 2020, 8 pages.
International Search Report and Written Opinion as issued in connection with International Patent Application No. PCT/US2020/012641, mailed May 28, 2020, 15 pages.
Extended European Search Report for Application No. 18848041.2 received Jun. 23, 2020, 9 pages.
Non Final Office Action in U.S. Appl. No. 16/697,173, dated Jun. 26, 2020, 19 pages.
Final Office Action in U.S. Appl. No. 16/523,840, dated Jun. 26, 2020, 5 pages.
Notice of Allowance in U.S. Appl. No. 16/736,971, dated Jun. 30, 2020, 14 pages.
Advisory Action in U.S. Appl. No. 15/889,586 dated Jul. 10, 2020, 4 pages.
Notice of Allowance in U.S. Appl. No. 16/722,085, dated Jul. 16, 2020, 8 pages.
Non Final Office Action in U.S. Appl. No. 16/779,270, dated Jul. 16, 2020, 9 pages.
Notice of Allowance in U.S. Appl. No. 16/524,967, dated Jul. 17, 2020, 11 pages.
Final Office Action in U.S. Appl. No. 16/599,318, dated Jul. 23, 2020, 14 pages.
Notice of Allowance in U.S. Appl. No. 16/599,318, dated Aug. 4, 2020, 8 pages.
Notice of Allowance in U.S. Appl. No. 16/779,270, dated Aug. 10, 2020, 6 pages.
Non Final Office Action in U.S. Appl. No. 16/537,513, dated Sep. 3, 2020, 13 pages.
Non-Final Office Action in U.S. Appl. No. 15/889,586 dated Sep. 18, 2020, 19 pages.
International Search Report and Written Opinion as issued in connection with International Patent Application No. PCT/US2020/040579, mailed Sep. 30, 2020, 10 pages.
Notice of Allowance in U.S. Appl. No. 16/523,840, dated Sep. 30, 2020, 11 pages.
Notice of Allowance in U.S. Appl. No. 16/779,270, dated Oct. 8, 2020, 5 pages.
International Search Report and Written Opinion as issued in connection with International Patent Application No. PCT/US2020/034427, mailed Oct. 16, 2020, 9 pages.
Notice of Allowance in U.S. Appl. No. 16/524,950, dated Oct. 19, 2020, 9 pages.
Notice of Allowance in U.S. Appl. No. 16/524,950, dated Nov. 16, 2020, 9 pages.
Non Final Office Action in U.S. Appl. No. 16/903,374, dated Nov. 25, 2020, 16 pages.

(56) References Cited

OTHER PUBLICATIONS

Final Office Action in U.S. Appl. No. 16/722,115, dated Dec. 2, 2020, 7 pages.
Notice of Allowance in U.S. Appl. No. 16/523,840, dated Dec. 4, 2020, 11 pages.
Final Office Action in U.S. Appl. No. 16/537,513, dated Jan. 7, 2021, 12 pages.
Notice of Allowance in U.S. Appl. No. 16/555,948, dated Jan. 13, 2021, 7 pages.
Notice of Allowance in U.S. Appl. No. 16/524,926, dated Jan. 15, 2021, 9 pages.
Notice of Allowance in U.S. Appl. No. 16/457,791 dated Jan. 22, 2021, 7 pages.
International Search Report and written opinion received for PCT Patent Application No. PCT/US2020/60799, mailed in Feb. 5, 2021, 11 pages.
Notice of Allowance in U.S. Appl. No. 16/697,173, dated Feb. 9, 2021, 13 pages.
International Preliminary Report On Patentability in PCT Application No. PCT/US2019/046067, dated Feb. 16, 2021, 09 Pages.
Notice of Allowance in U.S. Appl. No. 16/848,830, dated Feb. 19, 2021, 8 pages.
Extended European Search Report for Application No. 20195265.2 received Mar. 17, 2021, 8 pages.
Notice of Allowance in U.S. Appl. No. 16/722,115, dated Apr. 1, 2021, 9 pages.
Notice of Allowance in U.S. Appl. No. 15/889,586 dated Apr. 14, 2021, 9 pages.
Non Final Office Action in U.S. Appl. No. 16/941,532, dated Apr. 14, 2021, 10 pages.
Advisory Action in U.S. Appl. No. 16/537,513, dated Apr. 22, 2021, 5 pages.
Notice of Allowance in U.S. Appl. No. 16/721,396, dated Apr. 23, 2021, 10 pages.
Extended European Search Report for Application No. 20200919.7 received Apr. 30, 2021, 11 pages.
Non-Final Office Action in U.S. Appl. No. 16/722,115, dated May 3, 2021, 9 pages.
International Search Report and Written Opinion as issued in connection with International Patent Application No. PCT/US2020/066990, mailed May 5, 2021, 9 pages.
Notice of Allowance in U.S. Appl. No. 16/848,830, dated May 13, 2021, 6 pages.
Non-Final Office Action in U.S. Appl. No. 15/889,586 dated Jun. 11, 2021, 11 pages.
International Preliminary Report on Patentability in connection with International Patent Application No. PCT/US2020/012641, mailed Jun. 16, 2021, 11 pages.
Non-Final Office Action in U.S. Appl. No. 16/941,532 dated Jul. 16, 2021, 10 pages.
Notice of Allowance in U.S. Appl. No. 16/903,374, dated Jul. 19, 2021, 8 pages.
Notice of Reason for Refusal for JP Patent Application No. 2021-504454, mailed on Jul. 20, 2021, 8 pages.
Notice of Reason for Refusal for JP Patent Application No. 2021-504453, mailed on Jul. 20, 2021, 16 pages.
International Preliminary Report On Patentability dated Jul. 27, 2021 in PCT Application No. PCT/US2020/016253, 06 pages.
Non-Final Office Action in U.S. Appl. No. 16/937,948, dated Aug. 24, 2021, 10 pages.
Extended European Search Report for Application No. 23158873.2 received Jun. 9, 2023, 9 pages.
Restriction Requirement in U.S. Appl. No. 17/493,835 dated Jul. 6, 2023, 7 pages.
International Search Report and Written Opinion as issued in connection with International Patent Application No. PCT/US2023/069316, mailed Sep. 5, 2023, 08 pages.
Extended European Search Report for Application No. 20887869.4 received Sep. 6, 2023, 8 pages.
Non Final Office Action in U.S. Appl. No. 17/493,835 dated on Sep. 21, 2023, 9 pages.
Notice of Reason for Refusal for JP Patent Application No. 2021-504453, mailed on Jan. 9, 2024, 5 pages.
Notice of Allowance in U.S. Appl. No. 17/493,835 dated Jan. 18, 2024, 9 pages.
Restriction Requirement in U.S. Appl. No. 17/133,612, dated Aug. 26, 2021, 5 pages.
Non-Final Office Action in U.S. Appl. No. 17/223,004, dated Aug. 31, 2021, 12 pages.
Invitation to Pay Additional Fees as issued in connection with International Patent Application No. PCT/US2021/41180, mailed Sep. 21, 2021, 2 pages.
Non-Final Office Action in U.S. Appl. No. 17/033,662 dated Sep. 1, 2021, 17 pages.
Notice of Allowance in U.S. Appl. No. 16/722,115 dated Oct. 4, 2021, 9 pages.
Notice of Allowance in U.S. Appl. No. 16/537,513, dated Oct. 8, 2021, 10 pages.
Notice of Allowance in U.S. Appl. No. 16/737,615 dated Nov. 24, 2021, 11 pages.
International Search Report and Written Opinion as issued in connection with International Patent Application No. PCT/US2021/41180, mailed Dec. 7, 2021, 11 pages.
Final Office Action in U.S. Appl. No. 17/033,662 dated Dec. 8, 2021, 17 pages.
Non-Final Office Action in U.S. Appl. No. 17/213,230 dated Dec. 14, 2021, 6 pages.
English translation of Office Action for Taiwan application No. 109100609 mailed Dec. 16, 2021, 5 pages.
Invitation to Pay Additional Fees in PCT Application No. PCT/US2021/053436 mailed on Dec. 2, 2021, 2 pages.
Restriction Requirement in U.S. Appl. No. 17/099,729 dated on Jan. 20, 2022, 7 pages.
Notification of Reason for Refusal in JP Patent application No. 2021-101259 dated Feb. 1, 2022, 21 pages.
International Search Report and Written Opinion in PCT Application No. PCT/US2021/053436 mailed on Feb. 8, 2022, 13 pages.
Notice of Reason for Refusal for JP Patent Application No. 2021-504453, mailed on Mar. 1, 2022, 12 pages.
Non-Final Office Action in U.S. Appl. No. 17/163,331 dated Mar. 4, 2022, 23 pages.
Non Final Office Action in U.S. Appl. No. 17/142,069 dated Mar. 7, 2022, 7 pages.
Notice of Allowance in U.S. Appl. No. 16/941,532, dated Apr. 5, 2022, 9 pages.
Notice of Allowance in U.S. Appl. No. 17/099,729 dated Apr. 21, 2022 10 pages.
Notice of Allowance in U.S. Appl. No. 17/372,398 dated Apr. 27, 2022, 9 pages.
Final Office Action in U.S. Appl. No. 17/223,004 dated May 11, 2022, 9 pages.
Final Office Action in U.S. Appl. No. 17/213,230 dated May 16, 2022, 16 pages.
International Preliminary Report in Patentability PCT Application No. PCT/US2020/60799, dated May 17, 2022, 09 pages.
Non Final Office Action in U.S. Appl. No. 17/231,923, dated Jun. 6, 2022, 6 pages.
Non-Final Office Action in U.S. Appl. No. 17/499,863 dated Jun. 7, 2022, 15 pages.
Non-Final Office Action in U.S. Appl. No. 17/359,498, dated Jun. 29, 2022, 7 pages.
Decision of Refusal for JP Patent Application No. 2021-504453, mailed on Jul. 21, 2022, 11 pages.
Notice of Allowance in U.S. Appl. No. 17/223,004 dated Jul. 25, 2022, 8 pages.
Advisory Action in U.S. Appl. No. 17/213,230 dated Aug. 5, 2022, 3 pages.
Final Office Action in U.S. Appl. No. 17/142,069 dated Aug. 18, 2022, 06 pages.
Non-Final Office Action in U.S. Appl. No. 17/213,230 dated Sep. 15, 2022, 9 pages.

(56) References Cited

OTHER PUBLICATIONS

Notice of Allowance in U.S. Appl. No. 17/359,498, dated Oct. 12, 2022, 09 pages.
Notice of Allowance in U.S. Appl. No. 17/499,863 dated Oct. 19, 2022, 7 pages.
Notice of Allowance in U.S. Appl. No. 17/231,923, dated Nov. 16, 2022, 9 pages.
Non Final Office Action in U.S. Appl. No. 17/851,022 dated on Nov. 25, 2022, 8 pages.
Notice of Allowance in U.S. Appl. No. 17/098,207 dated Jan. 5, 2023, 15 pages.
Notice of Allowance in U.S. Appl. No. 17/033,662, dated Feb. 7, 2023, 9 pages.
Notice of Allowance in U.S. Appl. No. 17/834,933 mailed on Feb. 16, 2023, 9 pages.
Non-Final Office Action in U.S. Appl. No. 17/411,028 dated Feb. 24, 2023, 6 pages.
Notice of Allowance in U.S. Appl. No. 17/213,230 dated Mar. 8, 2023, 7 pages.
Notice of Allowance in U.S. Appl. No. 17/851,022 dated Mar. 20, 2023, 10 pages.
Non Final Office Action in U.S. Appl. No. 17/853,891 dated on May 2, 2023, 9 pages.
Final Office Action in U.S. Appl. No. 17/411,028 dated Jun. 22, 2023, 9 pages.
Notice of Reason for Refusal for JP Patent Application No. 2022-034989, mailed on Jul. 11, 2023, 6 pages.
Notice of Allowance in U.S. Appl. No. 17/853,891 dated Aug. 15, 2023, 7 pages.
Notice of Allowance in U.S. Appl. No. 17/411,028 dated Aug. 30, 2023, 9 pages.
International Preliminary Report in Patentability PCT Application No. PCT/US2021/41180, dated Jan. 10, 2023, 08 pages.
Notice of Allowance in U.S. Appl. No. 17/142,069 dated Jan. 11, 2023, 10 pages.
Non-Final Office Action in U.S. Appl. No. 18/340,841 dated Jan. 24, 2023, 18 pages.
Extended European Search Report in EP Application No. 21838456.8, mailed on Jul. 3, 2024, 9 pages.
Office Action in KR Patent application No. 2023-7015060 dated Jul. 25, 2024, 14 pages.
International Search Report and Written Opinion in PCT Application No. PCT/US23/75394 mailed May 1, 2024, 15 pages.

\* cited by examiner

HIGH VOLTAGE PLASMA CONTROL

GOVERNMENT RIGHTS

This invention was made with government support under DE-SCO awarded by Department of Energy. The government has certain rights in the invention.

BACKGROUND

The application of RF-excited gaseous discharges in thin film and semiconductor fabrication technology has become standard. Positive ions produced in the plasma volume are accelerated across the plasma sheaths and arrive at electrodes with an Ion Energy Distribution Function (ion energy distribution function), which is determined by the magnitude and the waveform of the time dependent potential difference across the sheaths, the gas pressure, the physical geometry of the reactor, and/or other factors. This ion bombardment energy distribution may determine the degree of anisotropy in thin-film etching, the amount of ion impact induced damage to surfaces, the aspect ratio and/or diameter and/or depth of holes and other etched features, the rate at which features are etched, etc. Control of the ion energy distribution function is of great importance to processes involving plasma etching.

High voltage power systems are required to create the needed potentials that accelerate the ions within the plasma. The high voltage power systems may provide power waveforms that are well shaped (e.g., substantially flat between pulses) to create various desired ion energy distribution functions. Different waveforms may be used pulse to pulse, each potentially producing different ion energy distribution functions, such that in time a completely different and aggregate effective ion energy distribution function is created. Controlling the ion energy distribution function allows specific features of the etch process to be controlled.

In some applications, the chamber or plasma can modify portions of the waveform that are creating the ion energy distribution function. For example, in a semiconductor processing system, an ion current within the plasma may create a droop between consecutive pulses in the waveform at the wafer. These waveform modifications can directly affect and/or change the desired ion energy distribution function, thus decreasing the effectiveness of any processes within the chamber. For example, pulse to pulse droop tends to broaden the ion energy distribution function, and introduce more low energy ions.

SUMMARY

A high voltage pulsing power system is disclosed. The high voltage pulsing power system includes a DC power supply, a switch circuit electrically coupled with the DC power supply, a droop control circuit coupled with the switch circuit, and an output. The output, for example, may be coupled with a plasma chamber. The high voltage pulse power system may also include an energy recovery circuit. The switch circuit can include a plurality of switch modules arranged in a full bridge, half bridge, or other bridge configuration, and may produce a plurality of pulses having a positive pulse portion and a negative pulse portion. The transformer can include a transformer core, primary windings, and secondary windings. The droop control circuit may include a droop diode, a droop inductor, and/or a droop element that may be a resistive element or an energy recovery circuit. The energy recovery circuit, for example, may be any collection of electrical components typically found in a DC to DC converter that moves energy from one potential to another potential.

The droop element, for example, may be any component or combination of components that is used to regulate how much current flows through the droop inductor. The droop element may work by limiting the energy that is injected into the droop inductor such that either an equilibrium current can be maintained, or a specified current can be maintained. A passive droop element such as a fixed resistor allows for steady equilibrium currents to be maintained, while an active droop element allows the current flowing through the droop inductor to be varied in time. The droop diode may be electrically coupled in series between the switch circuit and the primary winding of the transformer, and/or may allow for the positive pulse portion of the plurality of pulses to pass from the switching circuit to the primary winding of the transformer. Inductance in series with the droop diode may be specifically selected to realize positive pulses with a particular shape. The inductance in series with the droop diode may be set such that the positive going pulse has a clean rounded sinusoidal like shape, without notches, divots, or multiple peaks/ringing. The droop inductor and the droop element may be arranged in series across the droop diode to allow the negative pulse portion of the plurality of pulses to pass from the switching circuit to the primary winding of the transformer. The combination of the droop inductor and droop element may govern how much energy is stored in the droop inductor and/or how much current is flowing through the droop inductor. The current that flows through the droop inductor may be intimately related to a voltage applied across the plasma and/or the ion energy distribution function that is created. The disclosed high voltage pulsed power system, for example, can change its output in time, either pulse to pulse, and/or burst to burst, and/or train to train to create both different and time varying composite ion energy distribution functions.

The various embodiments described in the summary and this document are provided not to limit or define the disclosure or the scope of the claims.

BRIEF DESCRIPTION OF THE FIGURES

FIG. 25 is a flowchart of an example process for controlling the ion energy distribution on a wafer.

DETAILED DESCRIPTION

A high voltage pulsing power supply that produces high voltage pulses is disclosed. A high voltage pulsing power supply, for example, may be coupled with 1 or more plasma chambers. A high voltage pulsing power supply, for example, may compensate for voltage droop on a wafer in a plasma processing chamber. A high voltage pulsing power supply, for example, may provide energy recovery within a pulsing circuit. A high voltage pulsing power supply, for example, may allow narrow or specific ion energy distributions ("ion energy distribution function") to be created in a plasma. A high voltage pulsing power supply, for example, may allow for a wide range of ion energy distribution functions to be created in a plasma. A high voltage pulsing power supply, for example, may allow for time varying ion energy distribution functions to be created in a plasma. A high voltage pulsing power supply, for example, may allow for operation at many different wafer voltage levels that may be varied in time ("multilevel control") and/or the duration of either or both the positive or negative portion of the pulse may vary over time, among other things.

A pulse is a high voltage waveform that typically includes voltage at first voltage, peaks quickly to a second voltage for a short period of time, then returns to about the first voltage. A pulse may be positive or negative or bipolar (both positive and negative). A pulse may have a pulse width (e.g., full width, half maximum), an amplitude (e.g., the second voltage), a rise time (e.g., the time it takes for the waveform to change from the first voltage to a second voltage), and/or a fall time (e.g., the time it takes for the waveform to change from the second voltage back to the first voltage).

Figure 26:
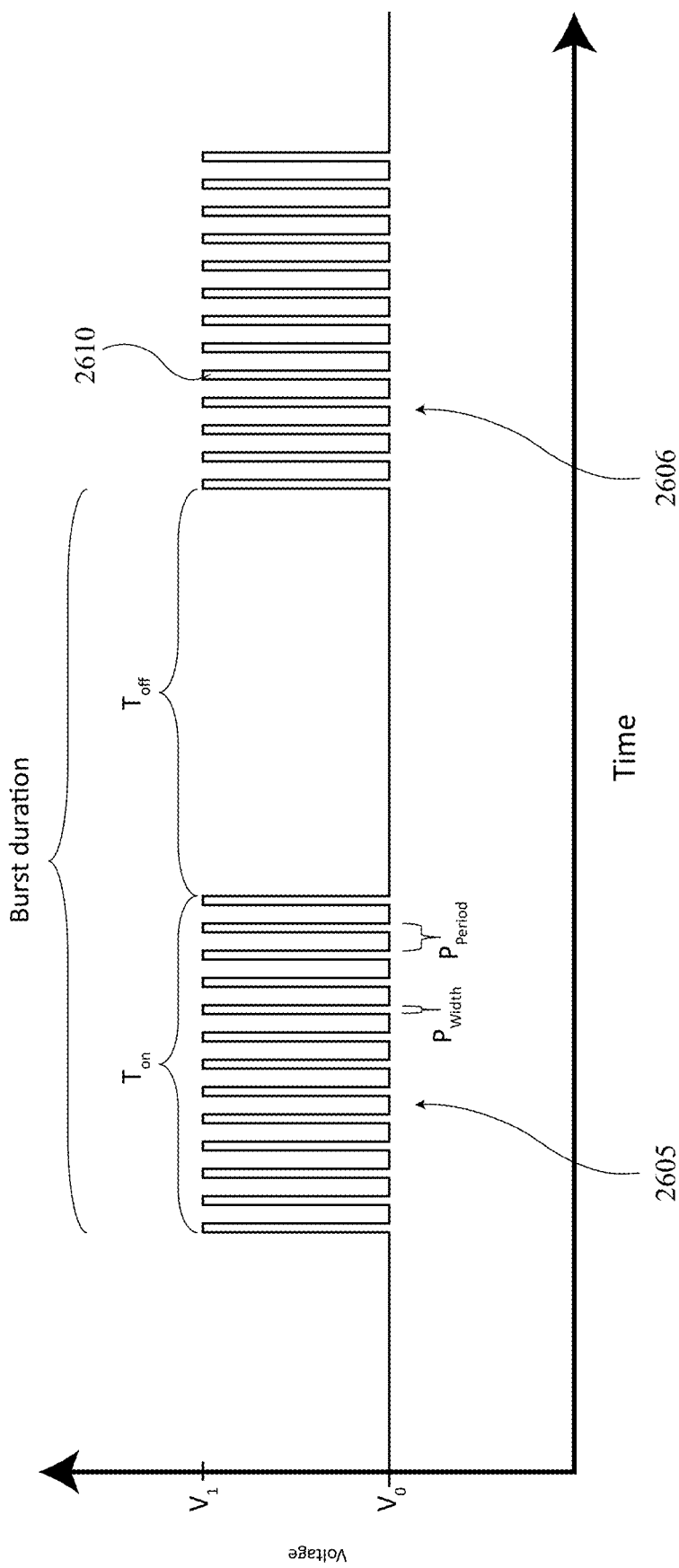
FIG. 26 is an illustration of an example waveform showing two bursts of pulses.

A burst (or a burst of pulses) is a series of pulses. A train (or pulse train) is a plurality of bursts. FIG. 26 shows an example of a pulse train with two bursts. Each burst has at least a pulse repetition frequency, a burst duration, and/or a burst period.

A high voltage pulsing power supply may compensate for voltage droop (e.g., a slope in the voltage between pulses) on a wafer in a plasma processing chamber. The voltage droop, for example, may be partially eliminated, fully eliminated, partially reversed, and/or fully reversed. For example, a wafer with a peak negative voltage of −6 kV may have a voltage droop of −2 kV by the end of the negative portion of the pulse. A high voltage pulsing power supply, for example, may hold the wafer voltage constant at around −6 kV for the entire portion of the negative pulse, a majority of the negative pulse, or a partial portion of the negative pulse, after which the wafer voltage droops. A high voltage pulsing power supply, for example, may also allow the wafer voltage to be ramped more negative in time such that the wafer voltage changes from −6 kV to −10 kV during the negative portion of the pulse. A high voltage pulsing power supply, for example, may work in the range from +100 V to +100 kV. This voltage range may include both the absolute voltage range applied to the wafer, as well as the range over which the power supply can alter the voltage from that which would be attributed to wafer droop. A high voltage pulsing power supply, for example, may control the negative wafer voltage for voltages greater than 100 V.

The average power delivered by a high voltage pulsing power supply, averaged across many bursts and/or trains, for example, may be greater than 10 W, 100 W, 1000 W, or 100 kW. The typical average power delivered by a high voltage pulsing power supply, for example, may be greater than 1 kW. The power delivered by a high voltage pulsing power supply averaged across a single burst, for example, may be 1×, 5×, or 30× the average power delivered.

The duration of the droop control (e.g., the wafer waveform control) of the negative portion of the pulse, for example, can operate for a duration of 100 μs, 1 μs, 10 μs, 100 μs, and/or 1 ms.

The positive portion of a pulse, for example, may be used to collapse the sheath/electron potential and sweep electrons onto a wafer within a plasma processing chamber to neutralize the charge that accumulated as ion current flow to the wafer during a negative portion of the pulse. The positive portion of the pulse, for example, may operate for a duration of about 100 ns, 1 µs, 10 µs, 100 µs, and/or 1 ms. The width and/or rise time of the positive portion of the pulse, for example, may be used to control the plasma potential relaxation time and the degree of ionization, among other plasma properties.

A high voltage pulsing power supply may control the ratio of the positive portion of the pulse to the negative portion of the pulse. This ratio, for example, may range from 1% to 100%. This ratio, for example, may be set to control the magnetic flux within a transformer core, to control various plasma properties such as how the positive and negative plasma sheaths are formed and collapsed, how much negative charge is transferred to the wafer during the positive portion of the pulse, and/or how much etching of the chamber wall occurs during the positive portion of the pulse, etc. This ratio may be set to optimize individual or multiple aspects of the etch process and features. For example, if features with small size and a high aspect ratio are desired, the ratio may be set to the smaller end of its range, where the positive portion of the pulse is much shorter than the negative portion of the pulse. The ratio may be adjusted to keep the magnetic flux within a transformer core below 1T A high voltage pulsing power supply may produce high voltage pulses with plasma ion currents between about 10 mA and about 300 A. A high voltage pulsing power supply may produce high voltage pulses with chucking capacitance (e.g., as represented by capacitor 12) between about 0.3 nF and about 1,000 nF. A high voltage pulsing power supply may produce high voltage pulses in plasmas with a neutral density between about 0.1 mT and about 1,000 mT and/or composed of a single gas species or a variety of gas species. A high voltage pulsing power supply may produce high voltage pulses in plasmas that have an ionization of $10^{15}$-$10^{19}$ particles per meter cubed. A high voltage pulsing power supply may produce high voltage pulses in a wide range of plasma conditions and/or chamber types.

The inductor 184, which is in series with droop diode 183, for example, may help produce positive pulses with a particular shape. The inductor 184 in series with the droop diode 183 may be set so the positive going pulse has a clean rounded sinusoidal like shape, such as, for example, without notches, divots, or multiple peaks/ringing as shown in the pulses oh waveform 210 in FIG. 2. The inductor 184, for example, may range between about 0.1 nH and about 10 µH as measured on the primary side of the transformer. The inductor 184 may include and/or include only parasitic stray inductances (no physical components. The inductor 184, for example, may be less than about 100 nH.

Figure 7:
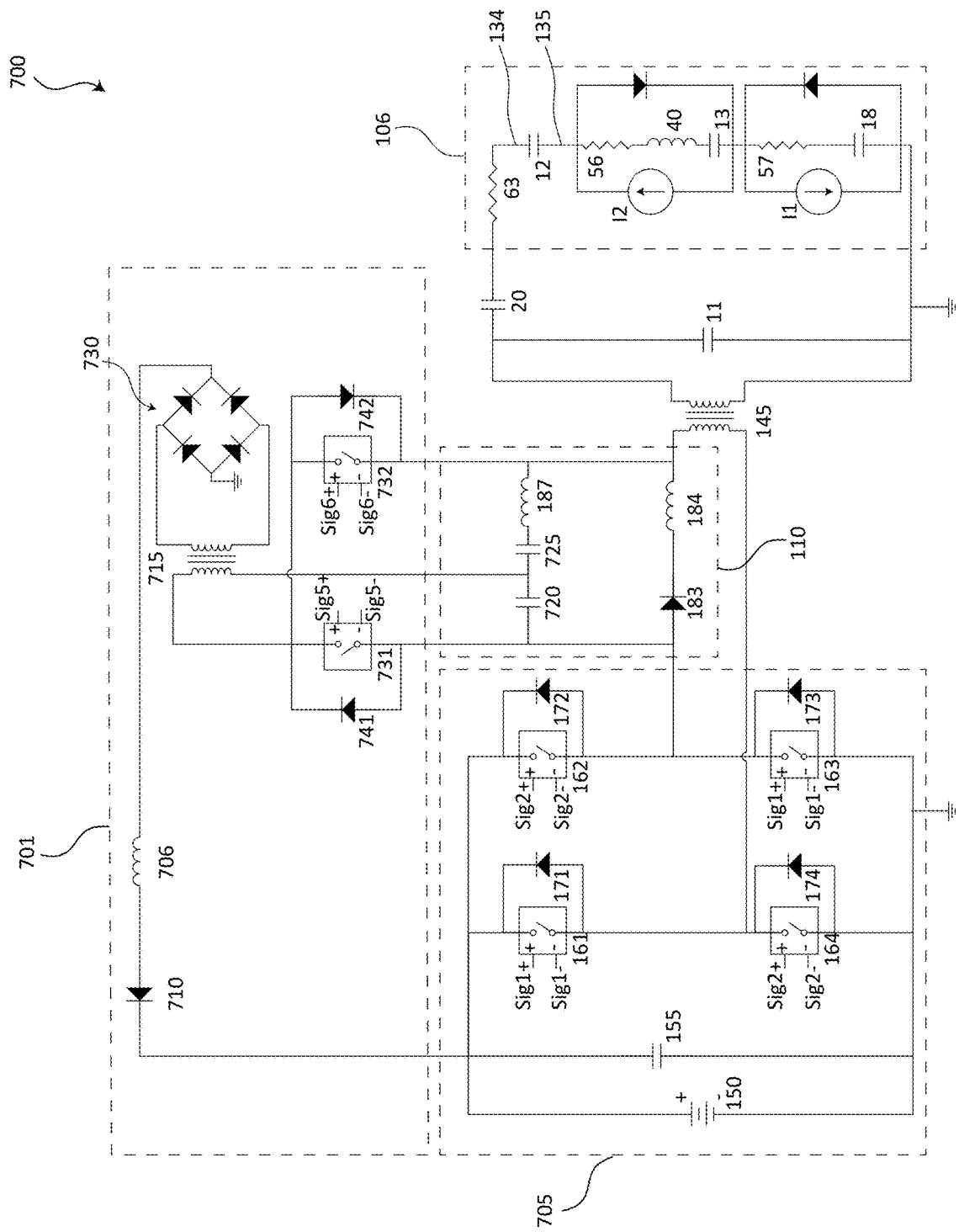
FIG. 7 is a circuit diagram of a high voltage pulsing power supply and plasma system with an energy recovery circuit.
Figure 12:
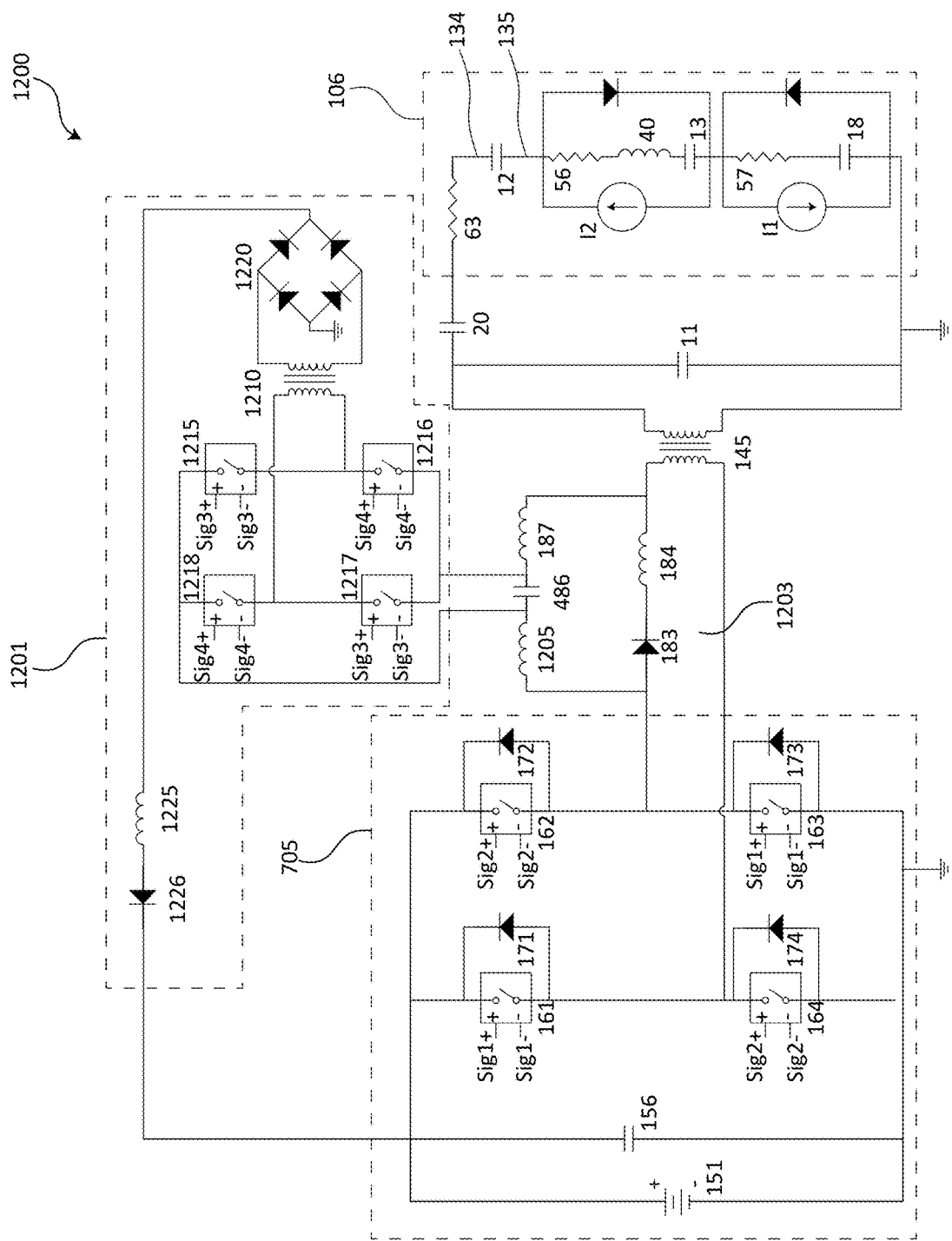
FIG. 12 is a circuit diagram of a high voltage pulsing power supply and plasma system with an active droop control circuit.

A high voltage pulsing power supply may include an energy recovery circuit (e.g., as shown in FIG. 7 and FIG. 12). The energy recovery circuit, for example, may include a DC to DC converter (e.g., rectification bridge 730) that transitions energy from one voltage level to another. The energy recovery circuit, for example, may operate with voltages between about 1 V and about 5,000 V. The energy recovery circuit, for example, may operate with power levels between about 10 W and 100 kW. The energy recovery circuit, for example, may behave as a simple DC-DC converter operating between two fixed voltages that remain constant in time or that vary in time. The time it takes the DC-DC converter to adjust the voltage ranges between which it operates ranges from about 1 µs to about 1 ms. The DC-DC converter, for example, may be based on various bridge topologies such as the half bridge or full bridge, among many possible topologies. The energy recovery circuit, for example, may recover energy from the circuit (e.g., the droop inductor) that would otherwise be lost. While recovering this energy, the energy recovery circuit, for example, can adjust the current flowing through the droop inductor and/or adjust the voltage waveform and/or amplitude applied to the wafer and/or to the plasma.

A high voltage pulsing power supply, for example, may produce narrow ion energy distribution functions within the plasma by reducing and/or eliminating the wafer voltage droop. For example, a uniform voltage maintained across the plasma may produce a narrow ion energy distribution function. As a high voltage pulsing power supply varies the voltage waveform applied to a plasma, a wide range of ion energy distribution functions can be created within the plasma that may, for example, range from those that are very peaked (e.g., see FIG. 22) to those that are flat, and those that are similar to the ion energy distribution functions created by standard sinusoidal power supplies used for plasma etch.

As another example, a high voltage pulsing power supply may produce time varying ion energy distribution functions. For example, a high voltage pulsing power supply may adjust wafer voltage and/or a wafer waveform (e.g., pulse width, pulse repetition frequency, pulse-to-pulse period, etc.) from pulse to pulse, burst to burst, and/or pulse train to pulse train. A series of pulses, for example, each of which has a peaked ion energy distribution function in a different location, could be combined to create a composite ion energy distribution function that is largely flat. Such composite ion energy distribution functions can be created, for example, from any arbitrary number of pulses containing any arbitrary distribution of waveforms, voltages, and/or ion energy distribution functions.

A high voltage pulsing power supply can create any composite ion energy distribution function. The ion energy distribution functions can be programmed and/or adjusted in real time to optimize various wafer etch parameters or ion energy distribution function parameters such as, for example, etch rate, mask erosion rate, feature aspect ratio, feature bow growth rate, feature profile, feature size, bottom hole diameter, etc. ion energy distribution functions may be created, for example, where for example 90% of the ions fall within a band representing 10% of the total width of the energy distribution and/or where the distribution is nearly flat across its entire range. ion energy distribution functions can be varied, for example, on timescales down to 100 ns, or timescales between about 10 µs and about 100 µs. The rate at which the ion energy distribution function can be varied may, for example, be set by the rate at which an energy recover circuit can adjust the DC voltage levels at which the high voltage pulsing power supply operates.

Figure 16A:
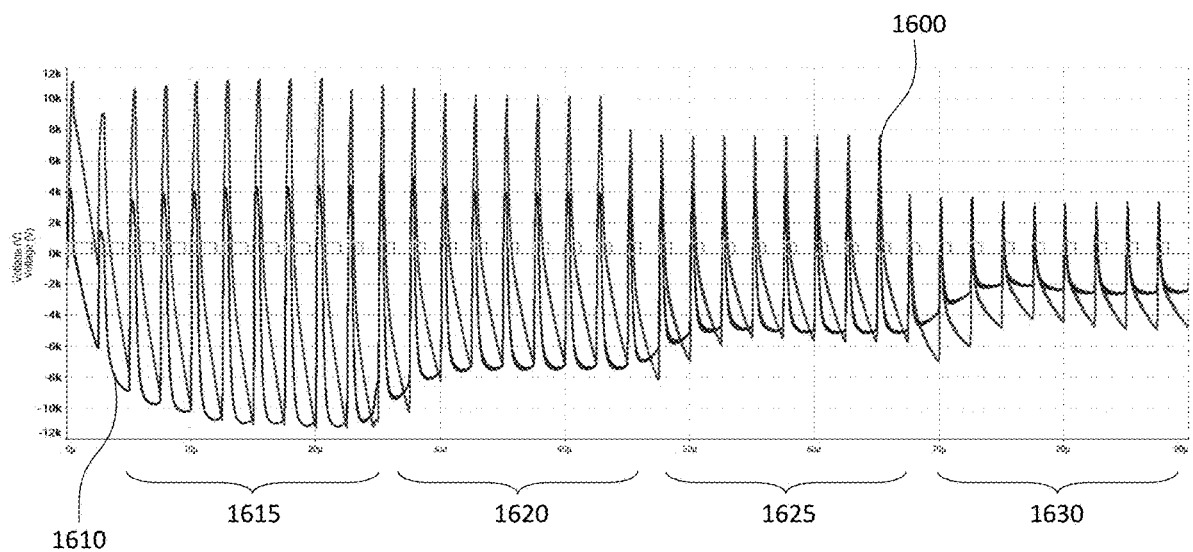
FIG. 16A shows output waveforms from the high voltage pulsing power supply and plasma system shown in FIG. 12.
Figure 16B:
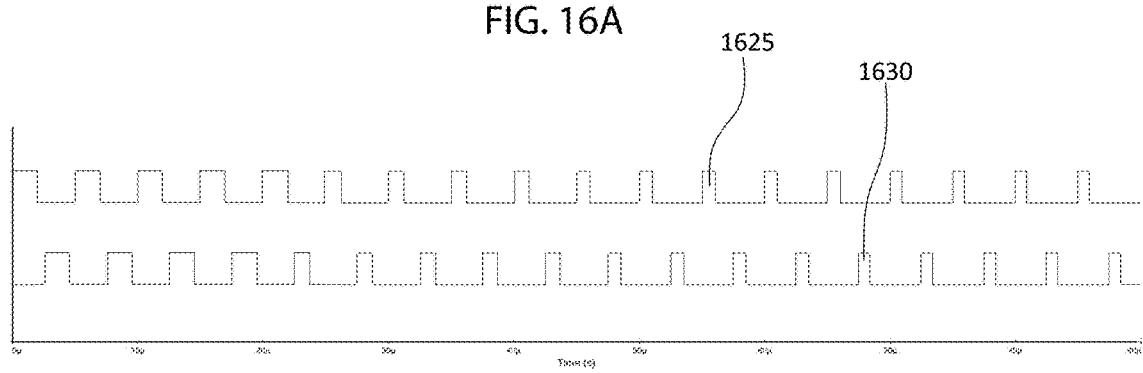
FIG. 16B shows the switching logic used to produce the waveforms shown in FIG. 16A.

A high voltage pulsing power supply may allow for operation at many different wafer voltage levels (or voltage states) that vary in time in discrete bursts or trains as shown in FIG. 16A. Such operation may be referred to as multilevel control or bilevel control.

Figure 2A:
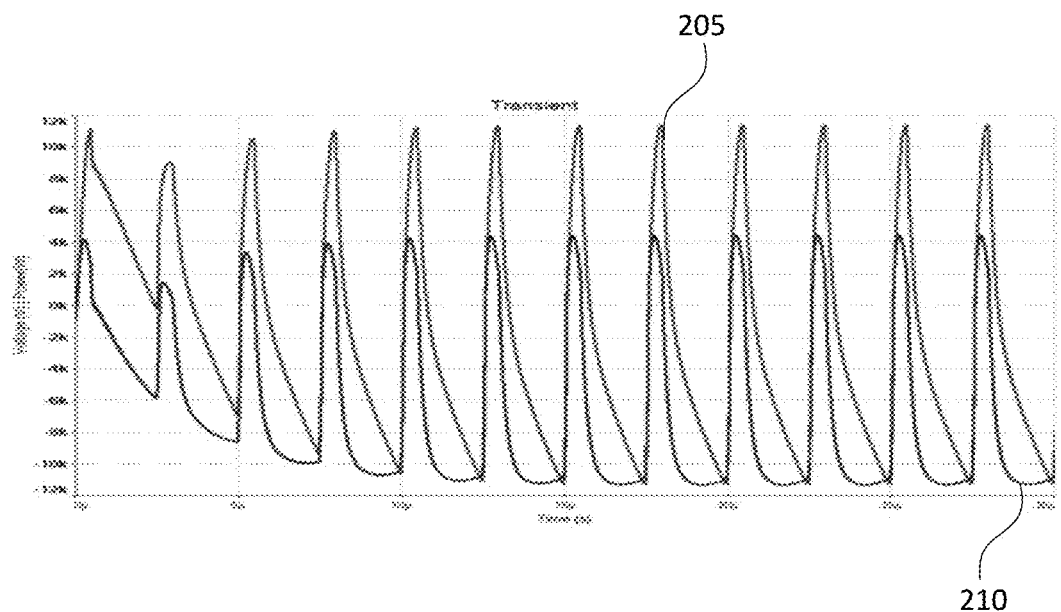
FIG. 2A and FIG. 2B show output waveforms from the high voltage pulsing power supply and plasma system shown in FIG. 1.
Figure 2B:
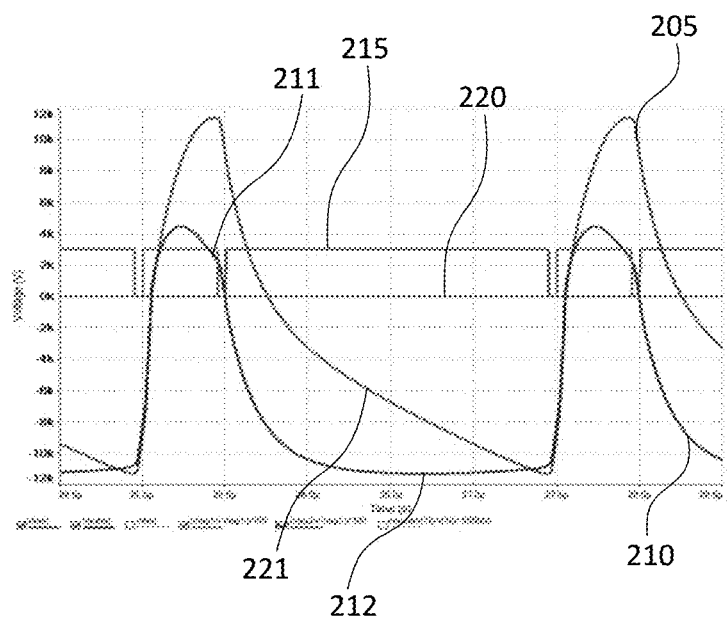

Droop in a plasma chamber, for example, may occur as current flows during the negative portion of an applied waveform (e.g., droop 221 shown in FIG. 2B). This droop, for example, charges a plasma facing surface and/or discharges a series capacitance, which may result in the voltage seen by the plasma falls in time. This often occurs, for example, during semiconductor plasma etch processes as the etch current flows to the wafer surface and reduces the voltage across the chucking capacitance. As the voltage across the chucking capacitance falls, so does the etch voltage (i.e. the voltage applied across the plasma).

Voltage droop may be governed by the equation $$I = C\frac{dV}{dt}$$

where I am the plasma current flowing into the plasma, and C is the series capacitance (e.g., the wafer chucking capacitance (e.g., capacitor 12)). And dV/dt is the rate at which the voltage across the series capacitance changes due to the flow of the plasma current during the etch process. As plasma current flows into the series capacitance, it discharges the voltage that was established at the start of the pulse when the series capacitance was charged, in accordance with the equation $$I = C\frac{dV}{dt}.$$

A high voltage pulsing power supply may operate in a way to cancel the droop in voltage seen across the series capacitance and the plasma, for example, by preventing the series capacitance from being discharged. It may do this by applying a ramped voltage to the opposite side of the relevant series capacitance that effectively cancels the dV/dt droop in voltage caused by the flow of ion current, and thus maintains a constant voltage across both the series capacitance and the plasma.

To cancel the voltage droop caused by the ion and/or etch current, a high voltage pulsing power supply may create an additional voltage droop and/or voltage change on the opposite side of the series capacitance to cancel the voltage droop that would otherwise happen. The droop inductor (e.g., droop inductor 187) may, for example, establish the ramped voltage needed to maintain a constant plasma voltage between pulses.

If the droop inductor is sized to maintain a relatively constant current during a pulse, for example, where the current matches the plasma ion and/or etch current, then the natural operation of the droop inductor imposes the needed dV/dt on the opposite side of the series capacitance such that the voltage across both the plasma and series capacitance remains constant. In as much as the current flowing through the droop inductor deviates from the ion current that is flowing in the plasma during the negative portion of the pulse, then the corresponding voltage drop across the plasma and ion energy distribution function will be consequently changed. The current that flows through the droop inductor may set both the voltage and/or the voltage waveform seen across the plasma.

A high voltage pulsing power supply may control the current that flows through the droop inductor. The droop inductor, for example, may include a physical element such as an inductor and/or stray inductance in other circuit elements. The droop inductor and/or the energy recovery circuit may control the current that flows through the droop inductor.

The size of the droop inductor may be set anywhere in the range between about 1 µH and about 10 mH. The size of the droop inductor, among other things, may be used to set specific features of the desired waveform, and the rate at which the waveform applied to the plasma can be adjusted.

The ion energy distribution can be an important factor in semiconductor plasma processing. For example, a relatively flat and low ion energy distribution with a spiked ion energy distribution at a specific energy level can improve etching or other processes. This may, for example, allow for most of the energy from the power supply to be concentrated in the plasma at a specific energy level. A high voltage pulsing power supplies disclosed in this document may be able to control the ion energy distribution within a plasma.

Real time feedback and control may be used to control the voltage waveform applied to the wafer. The voltage waveform may either be directly measured at or near the chamber or wafer (e.g., at point 134 and/or point 135) and/or calculated based on measurements of currents and voltages from other circuit elements. The amount of energy recovered and/or dissipated in the energy recovery circuit, for example, may be adjusted to create specific wafer voltage waveforms. The amount of current flowing through the droop inductor (e.g., droop inductor 187), for example, may be adjusted with real time feedback, for example, to optimize plasma and wafer etch parameters (e.g., ion energy distribution function). The timescale of the real time feedback and control may be faster than 1 Hz, 1 kHz, or 100 kHz. An active energy recovery circuit may allow for this real time feedback and control. A passive energy recovery circuit may also allow for real time feedback and control using variable passive elements, such as time variable resistors. Real time feedback and control adjustments may include, for example, the width of the positive portion of the pulse (e.g., rise time), the width of the negative portion of the pulse (e.g., fall time), the time between the positive and negative portions of the pulses, the pulse repetition frequency, the switch timing signals, etc. Numerous timing elements may be used to realize real time feedback and control. Real time feedback and control may be realized by varying the voltage applied to the pulsing power supply.

Figure 1:
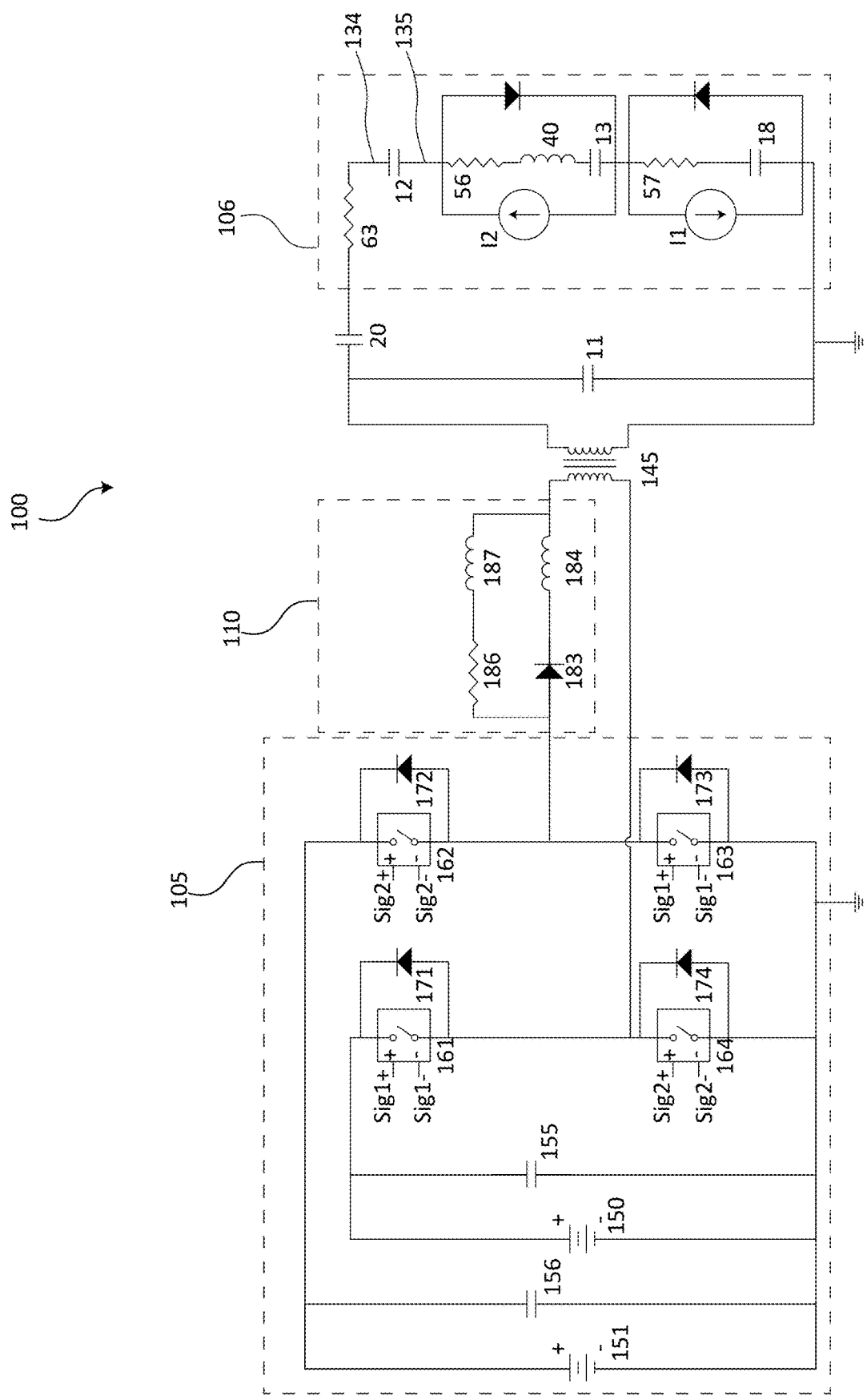
FIG. 1 is a circuit diagram of a high voltage pulsing power supply and plasma system.

FIG. 1 is a circuit diagram of a high voltage pulsing power supply and plasma system 100. The high voltage pulsing power supply and plasma system 100, for example, may include a high voltage pulsing power supply 105 and a plasma chamber 106. The plasma chamber 106 represents the effective circuit of a plasma within a plasma chamber.

The high voltage pulsing power supply 105 is shown in a full bridge configuration but may also operate in a half bridge configuration or any other bridge configuration. The high voltage pulsing power supply 105 may include a plurality of switch modules in a full bridge configuration coupled with DC power supply 150 and energy storage capacitor 155 as well as DC power supply 151 and energy storage capacitor 156. The energy storage capacitor 156 and DC power supply 151 is switched by switch modules 162 and switch modules 164 to produce the positive pulse. The energy storage capacitor 155 and DC power supply 150 is switched by switch modules 161 and switch modules 163 to produce the negative of each pulse. The DC power supply 150 and DC power supply 151 may be the same supply and the energy storage capacitor 155 and the energy storage capacitor 156 may be the same capacitor charged to the same voltage. The charge voltage range of DC power supply 150 and DC power supply 151 may be between about 0 and about 1,000 V, or between about 0 and about 3,000 V, for example.

The high voltage pulsing power supply 105 may be coupled with a droop control circuit 110. The droop control circuit 110, for example, may be coupled with a transformer 145. The droop control circuit 110, for example, may mitigate or decrease the voltage droop within the plasma chamber such as, for example, on the wafer within the plasma chamber.

The high voltage pulsing power supply and plasma system 100, for example, may produce bipolar pulses. A bipolar pulse, for example, may produce pulses that includes a positive pulse followed by a negative pulse. The bipolar pulse may be described as a single pulse that has both a positive and a negative pulse portion as shown in output waveform 205 and wafer waveform 210 in FIG. 2A and FIG. 2B. The peak-to-peak voltage between the positive pulse and the negative pulse may be greater than about 500 V, 1 kV, 2 kV, 5 kV, 10 kV, 15 kV, 20 kV, 100 kV, etc.

The high voltage pulsing power supply and plasma system 100, for example, may produce pulses that include a positive pulse having a peak voltage that may be greater than about 250 V, 500 V, 1 kV, 2 kV, 5 kV, 10 kV, 15 kV, 100 kV, etc. The high voltage pulsing power supply 105, for example, may produce pulses that include a negative pulse having a negative peak voltage that may be less than about −250 V, −500 V, −1 kV, −2 kV, −5 kV, −10 kV, −15 kV, −100 kV, etc.

The high voltage pulsing power supply and plasma system 100, for example, may produce pulses with high pulse repetition frequencies (e.g., frequencies greater than 1 kHz, 10 kHz, 100 kHz, 200 kHz, 500 kHz, 1 MHZ, etc.), fast rise times (e.g., rise times less than about 1 ns, 10 ns, 50 ns, 100 ns, 250 ns, 500 ns, 1,000 ns, 10 µs, etc.), fast fall times (e.g., fall times less than about 1 ns, 10 ns, 50 ns, 100 ns, 250 ns, 500 ns, 1,000 ns, 10 µs, etc.) and/or short pulse widths (e.g., pulse widths less than about 10 µs, 1,000 ns, 500 ns, 250 ns, 100 ns, 20 ns, etc.).

The high voltage pulsing power supply and plasma system 100, for example, may produce pulses that include a combination of pulses that may include any combination of positive pulses, negative pulses, and/or bipolar pulses.

The high voltage pulsing power supply and plasma system 100, for example, may include a high voltage pulsing power supply 105. The high voltage pulsing power supply 105, for example, may be a half-bridge or a full-bridge circuit. The high voltage pulsing power supply 105 may include a DC power supply 150 with an energy storage capacitor 155.

The high voltage pulsing power supply 105, for example, may include four switch modules 161, 162, 163, 164. Each switch module of the switch modules 161, 162, 163, and 164, for example, may include any number of solid state switches arranged in series or parallel. The switch modules 161, 162, 163, and 164, for example, may include any type of solid-state switch such as, for example, IGBTs, a MOSFETs, a SiC MOSFETs, SiC junction transistors, FETs, SiC switches, GaN switches, photoconductive switches, etc. The switch modules 161, 162, 163, and 164 may be switched at high frequencies and/or may produce a high voltage pulses. These frequencies may, for example, include frequencies of about 10 kHz, 400 kHz, 0.5 MHz, 2.0 MHz, 4.0 MHz, 13.56 MHZ, 27.12 MHz, 40.68 MHz, 50 MHZ, etc. These frequencies may, for example, may be greater than 10 kHz. Each switch module 161, 162, 163, and 164 may or may not include the same number or same type of solid state switches as the other switch modules.

Each switch of switch modules 161, 162, 163, and 164 may include one or more solid state switches S1 (e.g., solid state switches such as, for example, IGBTs, a MOSFETs, a SiC MOSFETs, SiC junction transistors, FETs, SiC switches, GaN switches, photoconductive switches, etc.).

Each switch of switch modules 161, 162, 163, 164 may be coupled in parallel with a respective bridge diode 171, 172, 173, 174 and may include stray inductance and/or stray resistance. Multiple diodes may be used per switch, while some switches may have no diode associated with them, while other switches may share a common diode or diodes. The stray inductances of the switch modules, for example, may be equal. The stray inductances of the switch modules, for example, may be less than about 10 nH, 50 nH, 100 nH, 150 nH, 500 nH, 1,000 nH, etc. The stray inductance of each switch module, for example, may be less than about 200 nH. The stray inductance of each switch module, for example, may be between about 100 nH and about 500 nH. The combination of a switch module and a respective bridge diode may be coupled in series with a respective bridge inductor.

The transformer 145 (or the transformer T1), for example, may comprise a transformer such as, for example, as disclosed in U.S. patent application Ser. No. 15/365,094, titled "High Voltage Transformer," which is incorporated into this document for all purposes.

For example, the duty cycle of the switch modules can be adjusted by changing the duty cycle of signal Sig1, which opens and closes switch module 161 and switch; changing the duty cycle of signal Sig2, which opens and closes switch module 162; changing the duty cycle of signal Sig3, which opens and closes switch module 163; and changing the duty cycle of signal Sig4, which opens and closes switch module 164.

Each switch module 161, 162, 163, or 164 in the high voltage pulsing power supply 105, for example, can be switched independently or in conjunction with one or more of the other switch modules. For example, the signal Sig1 may be the same signal as signal Sig3. As another example, the signal Sig2 may be the same signal as signal Sig4. As another example, each signal may be independent and may control each switch module 161, 162, 163, or 164 independently or separately.

The high voltage pulsing power supply and plasma system 100 may not include a traditional matching network such as, for example, a 50Ω matching network or an external matching network or standalone matching network. Indeed, the embodiments described within this document do not require a 50Ω matching network to tune the switching power applied to the wafer chamber. In addition, embodiments described within this document provide a variable output impedance RF generator without a traditional matching network. This can allow for rapid changes to the power drawn by the plasma chamber. Typically, this tuning of the matching network can take at least about 100 µs to about 200 µs. Power changes, for example, can occur within one or two RF cycles, for example, about 2.5 µs to about 5.0 µs at about 400 kHz.

Figure 21:
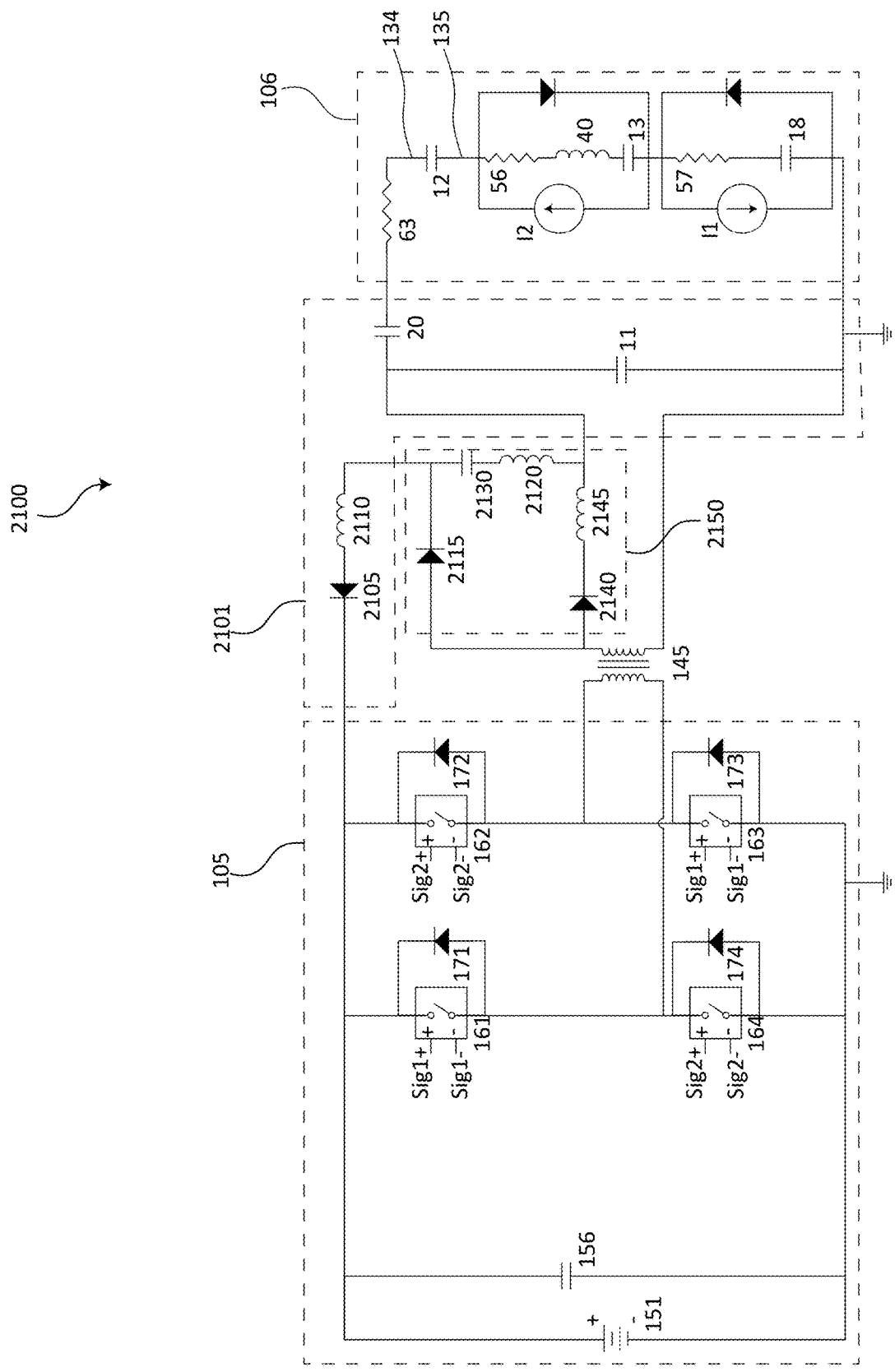
FIG. 21 is a circuit diagram of a high voltage pulsing power supply and plasma system with a droop control circuit, and an energy control circuit.
Figure 24:
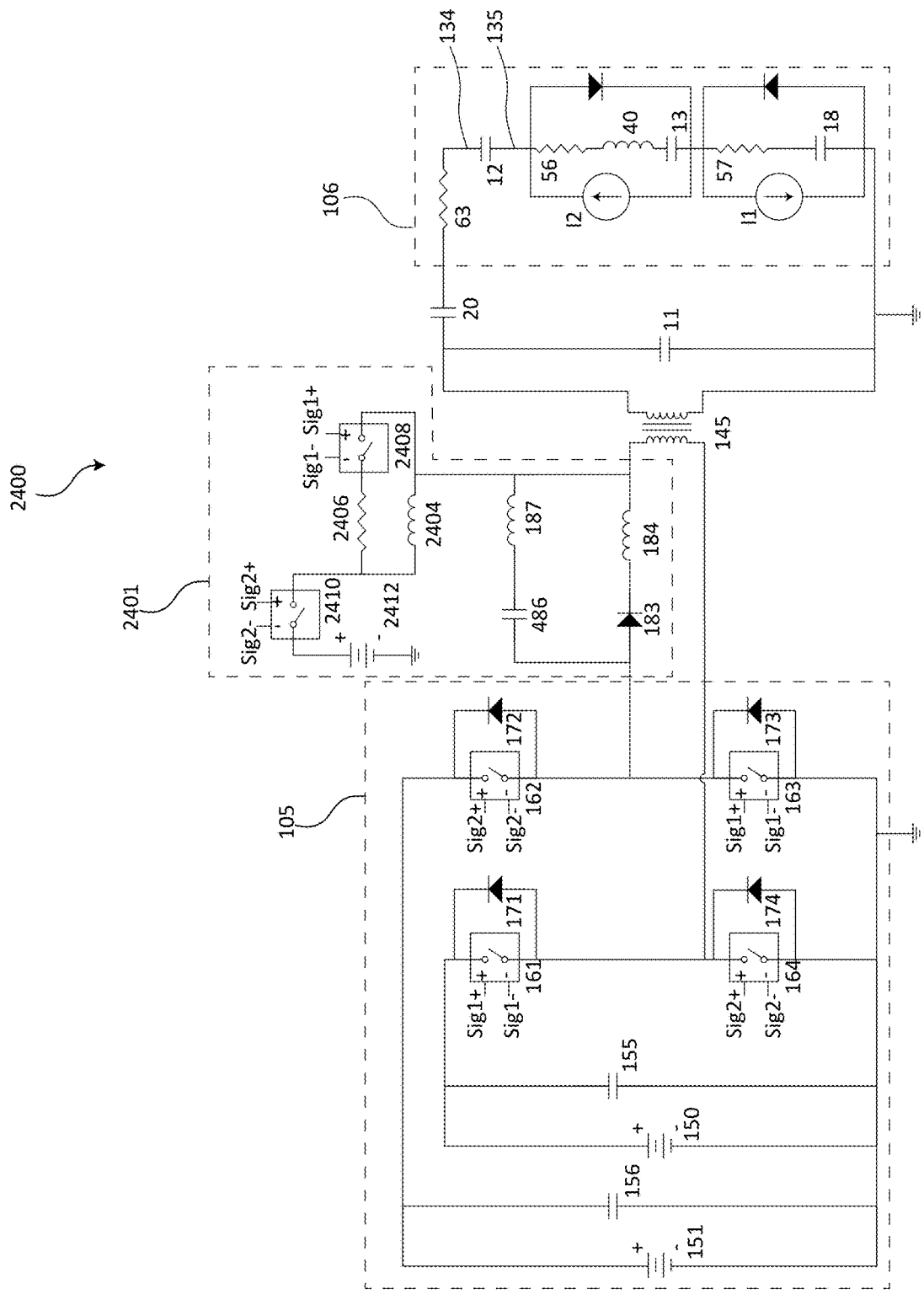
FIG. 24 shows a circuit diagram of a high voltage pulsing power supply and plasma system with an active droop control circuit.

The high voltage pulsing power supply 105, for example, may be replaced with a half bridge circuit with two switch modules. The high voltage pulsing power supply 105, for example, may provide power in multiple configurations. For example, multiple power supply and energy storage capacitor combinations may be used to power the full bridge (or half bridge) as shown in FIG. 1 and FIG. 24. As another example, a single power supply and energy storage capacitor combination may be used to power the full bridge (or half bridge) as shown in FIG. 7, FIG. 12, and FIG. 21.

The droop control circuit 110 may include a droop inductor 187 coupled in series with droop resistor 186. The series combination of the droop inductor 187 and the droop resistor 186 may be arranged in parallel or across the droop diode 183 and/or inductor 184.

The droop diode 183, for example, may include one or more diodes arranged in series or parallel. The droop diode 183, for example, may be rated to carry currents greater than about 100 amps. The droop diode 183, for example, may be rated to carry currents greater than about 10, 100, 1000, 10,000, etc.

The inductor 184, for example, may include a physical inductor and/or represent a parasitic inductance and/or stray inductance. The parasitic inductance and/or stray inductance, for example, may include the inductance of components between the high voltage pulsing power supply 105 and the plasma chamber 106 and/or the inductance of the transformer 145. The inductor 184, for example, may have an inductance of about 0.1 nH, 1 nH, 10 nH, 100 nH, 1 µH, or 10 µH. The inductor 184, for example, may have an inductance less than about 500 nH.

The value of the inductance of the inductor 184, for example, may be set such that the positive going pulse has a nice sinusoidal top. If the value of the inductance of the inductor 184 is too small then the ring up on the positive pulse, for example, will be too short and a step in the positive pulse may appear later in time. If the value of the inductance of the inductor 184 is too small, for example, then oscillations may be seen across the top of the positive pulse. If the value of the inductance of the inductor 184 is too big, for example, the smooth sinusoidal top will not have time to complete, and the sinusoid may be truncated. If the value of the inductance of the inductor 184 is too big, for example, the positive pulse may be increasing when it is truncated by the transition to the negative going pulse.

The droop control circuit 110 controls the voltage ramp on the transformer 145 so the peak voltage is reached later in the pulse. The droop inductor 187 is energized during the negative voltage portions of a bipolar pulse while the droop resistor 186 extracts energy from the droop inductor 187. The shape of the applied negative pulse in combination with droop resistor 186 sets the equilibrium current in the droop inductor 187. The equilibrium current, for example, may have a pulse to pulse ripple that is less than 1%, 5%, 20%, or 100% of its average value. The droop inductor, for example, may have an inductance so that during a burst of pulses equilibrium is reached within less than the first 2, 5, 70, or 100 pulses. The droop inductor 187, for example, may have an inductance to allow the equilibrium current through the droop inductor 187 to be reached within less than 20 pulses. During a positive portion of a pulse of a bipolar pulse, the current flows through droop diode 183 and inductor 184 into the transformer 145.

The inductor 184, for example, may have an inductance of about 0.1 nH, 3 nH, 100 nH, or 10 µH. Typically it is set to be less than 200 nH. The droop inductor 187, for example, may have an inductance of about 1 µH, 10 µH, 100 µH, or 3000 µH.

The droop resistor 186, for example, may have a resistance of about 0.01 Ohm, 0.3 Ohms, 30 Ohms, or 100 Ohms. It is typically set less than 4 Ohms.

The plasma chamber 106, for example, may represent an idealized or effective circuit for semiconductor processing chamber such as, for example, a plasma deposition system, semiconductor fabrication system, plasma sputtering system, plasma etch system, etc. The capacitance of capacitor 12, for example, may represent the capacitance of an electrostatic chuck upon which a semiconductor process wafer may sit. The chuck, for example, may comprise a dielectric material (e.g., aluminum oxide, or other ceramic materials and a conductor housed within the dielectric material). For example, the capacitor 23 may have small capacitance (e.g., about 10 pF, 100 pF, 500 pF, 1 nF, 10 nF, 100 nF, etc.).

The capacitor 13, for example, may represent the sheath capacitance between the plasma to the wafer. The resistor 56, for example, may represent the sheath resistance between the plasma and the wafer. The inductor 40, for example, may represent the sheath inductance between the plasma and the wafer. The current source 12, for example, may be represent the ion current through the sheath. For example, the capacitor 23 or the capacitor 13 may have small capacitance (e.g., about 10 pF, 100 pF, 500 pF, 1 nF, 10 nF, 100 nF, etc.).

The capacitor 18, for example, may represent the plasma sheath capacitance to the wall of the chamber. The resistor 57, for example, may represent resistance between the plasma and the chamber wall. The current source I1, for example, may be representative of the ion current in the plasma. For example, the capacitor 23 or the capacitor 18 may have small capacitance (e.g., about 10 pF, 100 pF, 500 pF, 1 nF, 10 nF, 100 nF, etc.).

The plasma chamber may include one or more electrodes that can be used to ignite the plasma and/or to drive the plasma. One or more electrodes may be electrically coupled with a high voltage pulsing power supply.

FIG. 2A and FIG. 2B show an output waveform 205 at point 134 and a wafer waveform 210 at point 135 in the circuit of an example of the high voltage pulsing power supply and plasma system 100. The wafer waveform 210, for example, may show the voltage on a wafer within a plasma chamber such as, for example, a dielectric etch plasma chamber. The waveform 215 shows the switching logic of SIG±2 switch module 162 and switch module 164. The waveform 220 shows the switching logic of SIG±1 switch module 161 and switch module 163. As shown, the portion of the output waveform 205 between pulses has a negative slope, which causes the portion of the wafer waveform 210 between pulses to be substantially flat.

The output waveform 205, for example, was created with a charge voltage of 600 V from the DC power supply 151, a positive pulse width of 450 ns, and a negative pulse width of 1,950 ns. In this example, the droop inductor 187 is about 6 µH, the droop resistor 186 has a resistance of 0.5 ohms, and the inductor 184 has an inductance of about 16 nH. This may, for example, mitigate or decrease voltage droop within the plasma chamber such as, for example, on the wafer within the plasma chamber as shown by the flat portion of wafer waveform 210 between two positive pulses.

FIG. 2B also an example of two high voltage pulses. Each pulse of the wafer waveform 210 has a positive pulse portion 211 and a negative pulse portion 212. The positive pulse portion 211 is the portion of a pulse with a voltage greater than zero and the negative pulse portion 212 is the portion of the pulse below zero. Between the negative pulse portion 212 and the positive pulse portion 211 the pulse may have a fast rise time (i.e., steep positive slope). And between the positive pulse portion 211 and the negative pulse portion 212 the pulse may have a fast fall time (i.e., steep negative slope). The fall time, for example, may be slower than the rise time.

Between the positive pulse portion 211, for example, may have an upper relatively flat portion (or at least with a gradual rising and/or falling slope). The positive pulse portion 211 may have any length. The negative pulse portion 212, for example, may have lower relatively flat portion (or at least with a gradual rising and/or falling slope). The negative pulse portion 212, for example, may have any length. The negative pulse portion 212 may have a length longer than the positive pulse portion 211.

The height of the positive pulse portion 211 relative to the negative pulse portion 212 is the amplitude of the pulse. The time between consecutive positive pulse portions 211 may be the pulse period and the inverse of the pulse period may be the pulse repetition frequency. A pulsed waveform is not a sinusoidal waveform or an RF waveform. Indeed, an ideal pulsed waveform on the wafer (e.g., wafer waveform 210) is more like a square wave than a sinusoidal waveform. In addition, a sinusoidal waveform cannot have fast rise times and/or fast fall times with longer upper relatively flat portions and/or lower flat portions, which is not necessarily the case with pulse waveforms. In addition, in a sinusoidal waveform the positive pulse portion 211 and the negative pulse portion 212 have about the same length, whereas in a pulsed waveform, this is not necessarily the case.

The output waveform 205 in FIG. 2B shows an example droop 221 between pulses. As shown, a droop between pulses is a negative slope in the negative pulse portion 212.

Figure 3A:
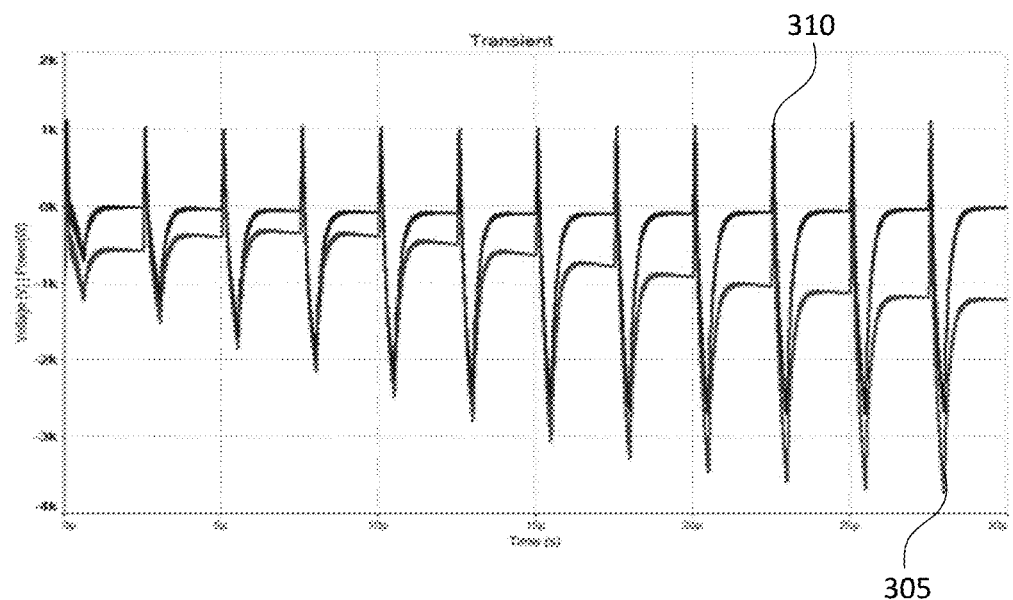
FIG. 3A and FIG. 3B show output waveforms from the high voltage pulsing power supply and plasma system shown in FIG. 1.
Figure 3B:
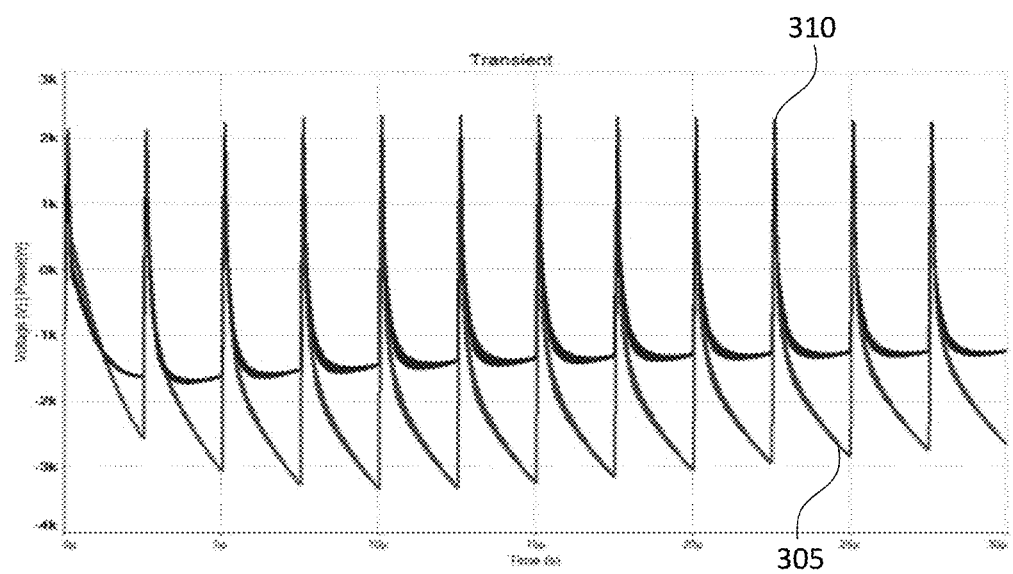

A lower output voltage, for example, may be achieved by adjusting the time constraints such that the charge voltage remains substantially constant. This may be referred to as multistate operation, which includes a series of pulses having different voltages. A multistate operation, for example, can be achieved by adjusting the positive and negative pulse width as shown in FIG. 3A and FIG. 3B, which show an output waveform 305 at point 134 and a wafer waveform 310 at point 135. In FIG. 3A, a positive pulse of 50 ns and negative pulse width of 350 ns is used. In FIG. 3B, the positive pulse width is 90 ns, and the negative pulse width is 2,310 ns.

A multistate operation, for example, may be achieved by increasing the value of the droop resistor 186, where higher resistance values may lead to lower output voltages. FIG. 3B shows a waveform where the droop resistor 186 was set to 6 Ohms, as opposed to the 0.5 Ohms used in generating FIG. 2B.

Figure 4:
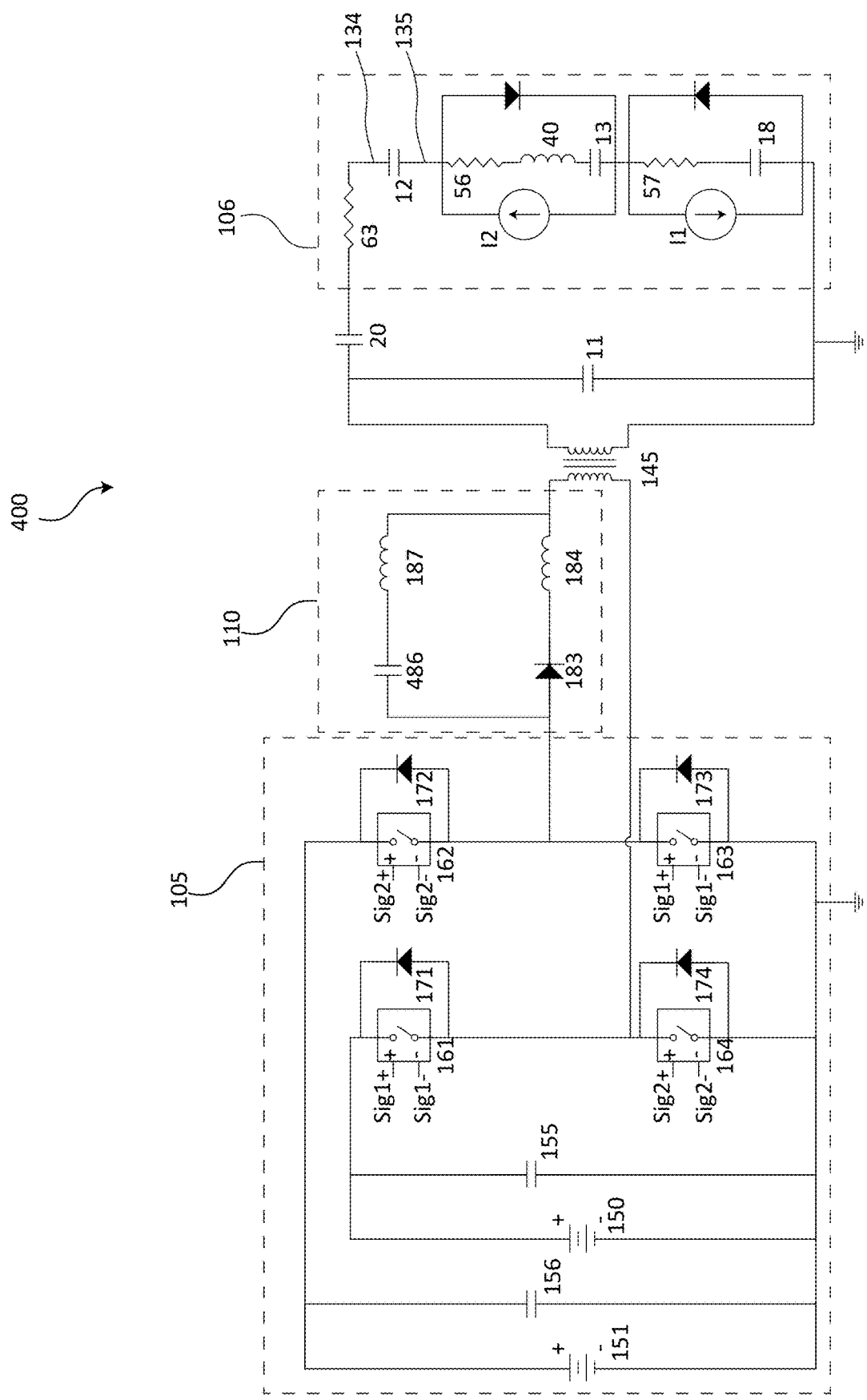
FIG. 4 is a circuit diagram of a high voltage pulsing power supply and plasma system.

FIG. 4. is a circuit diagram of an example high voltage pulsing power supply and plasma system 400. The droop resistor 186 in plasma system 100 has been replaced with a droop capacitor 486 in series with the droop inductor 187. The droop capacitor 486, for example, may have a capacitance of about 10 mF, 25 mF, 50 mF, 100 mF, 250 mF, 500 mF, 1,000 mF, 38 F, 200 F, etc. The droop capacitor 486, for example, may extract energy from the droop inductor. While the droop resistor 186 dissipates energy as ohmic losses, the droop capacitor 486 may convert energy into stored capacitive energy. This stored energy may, for example, increase the potential difference across the droop capacitor 486. This stored energy, for example, may be recovered by an energy recovery circuit (e.g., energy recovery circuit 701 or active droop control circuit 1201 or energy compensation circuit 2101) such that the voltage across droop capacitor 486 remains approximately constant during a burst. The energy recovery circuit may, for example, include a DC-DC converter that maintains voltage on droop capacitor 486 while delivering excess energy to the high voltage pulsing power supply 105. When an energy recovery circuit is used, the droop capacitor 486 may have a value of less than about 100 mF, 10 mF 100 µF, 10 µF, or 1 µF. Typically the value is set to less than about 30 µF for full bridge topologies and about 100 µF for half bridge topologies.

Figure 5A:
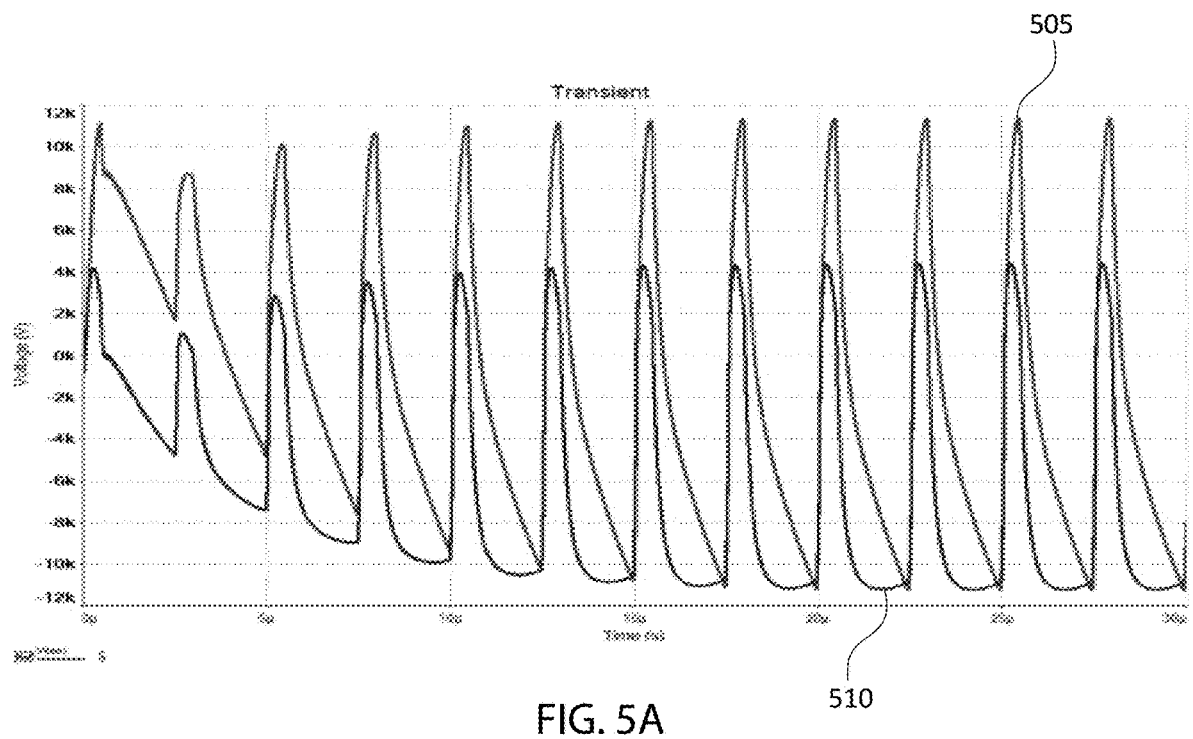
FIG. 5A and FIG. 5B show output waveforms from the high voltage pulsing power supply and plasma system shown in FIG. 4.
Figure 5B:
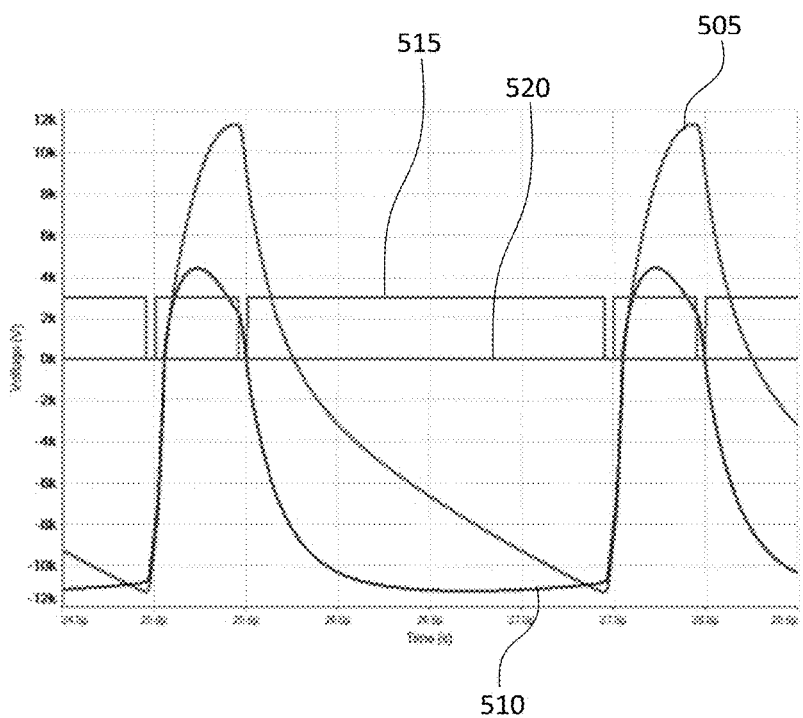

FIG. 5A and FIG. 5B show an output waveform 505 measured at point 134 of the high voltage pulsing power supply and plasma system 400 and the wafer waveform 510 is measured at point 135 in the circuit of an example of the high voltage pulsing power supply and plasma system 400. The wafer waveform 510, for example, may show the voltage on a wafer within a plasma chamber. The waveform 515 shows the switching logic of SIG±2 switch module 162 and switch 164. The waveform 520 show the switching logic of SIG±1 switch module 161 and switch 163. As shown, the portion of the output waveform 505 between pulses has a negative slope, which causes the portion of the wafer waveform 510 between pulses to be substantially flat.

The output waveform 505 and wafer waveform 510 can be created, for example, with a charge voltage of 600 V from the DC power supply with a 450 ns positive pulse width and 1950 ns negative pulse width. A −270 V initial charge may be added across the droop capacitor 486. In the example shown in FIG. 5A and FIG. 5B, the droop capacitor 486 may have a capacitance of about 200 mF.

Figure 6A:
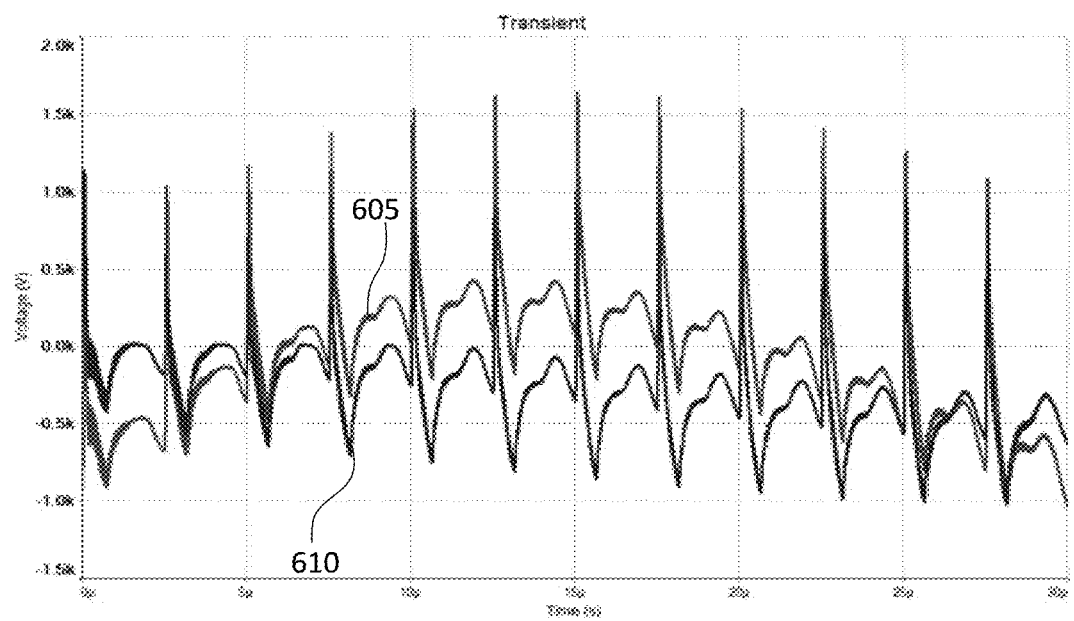
FIG. 6A and FIG. 6B show output waveforms from the high voltage pulsing power supply and plasma system shown in FIG. 4.
Figure 6B:
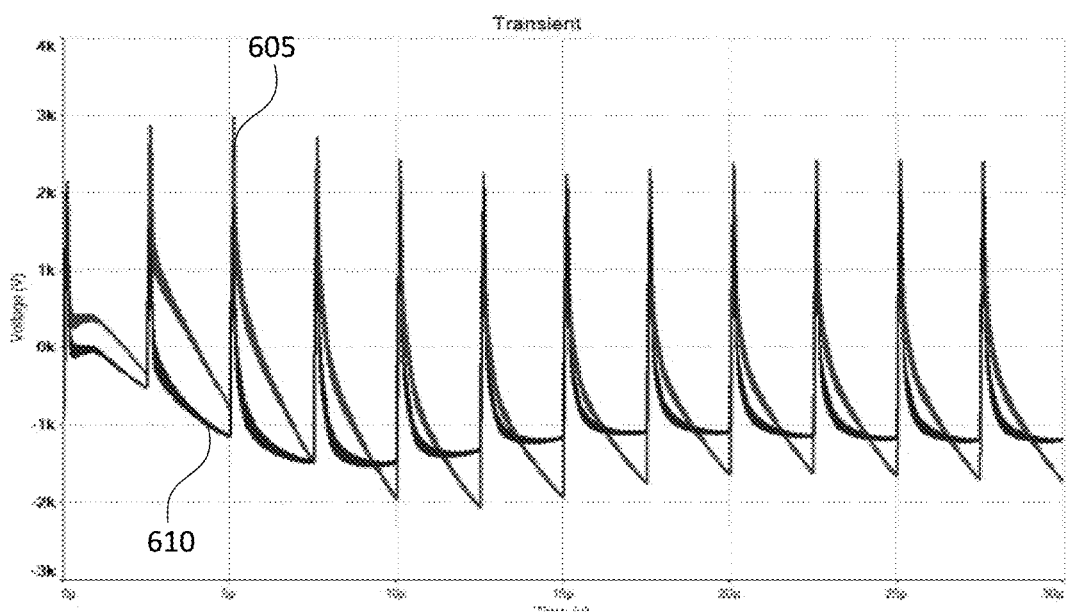

FIG. 6A and FIG. 6B show an output waveform 605 at point 134 and a wafer waveform 610 at point 135. FIG. 6A shows waveforms with a 50 ns positive pulse and a 350 ns negative pulse width. FIG. 6B shows waveforms with a 90 ns positive pulse, 2310 ns negative pulse, and −575 V initial charge voltage on the droop capacitor.

FIG. 7 is a circuit diagram of a high voltage pulsing power supply and plasma system 700 that may include power supply 705 coupled with plasma chamber 106. The high voltage pulsing power supply and plasma system 700 may include a droop control circuit 110 and/or an energy recovery circuit 701. The power supply 705 may be similar to the high voltage pulsing power supply 105 with a DC power supply 150 and an energy storage capacitor 155.

The energy recovery circuit 701 is coupled with the droop inductor 187 of the droop control circuit 110. The energy recovery circuit 701 may also be coupled with the DC power supply 150 and the energy storage capacitor 155. The energy recovery circuit 701, for example, may include a DC-DC converter coupled between the droop control circuit 110 and the energy storage capacitor 155.

The energy recovery circuit 701 may include switch module 731 and switch module 732 arranged in a half bridge configuration (a full bridge configuration or other bridge configuration may also be used). Each switch module 731, 732 may include respective switch diode 741, 742. The energy recovery circuit 701 may also include a transformer 715 coupled with the switch module 731, and/or the switch module 732. The transformer 715 may be inductively coupled with a rectification bridge 730, which is coupled with the energy storage capacitor 155 through an energy recovery inductor 706 and/or an energy recovery diode 710. The energy recovery diode 710, for example, may allow charge from the droop capacitor 720 and/or the droop capacitor 725 to flow to charge the energy storage capacitor 155. The values of each of the elements in the energy recovery circuit may be set to allow the voltage on droop capacitor 720 and droop capacitor 725 to be varied in a time less than 2 pulses, 20 pulses, or 200 pulses, for example.

The energy recovery inductor 706, for example, may have a low inductance. The energy recovery inductor 706, for example, may have an inductance less than about 1 nH, 10 nH, 50 nH, 100 nH, 150 nH, 500 nH, 1,000 nH, etc. The energy recovery inductor 706, for example, may include the inductance of the rectification bridge 730, the transformer 715, the switch module 731, and/or the switch module 732.

The switch module 731 and/or the switch module 732, for example, can be switched on and off to control the amount of energy removed from the droop inductor 187. This can be done, for example, by adjusting the duty cycle of switch module 731 and/or switch module 732. This can be done, for example, based on feedback from one or more sensors monitoring the voltage at the capacitance 12.

The energy recovery circuit 701, for example, may transfer energy from the droop inductor 187 to charge the energy storage capacitor 155. The energy recovery circuit 701 is coupled across the droop capacitor 720 and/or droop capacitor 725.

Figure 8A:
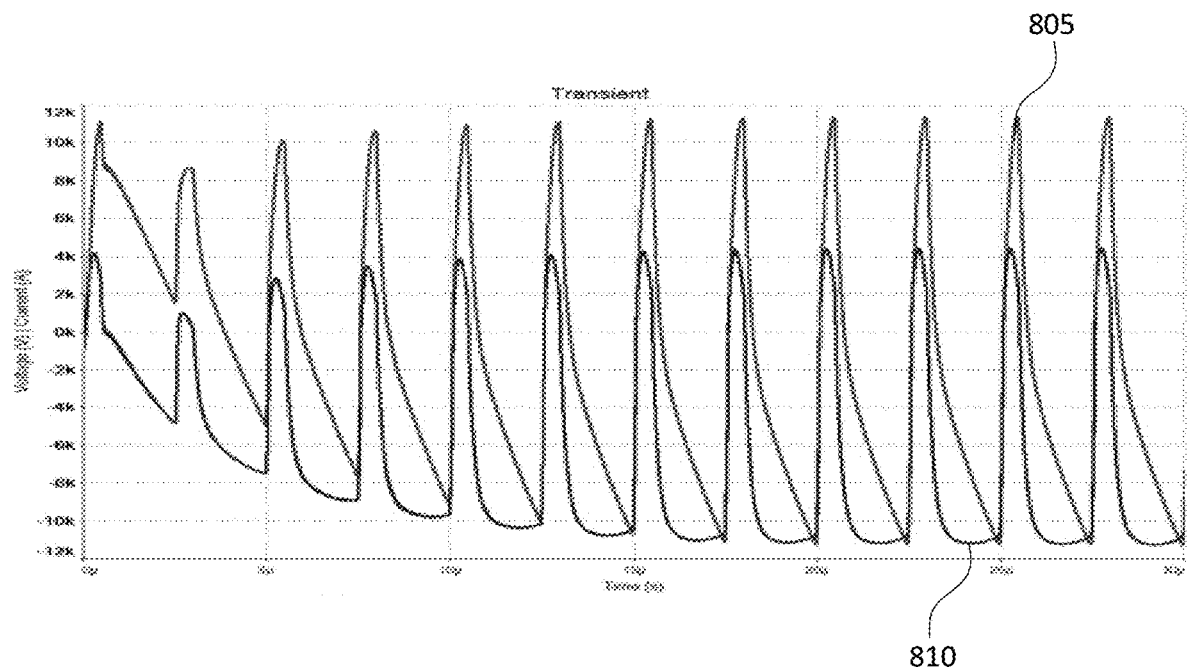
FIGS. 8A and 8B show output waveforms from the high voltage pulsing power supply and plasma system shown in FIG. 7.
Figure 8B:
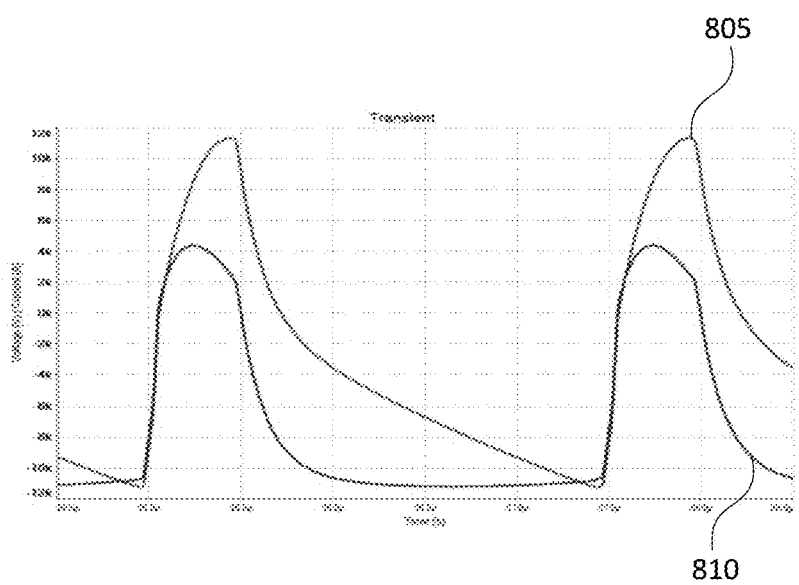

FIGS. 8A and 8B show an output waveform 805 at point 134 and a wafer waveform 810 at point 135 in the circuit of an example of the high voltage pulsing power supply and plasma system 700. As shown, the portion of the output waveform 805 between pulses has a negative slope, which causes the portion of the wafer waveform 810 between pulses to be substantially flat.

In this example, the output can be created with a charge voltage of 600 V from the DC power supply with a 450 ns positive pulse width and 1950 ns negative pulse width. In this example, the switching frequency of switch module 731 and switch module 732 is set to 250 kHz. Typical frequencies of operation may be greater than 1 kHz, 10 kHz, 100 kHz, or 3 MHz. Each switch, in this example, is closed for about 1.65 µs, which amounts to an 8 about 2.5% duty cycle. In this example, an initial charge voltage is applied across the droop capacitor 720 and/or droop capacitor 725 of about −135 V, where the total initial charge voltage across the 2 capacitors is-270 V. In this example, each of the droop capacitor 720 and/or droop capacitor 725 have a capacitance of about 25 µF, though other values may be used such as less than about 1 µF, 33 µF, 500 µF, or 3 mF. The specific value of capacitance may be selected to set both the ripple in the plasma current and the rate at which the wafer voltage can be adjusted through the action of the energy recovery circuit. Typical adjustment times may be greater than about 0.1 µs, 1 ms, or about 10 minutes, for example. While this initial emf enables the output voltage to reach equilibrium quickly, the energy recovery circuit duty cycle sustains the equilibrium.

Figure 9:
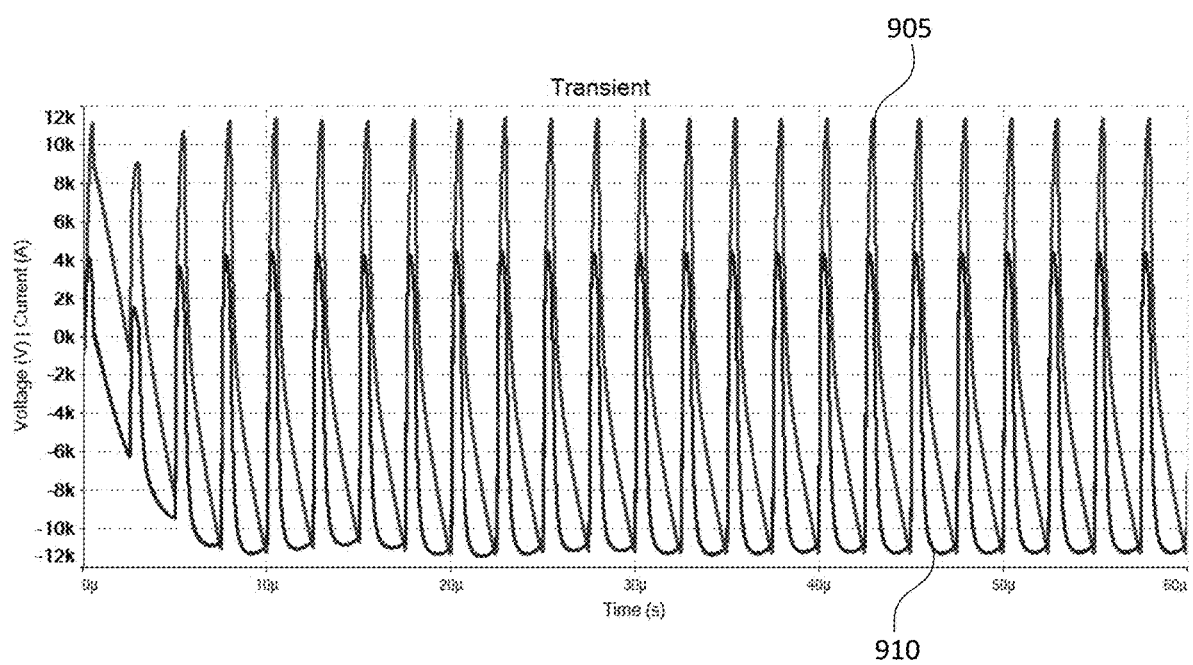
FIG. 9 show output waveforms from the high voltage pulsing power supply and plasma system shown in FIG. 7.

FIG. 9 shows an output waveform 905 at point 134 and a wafer waveform 910 at point 135 in the circuit of an example of the high voltage pulsing power supply and plasma system 700. In this example, no initial emf is applied to the droop capacitor 720 and/or droop capacitor 725. In this example, the output voltage still reaches equilibrium.

Figure 10A:
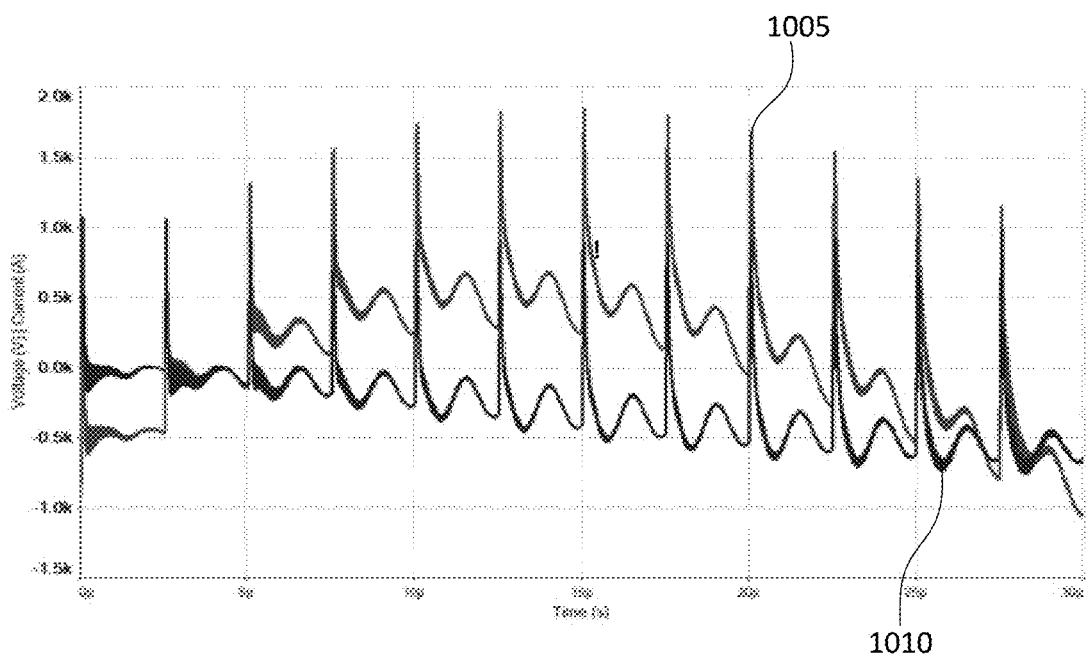
FIGS. 10A and 10B show output waveforms from the high voltage pulsing power supply and plasma system shown in FIG. 7.
Figure 10B:
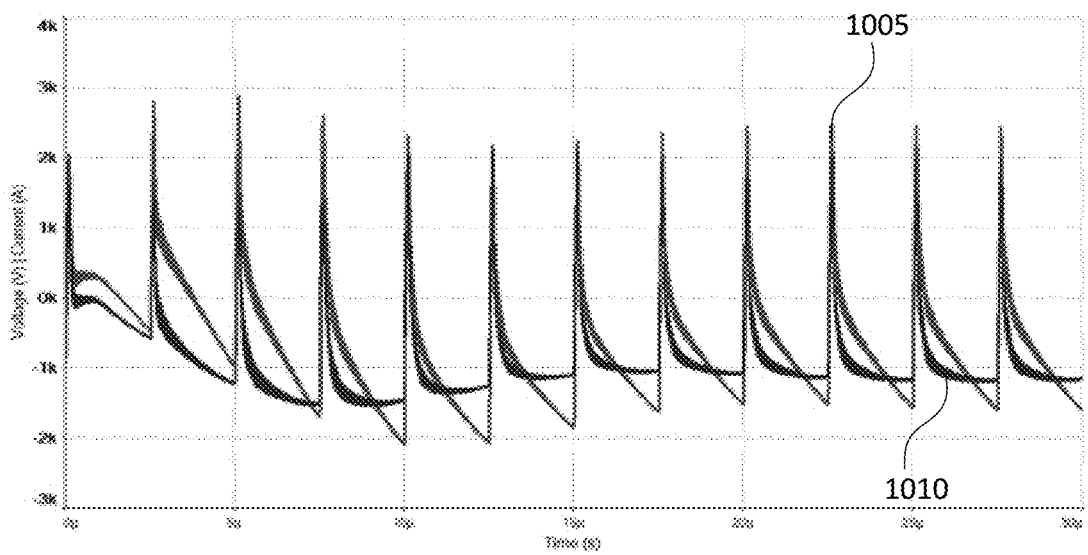

FIGS. 10A and 10B show an output waveform 1005 at point 134 and a wafer waveform 1010 at point 135 in the circuit of an example of the high voltage pulsing power supply and plasma system 700 . . . . In this example, the circuit values are the same as those used to produce the waveforms shown in FIGS. 8A and 8B, but the timings for FIG. 10A are 50 ns for the positive pulse and 350 ns for the negative pulse, and the timings for FIG. 10B are 90 ns for the positive portion of the pulse and 2310 ns for the negative portion of the pulse. In this example, the energy recovery circuit duty cycle is reduced to 15%. The duty cycle of the energy recovery circuit may range anywhere from 0% to 100% as is typical of DC to DC converters.

Figure 11:
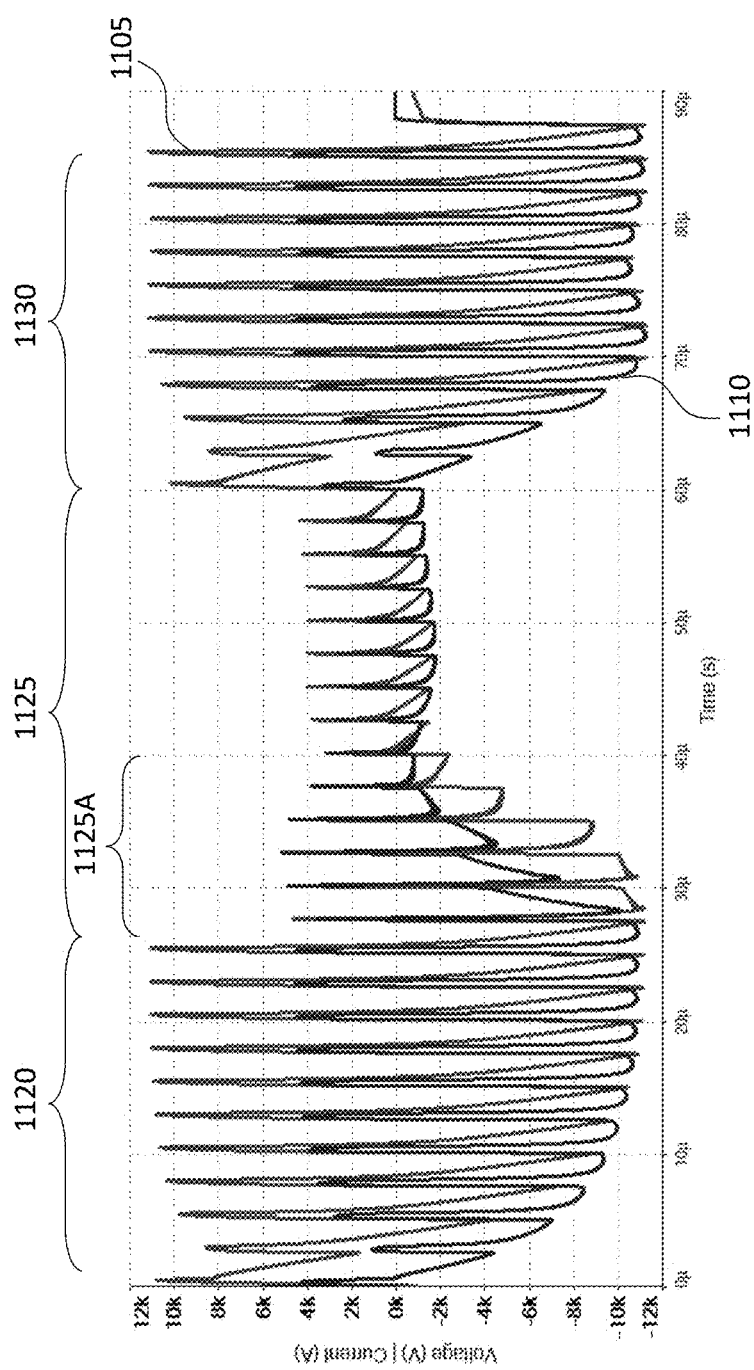
FIG. 11 show output waveforms from the high voltage pulsing power supply and plasma system shown in FIG. 7.

FIG. 11 show an output waveform 1105 at point 134 and a wafer waveform 1110 at point 135 in the circuit of an example of the high voltage pulsing power supply and plasma system 700. In this example, the output voltage switches between a high voltage burst 1120 of about 27.5 µs, a multi-state burst 1125 of about 32.5 µs, and a high voltage burst 1130 of about 27.5 µs. The transition occurred simply by using the energy recovery circuit to set/program the voltage across the droop capacitor 720 and/or the droop capacitor 725. Increasing the voltage across these capacitors may lead to lower voltage and/or multilevel operation, while decreasing the voltage across these capacitors may lead to higher voltage operation. By regulating the voltage across these capacitors, the energy recovery circuit, or DC to DC converter, can be used to create any general combination of output voltages, forming any desired time dependent pattern. During the transition from high voltage burst 1120 to multi-state burst 1125, the transformer flux can swing negative for a few transition bursts 1125A. The multistate positive pulse width, for example, can be adjusted and/or the multistate negative pulse width can be lowered to avoid saturating the transformer during this transition to reduce the amount of negative flux injected into the transformer core.

FIG. 12 is a circuit diagram of a high voltage pulsing power supply and plasma system 1200 with an active droop control circuit 1201. The active droop control circuit 1201, for example, may also include energy recovery elements (e.g., energy recovery inductor 1225 and diode 1226) that recover energy from the droop inductor 187 to the energy storage capacitor 156.

The high voltage pulsing power supply and plasma system 1200 includes a high voltage pulsing power supply 705 coupled with the active droop control circuit 1201 and the plasma chamber 106.

The active droop control circuit 1201, for example, may include droop inductor 187 coupled in series with droop capacitor 486 and second droop inductor 1205. The total droop inductance may be split evenly between the droop inductor 187 and the droop inductor 1205, or it may be divided unevenly between the droop inductor 187 and the droop inductor 1205. The exact division selected may simplify the design and construction of each of the individual inductors. A switch circuit (e.g., half bridge switch circuit or full bridge switch circuit) may be coupled across the droop capacitor 486. The switch circuit may also be coupled with transformer 1210.

The active droop control circuit 1201, for example, may include switch module 1215, switch module 1216, switch module 1217, switch module 1218, transformer 1210, diode rectification bridge 1220, energy recovery inductor 1225, and/or energy recovery diode 1226. The diode rectification bridge 1220, for example, may be coupled with or between the energy recovery inductor 1225 and transformer 1210. The energy recovery inductor 1225 may be coupled with the energy storage capacitor 156 that is part of the power supply 705.

Charge may be removed from and/or added to the droop capacitor 486 by controlling the timing of the switches in the active droop control circuit 1201. The active droop control circuit 1201 may be or include any converter that moves energy from droop capacitor 486 to energy storage capacitor 156 or moves energy from energy storage capacitor 156 to droop capacitor 486.

The active droop control circuit 1201, for example, may include or comprise any of various forms of a DC-DC converters. The active droop control circuit 1201, for example, may include a set of switches arranged in a bridge configuration, a transformer, a rectification stage, and a filter inductor. One example function of the active droop control circuit 1201 may be to regulate the voltage on droop capacitor 486. This may be done, for example, on the needed timescale to create the desired wafer voltage waveforms and/or plasma voltage waveforms.

Droop capacitor 486 may have a value of less than about 10 mF, 1 mF, 20 µF, or 1 µF. For example, droop capacitor 486 may have a value of less than about 100 µF. The specific value of the droop capacitor 486, for example, may be selected to allow and/or facilitate the ability of the active droop control circuit 1201 to adjust the voltage across droop capacitor 486 on the needed timescale. The timescale of adjustment may be greater than about 1 µs, 1 ms, or 1 hour. Smaller inductance values of the droop capacitor 486, for example, may allow for the faster adjustment of the output voltage, and thus the ability to both more rapidly adjust the ion energy distribution in a plasma, and the ability to more finely tune the composite ion energy distribution in the plasma that includes the sum of the individual ion energy distribution in the plasma.

The timescale for the active droop control circuit 1201 to adjust the voltage on droop capacitor 486 may be less than 2 pulses, 20 pulses, or 200 pulses, where each pulse may have a positive and negative portion that when combined last for 100 ns, 1 µs, 2.5 µs, 100 µs, or 1 ms. The timescale for the active droop control circuit 1201 to adjust the voltage on droop capacitor 486 may be considered fast for the typical 100 ms to 1 s timescales on which DC-DC converters typically operate/regulate voltages.

By regulating the voltage on droop capacitor 486, the active droop control circuit 1201, for example, may allow for control of the ion energy distribution in the plasma and/or allow for voltage droop control between pulses on the wafer. Either or both of these, for example, can be done in real time such as, for example, within about 100 µs, 10 µs, 5 µs, 1 µs, 500 ns, 250 ns, 100 ns, etc. There may be advantages to rapidly varying the voltage on droop capacitor 486, and/or to slowly varying it. When it is slowly varied, a relatively uniform ion energy distribution function may be realized pulse to pulse, while when it is rapidly varied, very different ion energy distribution functions may be realized pulse to pulse. The cumulative resultant ion energy distribution function may be the same whether the voltage across the chuck capacitance (e.g., capacitor 12) is varied slowly or quickly. However, by rapidly varying the voltage across droop capacitor 486, completely new and/or different cumulative ion energy distribution functions may be attained than can be realized by any individual pulse's ion energy distribution function.

Figure 13:
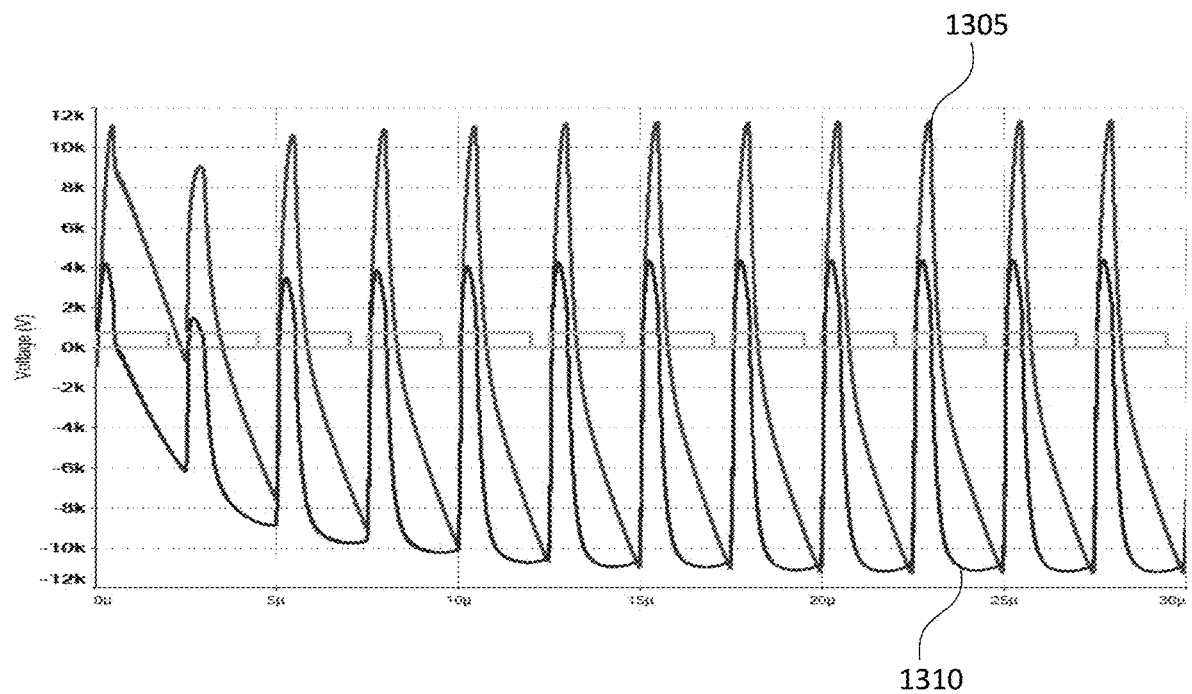
FIG. 13 shows output waveforms from the high voltage pulsing power supply and plasma system shown in FIG. 12.
Figure 14A:
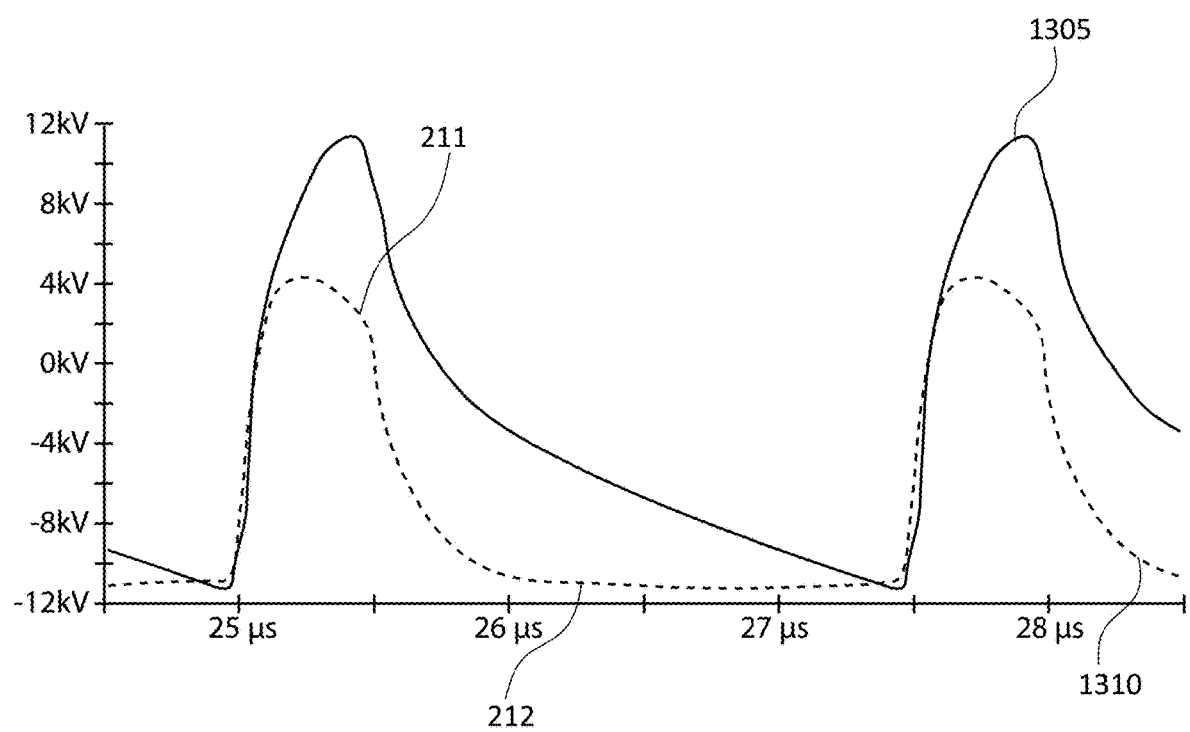
FIG. 14A shows output waveforms from the high voltage pulsing power supply and plasma system shown in FIG. 12.
Figure 14B:
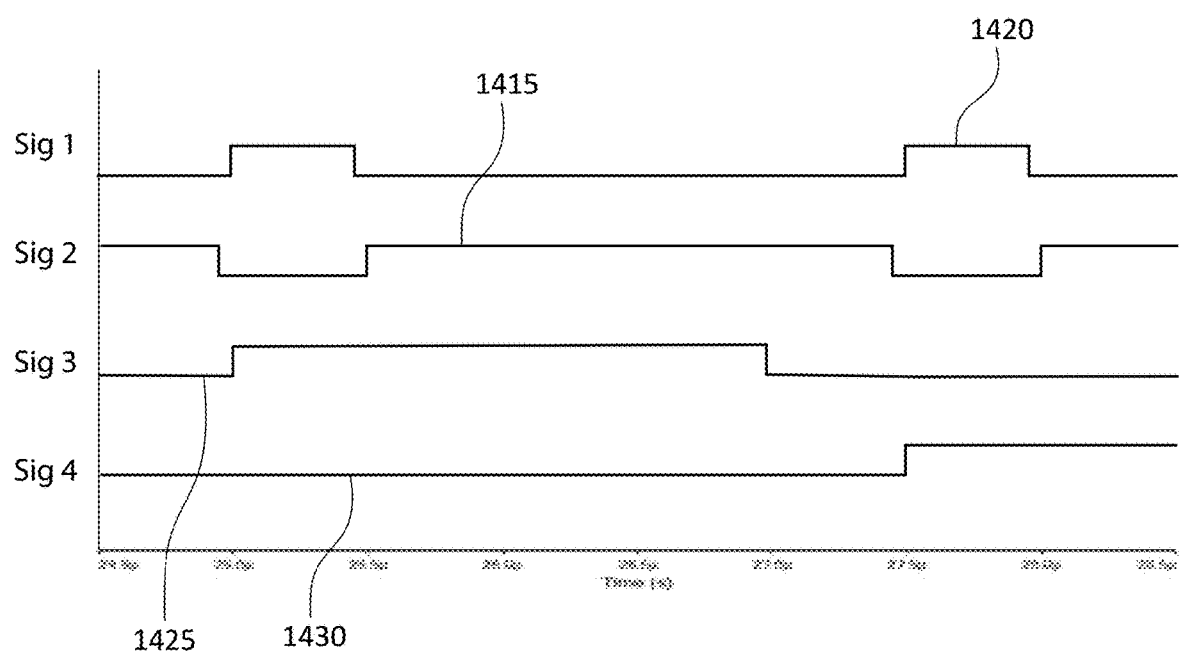
FIG. 14B shows the switching logic used to produce the waveforms shown in FIG. 14A.

FIG. 13 shows waveforms having a series of pulses produced by the high voltage pulsing power supply and plasma system 1200. FIG. 14A shows a zoomed in version of two pulses, and FIG. 14B shows the various control waveforms used by the various switches to produce the waveforms shown in FIGS. 13 and 14A.

For example, output waveform 1305 is the waveform measured at point 134 and wafer waveform 1310 is a corresponding waveform measured at point 135. The output waveform 1305 shows the voltage at the at capacitor 12. The wafer waveform 1310 shows the voltage on a wafer within the plasma chamber. The control waveform 1420 shows the switching logic of SIG±2, which opens and closes the switch module 162 and switch module 164, which when closed generates the positive pulse portion 1305. The control waveform 1415 shows the switching logic of SIG±1, which opens and closes switch module 161 and switch module 163, which generates the negative pulse portion 1315. The energy recovery waveform 1425 shows the switching logic of SIG±3, which opens and closes ER switch 1215 and ER switch 1217, and the energy recovery waveform 1430 shows the switching logic of SIG±4, which opens and closes ER switch 1216 and ER switch 1218.

The positive pulse portion in waveform 1305 and waveform 1310 correspond with the closing of switch 161 and switch 163 by control waveform 1415, and the opening switch 162 and switch 164 with control waveform 1420. The peak and minimum voltages of the positive pulse portion and negative pulse portion in waveform 1305 and waveform 1310 may be proportional to the duration of either or both the on time of waveform 1425 and/or the on time of waveform 1430. The duration of the on time of waveform 1425 and 1430 may be used to set the voltage on droop capacitor 486. Varying the duration of the on time of waveform 1425 and 1430 may be used to vary the voltage on droop capacitor 486.

In addition, although the negative pulse portion of the output waveform 1305 has a negative slope or a droop, the negative pulse portion of the wafer waveform 1310 is substantially flat. In this example, the output waveform 1305 and wafer waveform 1310 can be created by the plasma system 1200, for example, with a charge voltage of 600 V from the DC power supply with a 450 ns positive pulse width and 1950 ns negative pulse width.

The waveforms shown in FIG. 13, FIG. 14A, and FIG. 14B were created using a droop capacitor having a capacitance of less than about 10 µF. The transformer 1201, for example, may have a low turns ratio such as, for example, a 3:1 or a 2:1 turns ratio, or the turns ratio may be set higher to be around 10:1 or 40:1. The specific value of the turns ratio selected will in part set both the ripple in the current flowing through the energy recovery circuit, and the rate at which the active droop control circuit 1201 can adjust the voltage on droop capacitor 486. The higher the turns ratio is set, the bigger the ripple in the current is, and the faster the active droop control circuit 1201 can adjust the voltage on droop capacitor 486. The switching frequency of switch modules 1215, 1216, 1217, 1218 may be about 200 kHz. Operating frequencies between about 1 kHz and about 10 MHz may be selected. As another example, each switch of switch modules 1215, 1216, 1217, 1218 may be closed for about 1.98 µs, and/or have a duty cycle of about 79.2%. The selected duty cycle may range between 0% and 100%, which allows the active droop control circuit 1201 to recover anywhere from its minimum to maximum amount of energy. The active droop control circuit 1201 may be any form of DC to DC converter.

FIG. 12 shows a full bridge topology. Many other DC to DC converter topologies is possible. The DC to DC converter topology may be designed to allow the voltage on droop capacitor 486 to be adjusted rapidly, for example in less than 100 µs, 10 µs, or 1 µs. It may also allow the voltage on droop capacitor 486 to be adjusted very slowly, for example in greater than 1 s, 1000 s, or 1 day. The standard operation of the active droop control circuit 1201 may allow the voltage across droop capacitor 486 to map out whatever waveform is desired, on any time timescale between very fast and very slow. Some of the plasma processes may require rapid voltage adjustment, while others may require the plasma conditions to be slowly adjusted over hours to days.

Figure 15A:
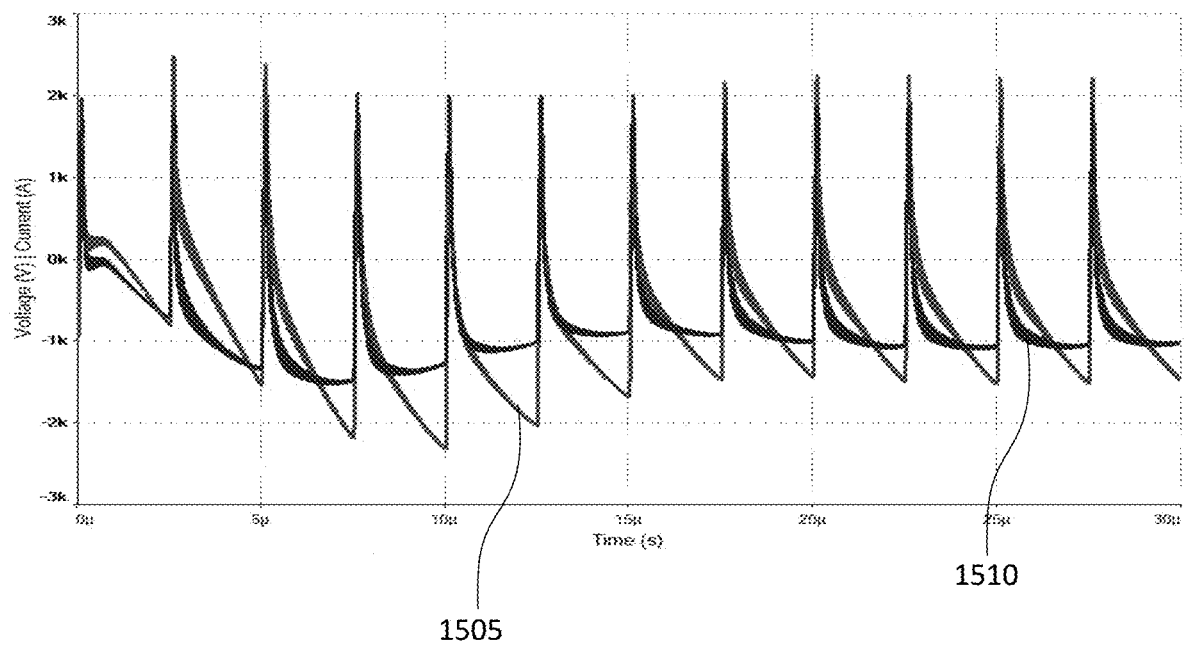
FIG. 15A shows output waveforms from the high voltage pulsing power supply and plasma system shown in FIG. 12.
Figure 15B:
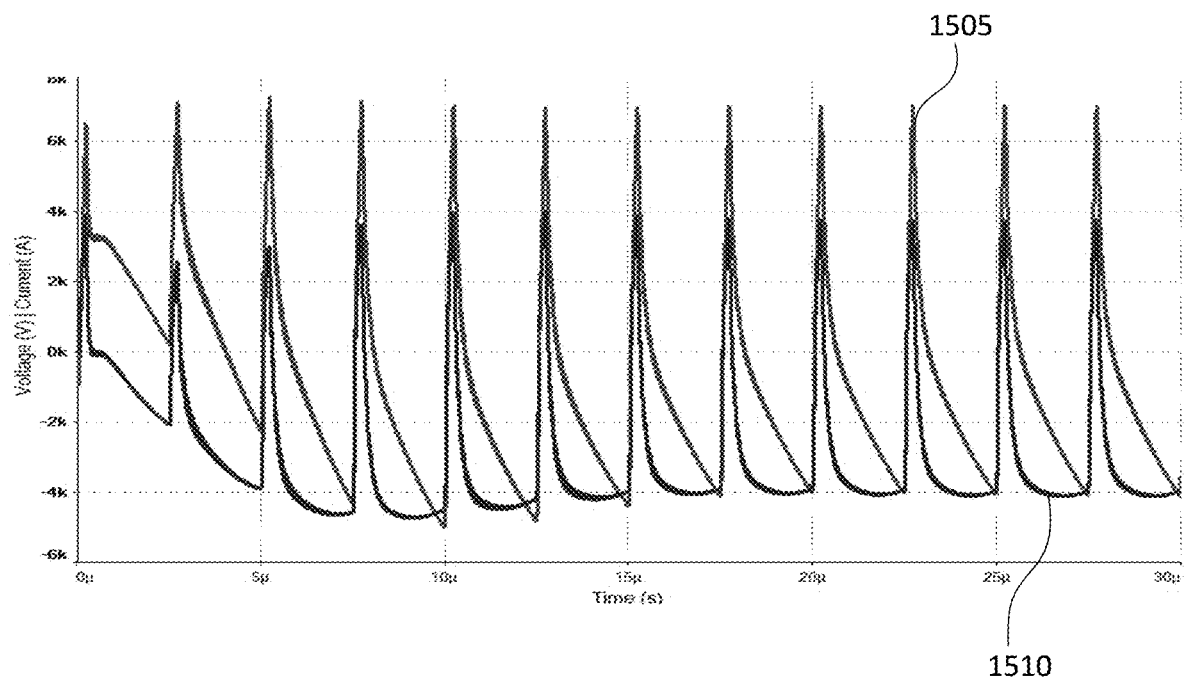
FIG. 15B shows output waveforms from the high voltage pulsing power supply and plasma system shown in FIG. 12.

The active droop control circuit 1201 may, for example, allow for operation at a range of wafer voltages without changing the input charging voltage. For example, by changing the positive and negative pulse widths of switch modules 1215, 1216, 1217, 1218 and/or the duty cycle of the switch modules 1215, 1216, 1217, 1218 the duration of the negative wafer voltage time can be increased and/or the output voltage may be increased. FIG. 15A shows a wafer waveform 1510 having a 1 kV wafer voltage generated by the plasma system 1200 with an 85 ns positive pulse, a 2315 ns negative pulse, and a 300 ns energy recovery pulse from switch modules 1215, 1216, 1217, 1218. FIG. 15B shows a wafer waveform 1510 having a 4 kV wafer voltage generated by the plasma system 1200 with a 200 ns positive pulse width, a 2200 ns negative pulse, and a 730 ns energy recovery pulse from switch modules 1215, 1216, 1217, 1218.

A process for creating the waveforms shown in FIG. 14A using the logic represented by the waveforms in FIG. 14B is also disclosed. For example, at a first time, the process may include closing a first switch module (e.g., switch module 162 and/or switch module 164) and opening a second switch module (e.g., switch module 161 and/or switch module 163) of a high voltage pulsing power supply 705 to produce a positive pulse portion 211 of a first high voltage pulse 1305. The positive pulse portion, for example, may have an amplitude greater than about 1 kV.

At about the first time or shortly thereafter, the process may include closing a third switch module (e.g., switch module 1216 and/or switch module 1218) and opening a fourth switch module (e.g., switch module 1215 and/or switch module 1217) of an energy recovery circuit 2101.

At a second time after the first time, the process, for example, may include opening the first switch module (e.g., switch module 162 and/or switch module 164) and closing the second switch module (e.g., switch module 161 and/or switch module 163) to produce a negative pulse portion 212 of the first high voltage pulse.

At a third time after the second time, the process, for example, may include opening the third switch module.

At a fourth time after the third time, the process, for example, may include closing the first switch module and opening the second switch module to produce another positive pulse portion of a second high voltage pulse, the positive pulse portion having an amplitude greater than about 1 kV.

At about the fourth time or shortly thereafter, the process, for example, may include closing the fourth switch module at about the fourth time.

At a fifth time after the fourth time, the process, for example, may include opening the first switch module and closing the second switch module to produce a negative pulse portion of the second high voltage pulse.

FIG. 16A shows output waveform 1600 at point 134 and wafer waveform 1610 at point 135 in the circuit of an example of the high voltage pulsing power supply and plasma system 1200. In this example, the output waveform 1600 and the wafer waveform 1610 have four different voltage states (e.g., first state 1605, second state 1610, third state 1615, and fourth state 1620) that are controlled by changing the pulse width and/or the duty cycle of the switches in the active droop control circuit 1201 and/or the pulse width of the pulses produced by the power supply 705, and or the pulse widths driving the switches in the energy recovery circuit. The energy recovery control waveform 1625 controls the switching logic of SIG±3, which opens and closes ER switch 1215 and ER switch 1217 and the energy recovery waveform 1630 shows the switching logic of SIG±4, which opens and closes ER switch 1216 and ER switch 1218, where ER is an abbreviation of energy recovery.

The first state 1605, for example, has a duration of about 22.5 µs and a negative voltage of about −10 kV. The first state 1605, for example, may be produced by a 450 ns positive pulse width (+PW) and 1950 ns negative pulse width (−PW) from the power supply 705 and a symmetric 1980 ns pulse width at about 200 kHz from the active droop control circuit 1201.

The second state 1610, for example, has a duration of about 22.5 µs and a negative voltage of about −7.5 kV. The second state 1610 may be produced by a 320 ns positive pulse width (+PW) and 2080 ns negative pulse width (−PW) from the power supply 705 and a symmetric 1200 ns pulse width at about 200 kHz from the active droop control circuit 1201.

The third state 1615, for example, has a duration of about 22.5 µs and a negative voltage of about −5 kV. The third state 1615 may be produced by a 215 ns positive pulse width (+PW) and 2185 ns negative pulse width (−PW) from the power supply 705 and a symmetric 1020 ns pulse width at about 200 kHz from the active droop control circuit 1201.

The fourth state 1620, for example, has a duration of about 22.5 µs and a negative voltage of about −2.5 kV. The fourth state 1620 may be produced by a 115 ns positive pulse width (+PW) and 2285 ns negative pulse width (−PW) from the power supply 705 and a symmetric 900 ns pulse width at about 200 kHz from the active droop control circuit 1201.

Various other voltage states with different durations and voltages can be created by changing the pulse width and/or the duty cycle of the switches in the active droop control circuit 1201 and/or the pulse width of the pulses produced by the power supply 705. DC power supply 151 may also be adjusted to create various voltage states.

Figure 17A:
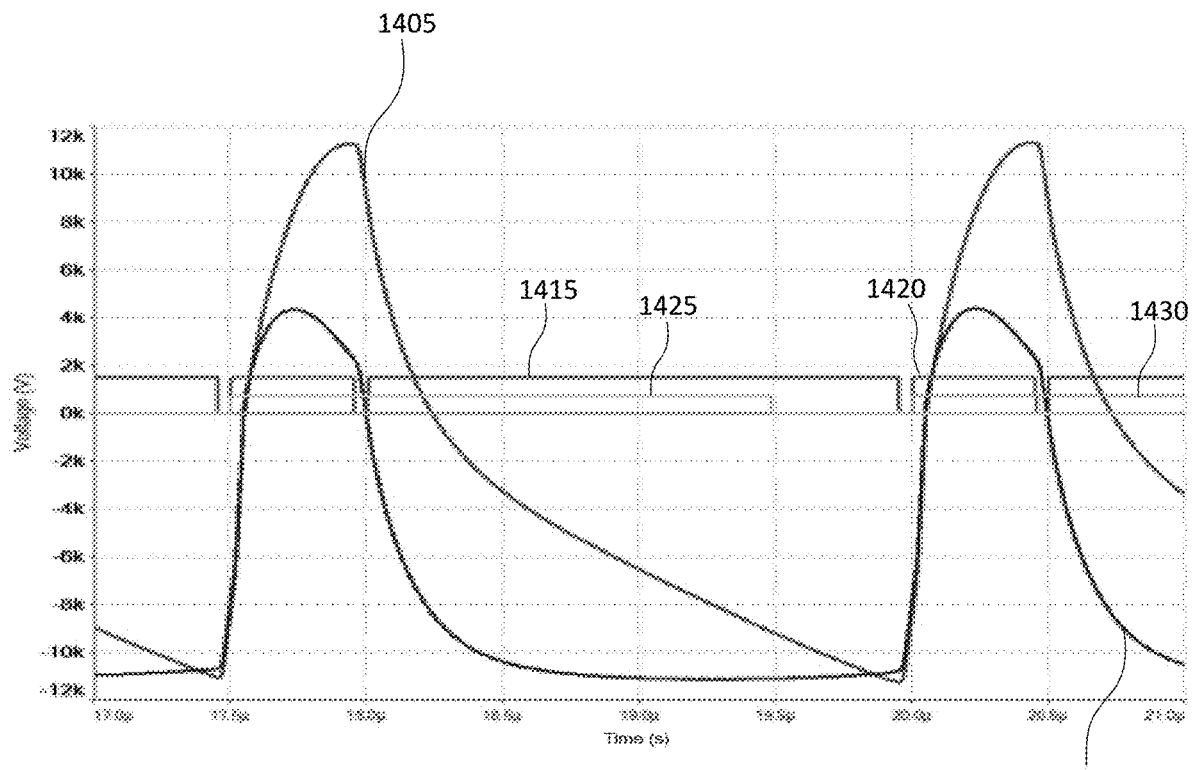
FIG. 17A shows zoomed in views of the waveform shown in FIG. 16A

FIG. 17A shows zoomed in views of the waveform shown in FIG. 16A at approximately 20 µs showing two pulses within the first state 1605 along with the control waveform 1415, control waveform 1420, energy recovery waveform 1425, and energy recovery waveform 1430.

Figure 17B:
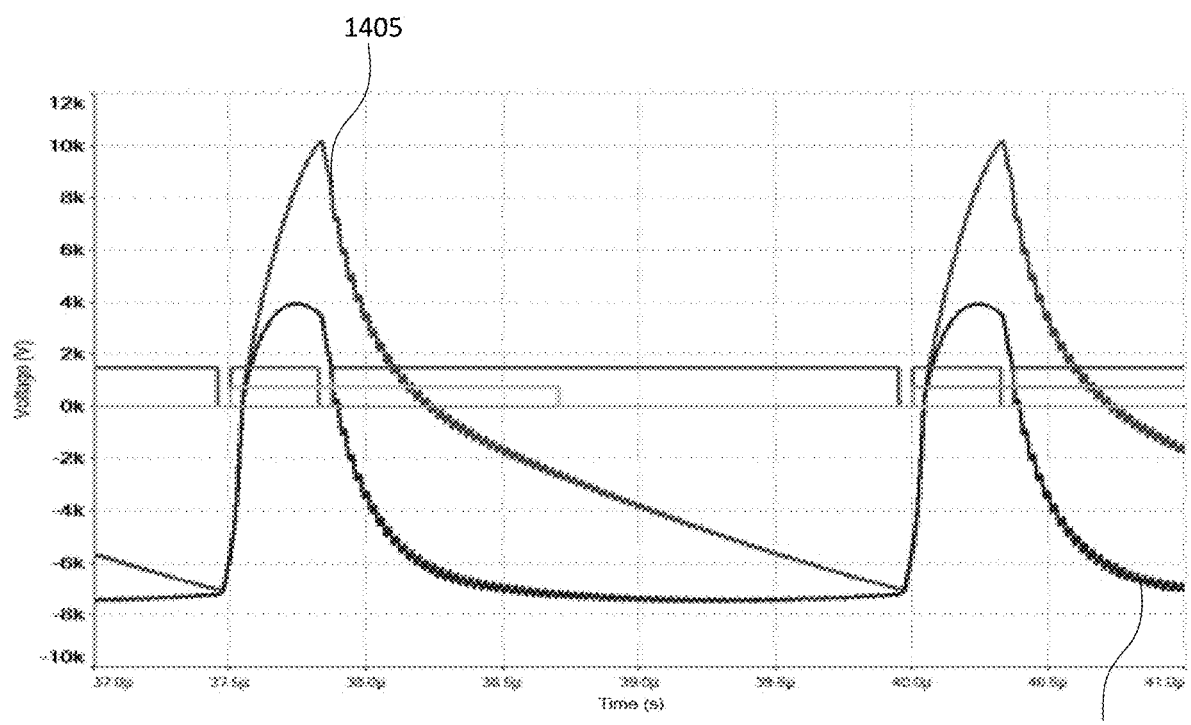
FIG. 17B shows zoomed in views of the waveform shown in FIG. 16A.

FIG. 17B shows zoomed in views of the waveform shown in FIG. 16A at approximately 40 µs showing two pulses within the second state 1610 along with the control waveform 1415, control waveform 1420, energy recovery waveform 1425, and energy recovery waveform 1430.

Figure 17C:
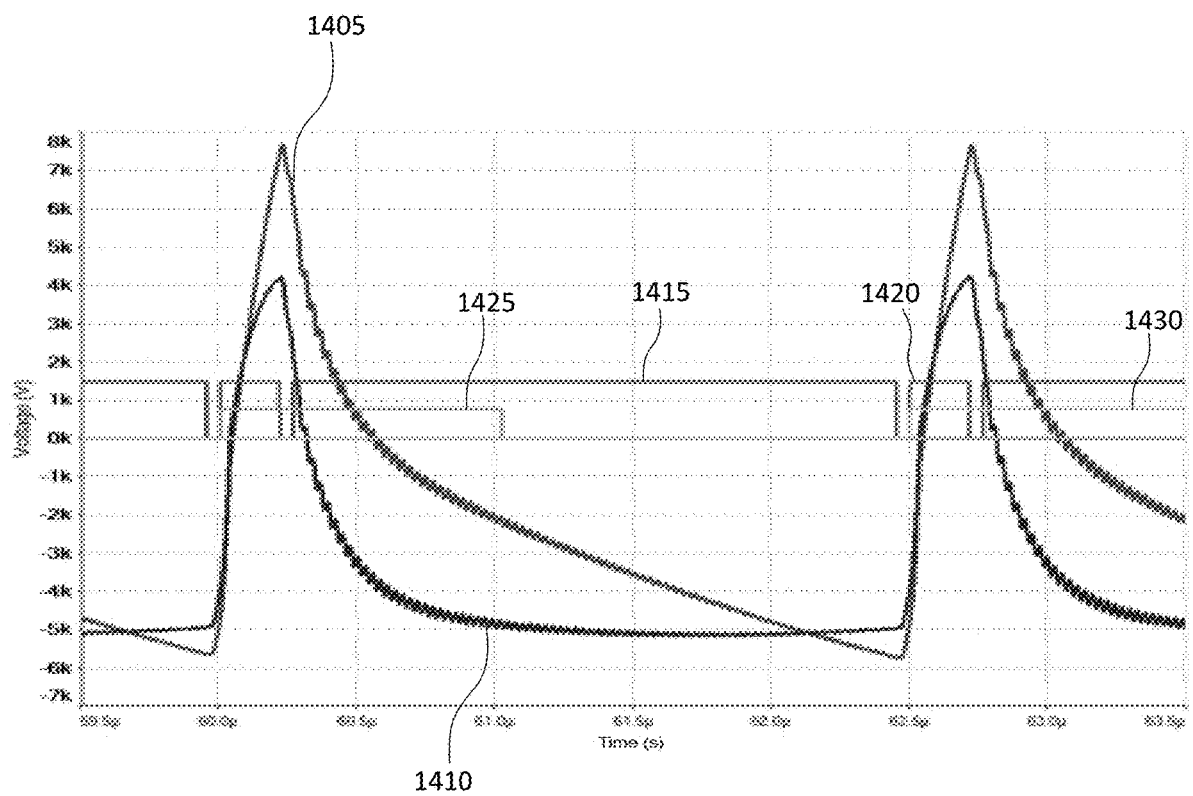
FIG. 17C shows zoomed in views of the waveform shown in FIG. 16A.

FIG. 17C shows zoomed in views of the waveform shown in FIG. 16A at approximately 60 µs showing two pulses within the third state 1615 along with the control waveform 1415, control waveform 1420, energy recovery waveform 1425, and energy recovery waveform 1430.

Figure 17D:
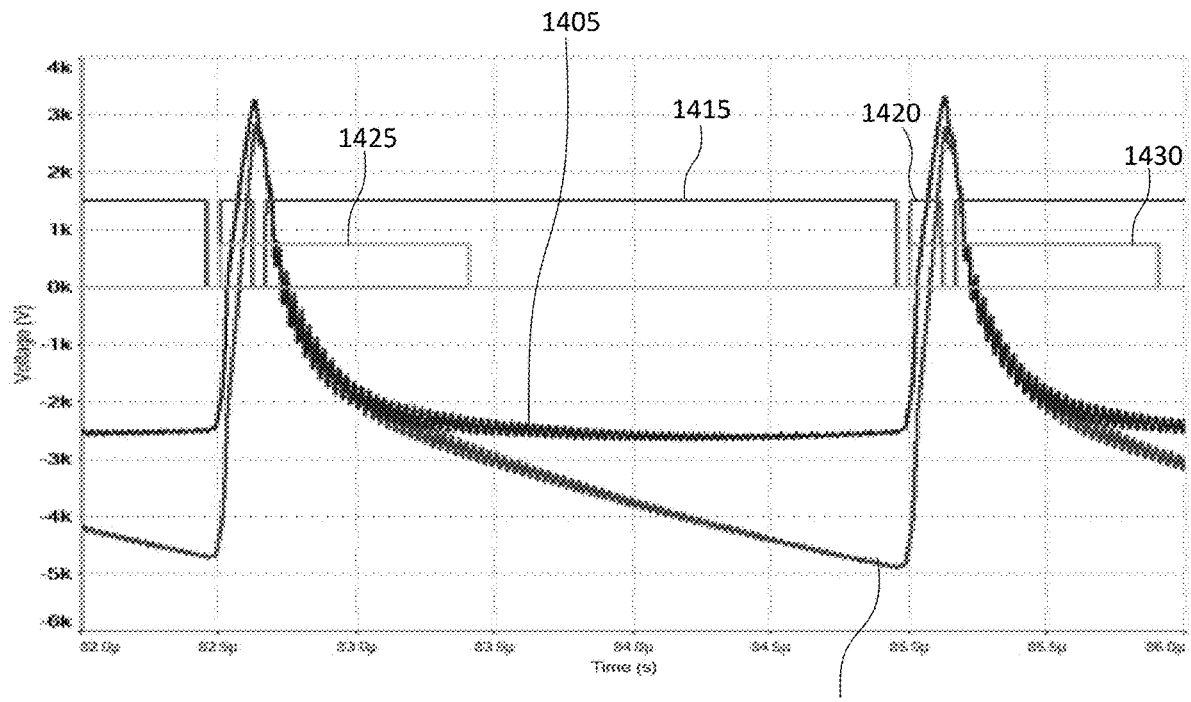
FIG. 17D shows zoomed in views of the waveform shown in FIG. 16A.

FIG. 17D shows zoomed in views of the waveform shown in FIG. 16A at approximately 80 µs showing two pulses within the fourth state 1620 along with the control waveform 1415, control waveform 1420, energy recovery waveform 1425, and energy recovery waveform 1430.

The timing of all control waveforms may be continuously adjusted across all relevant or needed time ranges to create the desired output waveforms. The timing precision of the waveform adjustment may be less than 1 s, 1 ms, 1 µs, 1 ns, or less, as needed to create the desired waveforms. Specific waveforms or patterns of waveforms will typically be selected to optimize a particular plasma process, such as for example increasing the rate of plasma etch, controlling the width of the features etched, controlling the aspect ratio of features eted, controlling the mask etch rate, etc. The waveforms may be adjusted to control a wide variety of plasma processes and features. By adjusting the output waveforms, the resultant ion energy distribution function may be adjusted. The voltage across droop capacitor 486 and all the switch timings may be adjusted to adjust the output waveforms, the output current, the resultant ion energy distribution function, and any number of specific plasma and/or etch features. This invention specifically allows for the ability to adjust plasma and etch parameters, such as the ion energy distribution function, over a wide and often continuous operating space. It can do this in a steady state fashion where all pulses are the same with a specific ion energy distribution function, or by modulating the output pulses to create aggregate waveforms with a specific aggregate ion energy distribution function. During any particular etch process, it may be advantageous to continuously optimize the ion energy distribution function through the etch process.

Figure 18:
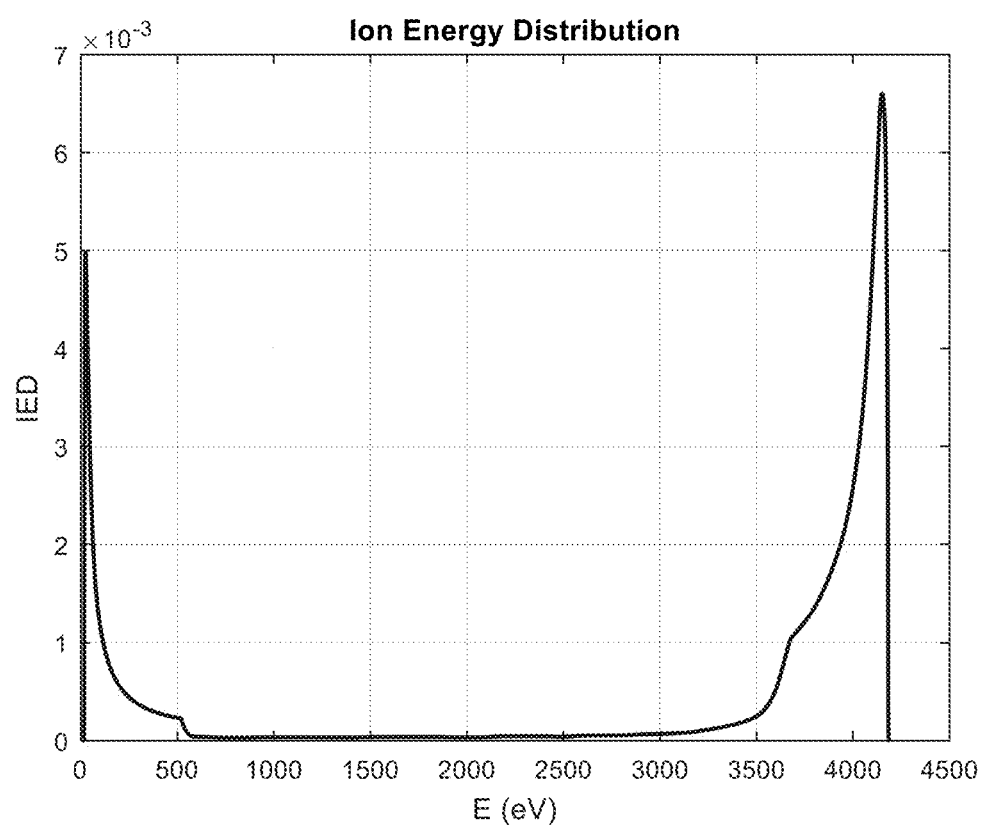
FIG. 18 shows the ion energy distribution for ions within an example chamber of the high voltage pulsing power supply and plasma system shown in FIG. 12.

FIG. 18 shows an ion energy distribution function (ion energy distribution function) for ions within the plasma chamber 106 of the plasma system 1200 with the pulses and configuration described in conjunction with FIG. 17B.

Figure 19:
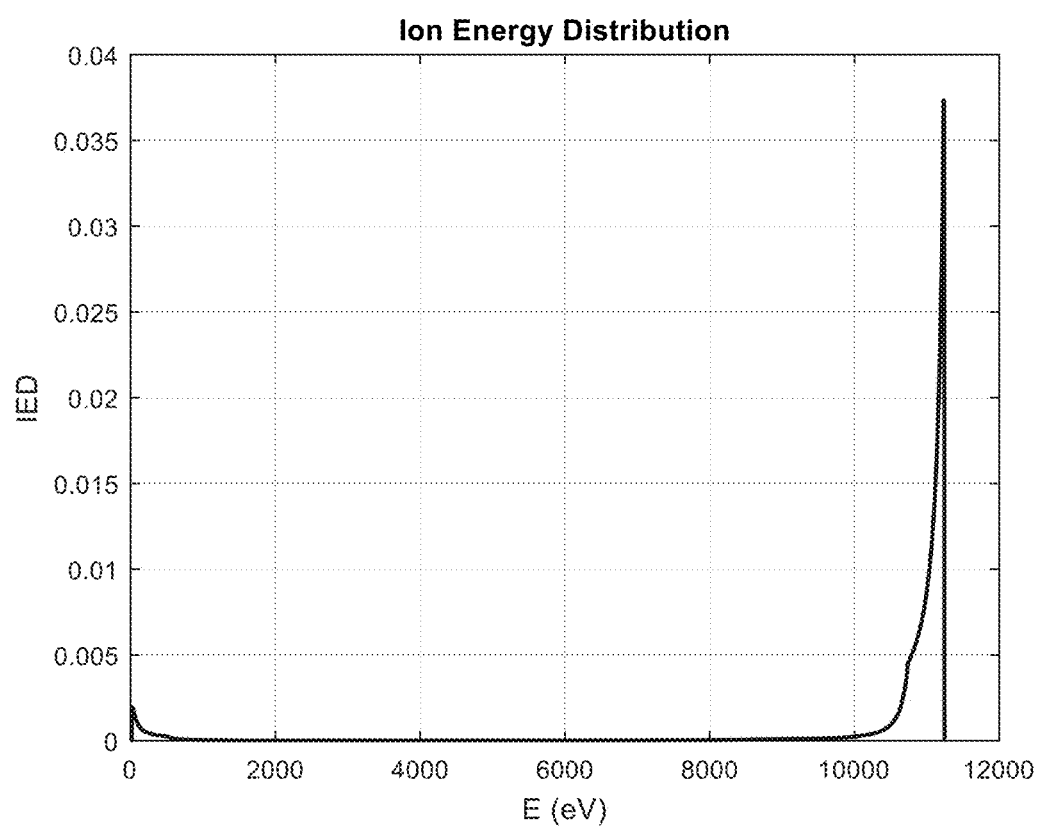
FIG. 19 shows the ion energy distribution for ions within an example chamber of the high voltage pulsing power supply and plasma system shown in FIG. 12.

FIG. 19 shows an ion energy distribution for ions within the plasma chamber 106 of the plasma system 1200 with the pulses and configuration described in conjunction with FIG. 17A.

Figure 20A:
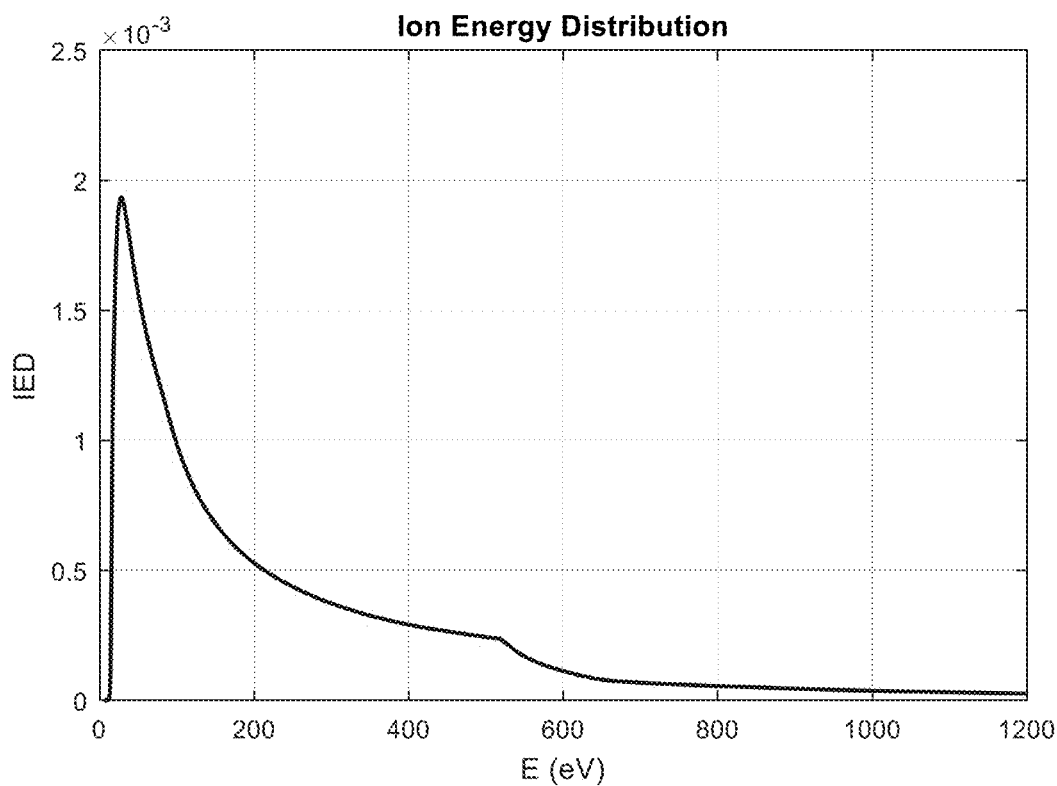
FIG. 20A shows a low end energy distribution function.
Figure 20B:
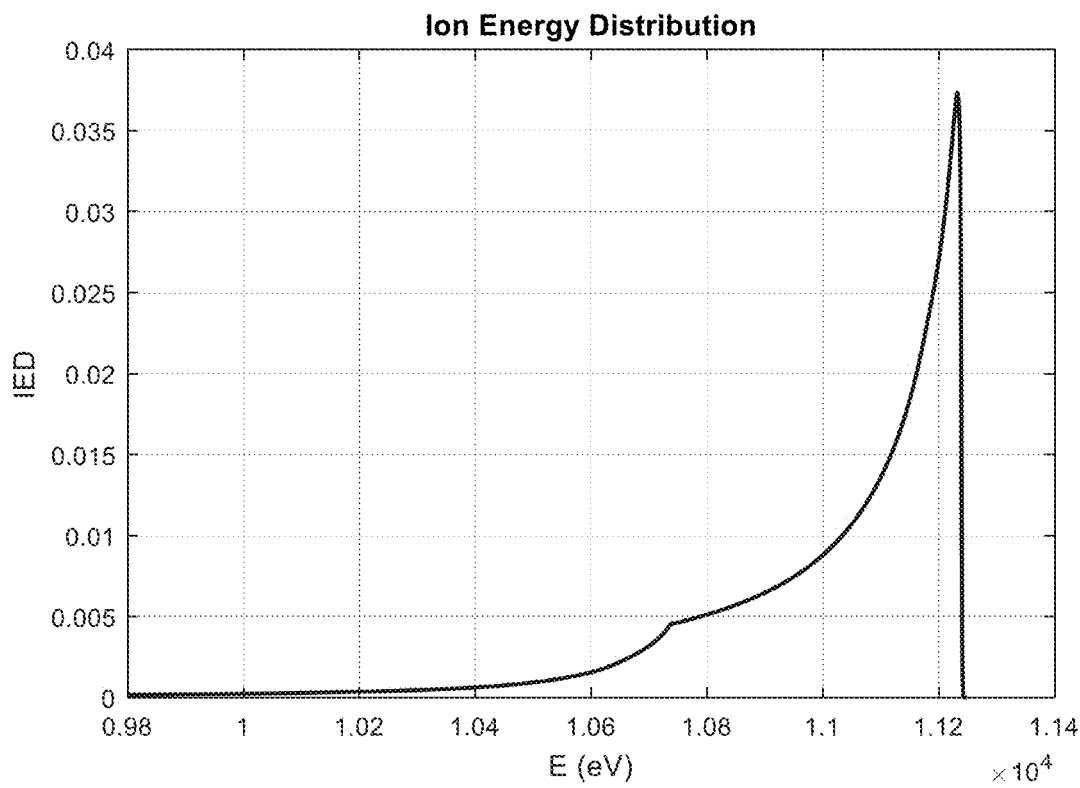
FIG. 20B shows a high end energy distribution function.

FIG. 20A shows the low end energy distribution function shown in FIG. 19 and FIG. 20B shows the high end energy distribution function shown in FIG. 19. The plasma system 1200 can produce an ion energy distribution that is substantially flat for various ion energies, which may lead to wafer voltage that is nearly constant for extended periods.

FIG. 21 is a circuit diagram of a high voltage pulsing power supply and plasma system 2100 with a droop control circuit 2150, and an energy control circuit 2101. The droop control circuit 2150 includes a diode 2140 coupled in series with inductor 2145. Positive going pulses from the secondary side of the transformer 145 pass through diode 2140 and inductor 2145 to plasma chamber 106. FIG. 21 shows an instance where the droop control elements and energy recovery elements have been placed on the secondary of the transformer. In general, the droop control elements and active droop control circuit 1201 may be placed either on the primary side of the transformer or the secondary side of the transformer. The overall function of the elements is the same, though the specific values used are scaled by the turns ratio of the transformer, with inductors becoming larger by the square of the turns ratio, and capacitors becoming smaller by the square of the turns ratio.

The series combination of the droop inductor 2120 and the droop capacitor 2130 may be arranged in parallel or across the diode 2140 and/or inductor 2145. The droop control circuit 2101 controls the voltage ramp on the transformer 145 so the peak voltage is reached later in the pulse. The droop inductor 2120 is energized during the negative voltage portions of a bipolar pulse and once the full charge voltage is present on the inductor 2145 or the plasma chamber 106, an equilibrium is reached where energy is extracted from the droop inductor 2120 during the positive pulse at a rate roughly equal to which it is gained. During a positive pulse of a bipolar pulse, the current flows from the secondary side of the transformer 145 through diode 2140 and inductor 2145 to the plasma chamber 106.

Capacitor 2130 may also be a resistor or an inductor. If it is a capacitor, it may be coupled with an active energy recovery circuit that regulates the voltage across capacitor 2130 in order to select the desired output voltage waveforms.

The energy compensation circuit 2101 is coupled with the secondary side of the transformer 145 and with energy storage capacitor 156. The energy compensation circuit 2101, for example, includes an energy recovery diode 2105 and an energy recovery inductor 2110. The energy recovery diode 2105 and the energy recovery inductor 2110 may be coupled with the secondary side of the transformer 145 via diode 2115 and droop control circuit. Inductor 2105 may have a value greater than 1 pH, 10 µH, 100 µH, or 10 mH.

Figure 22:
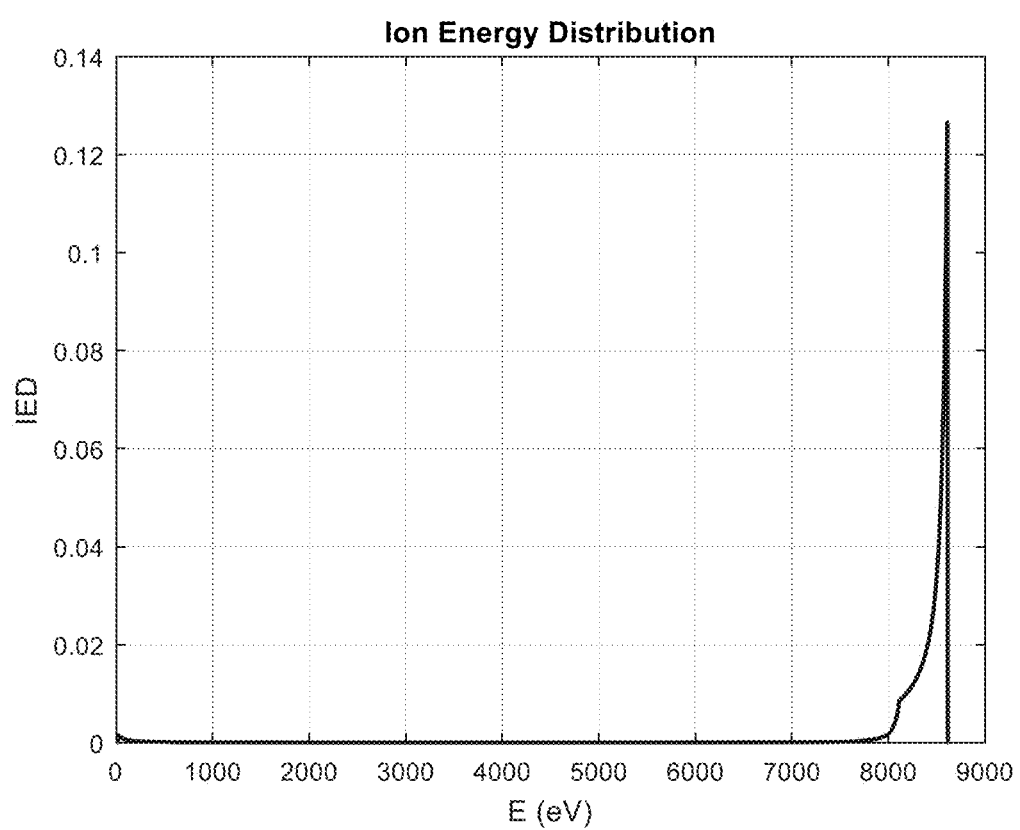
FIG. 22 shows the ion energy distribution for ions within the high voltage pulsing power supply and plasma system shown in FIG. 21.

FIG. 22 shows the ion energy distribution for ions within the plasma chamber 106 of the plasma system 2100 (or any of the plasma systems disclosed in this document).

Figure 23A:
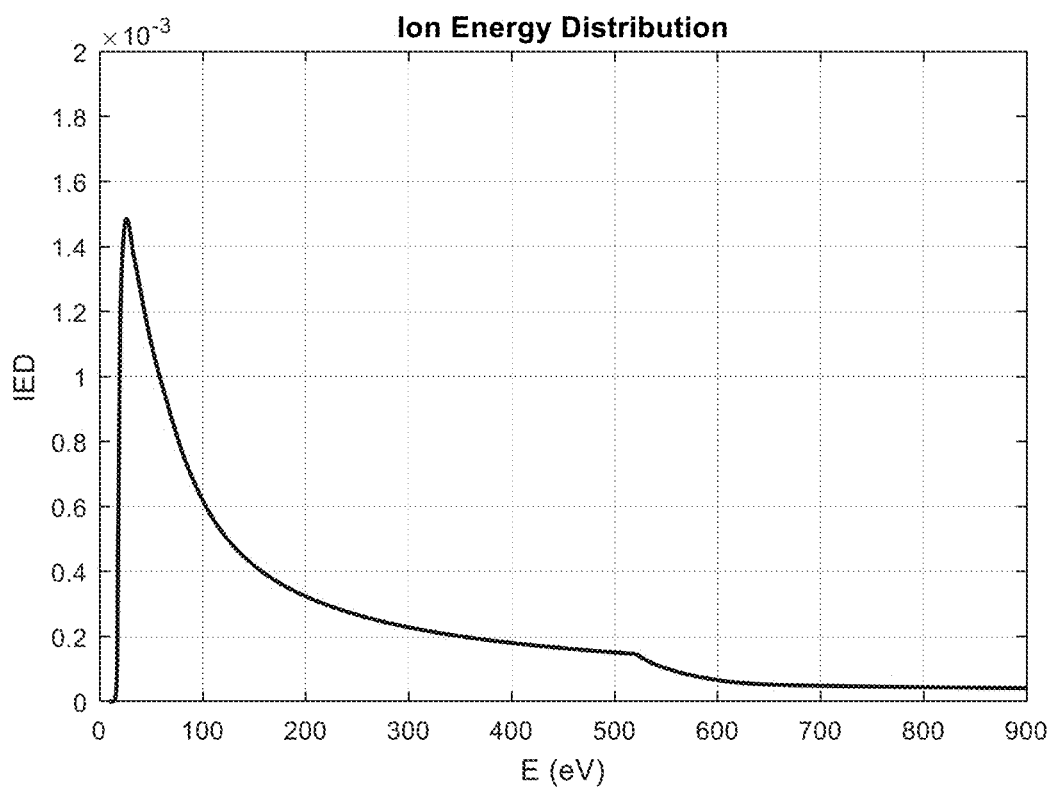
FIG. 23A shows a low end of the ion energy distribution.
Figure 23B:
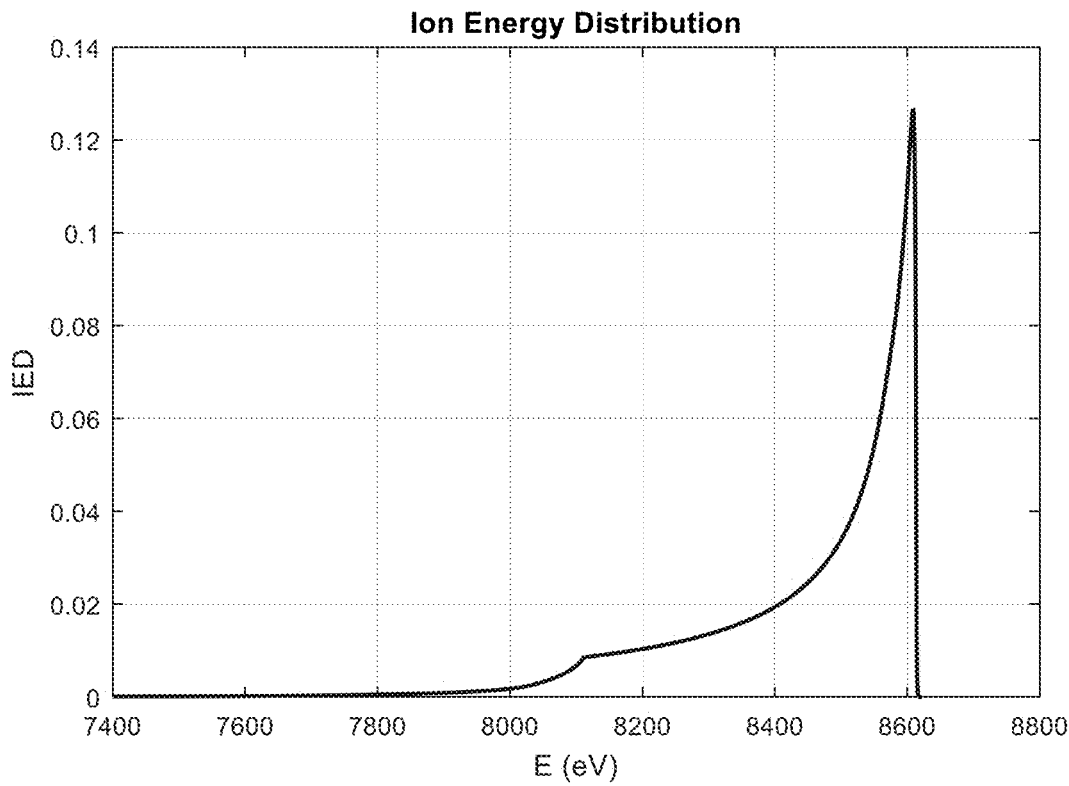
FIG. 23B shows a high end of the ion energy distribution.

FIG. 23A shows the low end of the ion energy distribution shown in FIG. 22 and FIG. 23B shows the high end of the ion energy distribution shown in FIG. 22. The plasma system 2100 (or any of the plasma systems disclosed in this document) can produce an ion energy distribution that is substantially flat for various ion energies (e.g., substantially flat for a substantial portion of ion energies) and peaked in a narrow band of ion energies, which may lead to wafer voltage that is nearly constant for extended periods. By adjusting the various droop control and energy recovery elements, any number of potential ion energy distribution functions can be created, Specific elements may be adjusted in real time to maintain specific plasma parameters, or to sweep across or control various plasma parameter ranges.

FIG. 24 is a circuit diagram of a high voltage pulsing power supply and plasma system 2400 with an active droop control circuit 2401. The high voltage pulsing power supply and plasma system 2400 includes the high voltage pulsing power supply 105 coupled with the active droop control circuit 2401 and the plasma chamber 106. The active droop control circuit may be operated in a way to create various output waveforms and various ion energy distribution functions in a manner that is equivalent to the operation of the droop control and active energy recovery circuits described above. FIG. 24 is yet another instance of this creation.

The active droop control circuit 2401, for example, may be coupled with the droop inductor 187 on the primary side of the transformer 145. The active droop control circuit 2401 can add and/or remove charge from the droop capacitor 486. When switch 2408 is closed and switch 2410 is open, charge stored in the droop capacitor 486 can be dissipated into the resistor 2406. The resistor 2406, for example, may have a resistance of about 0.1 Ohm, 3 Ohms, or 367 Ohms.

When the switch 2408 is open and the switch 2410 is closed, the droop capacitor 486 may be charged from the voltage source 2412 through the inductor 2404. The voltage source 2412, for example, may have a voltage of about 0 V, 100 V, 500 V or 5000 V for example. The voltage source 2412, for example, may provide a voltage that is always within about 10 V, 300 V or 5000 V of the DC power supply 150 and/or DC power supply 151.

Figure 25:
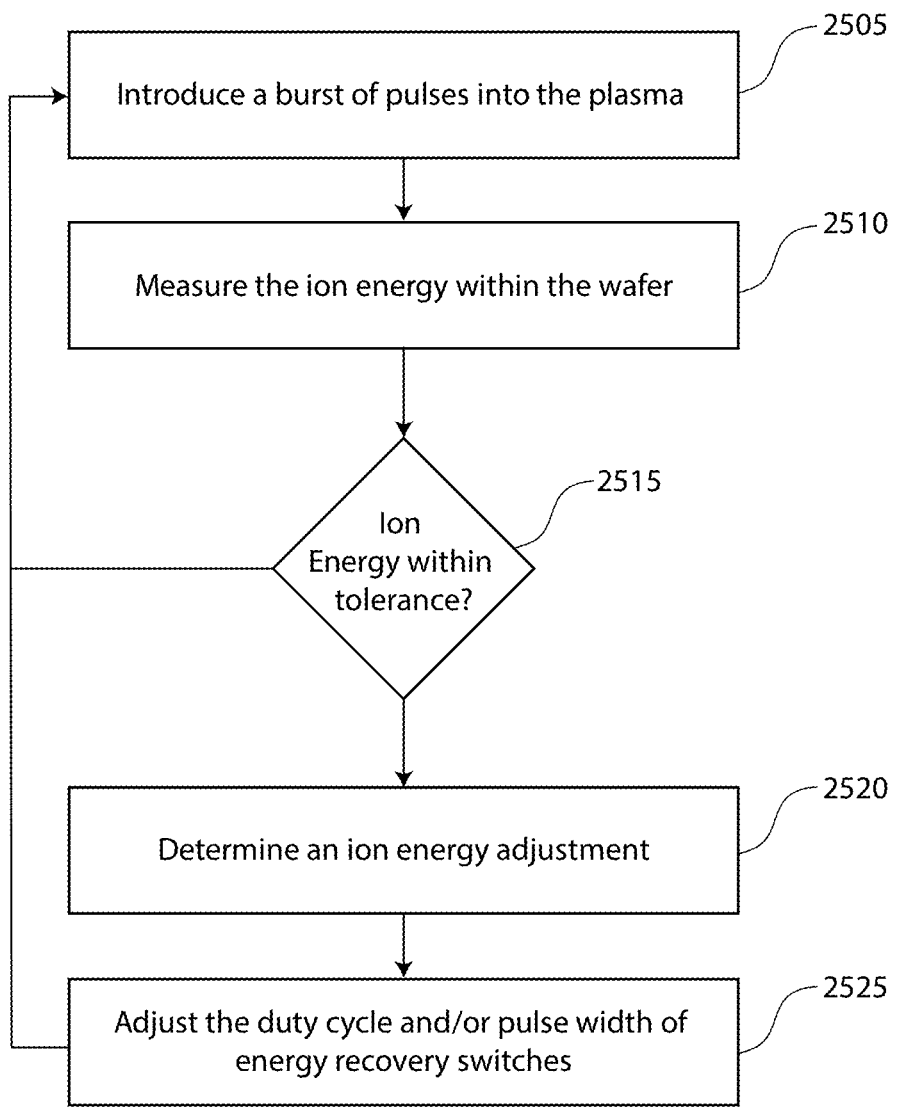
FIG. 25 is a flowchart of an example process for controlling the voltage droop on a wafer between pulses.

FIG. 25 is a flowchart of an example process 2500 for controlling the ion energy distribution on a wafer. At block 2505 a plurality of high voltage pulses (e.g., a burst of pulses) are introduced into a plasma via a high voltage pulser. The process 2500 may be operable for plasma system 2400, plasma system 2100, and/or 1200.

At block 2510 the ion energy distribution on the wafer can be measured, estimated, or calculated. The ion energy distribution on the wafer can be estimated by measuring the voltage out of the pulsing power supply, the voltage at capacitor 12, the current out of the pulsing power supply, and/or the plasma density within the chamber.

At block 2515, it can be determined whether the ion energy distribution on the wafer, if any, is within tolerances. If it is, then process 2500 can return to block 2505. If it is not, then process 2505 can proceed to block 2520.

At block 2520, an ion energy distribution adjustment can be determined based on the measured ion energy distribution and/or on a prescribed or desired ion energy distribution.

At block 2525, the duty cycle and/or the pulse width (open/close duration) of energy recovery switches can be adjusted. Process 2500 can then return to block 2505.

Numerous other control processes for this system may be envisioned. The parameters that can be measured and/or adjusted using some/any form of real time feedback and control include all aspects of the output voltage and current waveforms, any and/or all switch timings, various component values, ion energy distribution functions, and any number of the plasma and/or etch parameters. For example, the voltage across the droop capacitor 720 and/or the droop capacitors 725 may be controlled to maintain a specific etch rate, aspect ratio, mask erosion rate, and/or feature size. For example, the output voltage waveform may be monitored and set in real time to maintain a specific ion energy distribution function, or to map out/sweep out a specific set of ion energy distribution functions. The ion energy distribution functions selected may be selected to optimize one or many specific etch parameters such as, for example, etch rate, aspect ratio, and/or feature size. For example, the droop rate might be varied to control the mask erosion rate.

FIG. 26 is an illustration of an example waveform with two ideal bursts of pulses: first burst 2605 and second burst 2606. A single burst may include a plurality of pulses 2610. A burst duration is the time period when a burst is on, $T_{on}$, and the burst is off, $T_{off}$. A pulse width, $P_{width}$, is the period of time that the pulse is on. The pulse period, $P_{period}$, is the time period when the pulse is on and off. The duty cycle may be represented by the on time, $T_{on}$, divided by the burst duration:

$$DC = \frac{T_{on}}{T_{on} + T_{off}}.$$

The burst repetition frequency can be represented by the reciprocal of the burst period:

$$f_{burst} = 1/(T_{on} + T_{off}).$$

The pulse repetition frequency can be represented by the reciprocal of the pulse period:

$$f_{pulse} = 1/P_{period}.$$

A positive waveform has bursts of pulses with the lowest voltage $V_0$ and the pulse amplitude $V_1$ both above zero. A negative waveform has bursts of pulses with lowest voltage $V_0$ and the pulse amplitude $V_1$ both below zero. A bipolar waveform has bursts of pulses with lowest voltage $V_0$ below zero and the pulse amplitude $V_1$ above zero.

Figure 27:
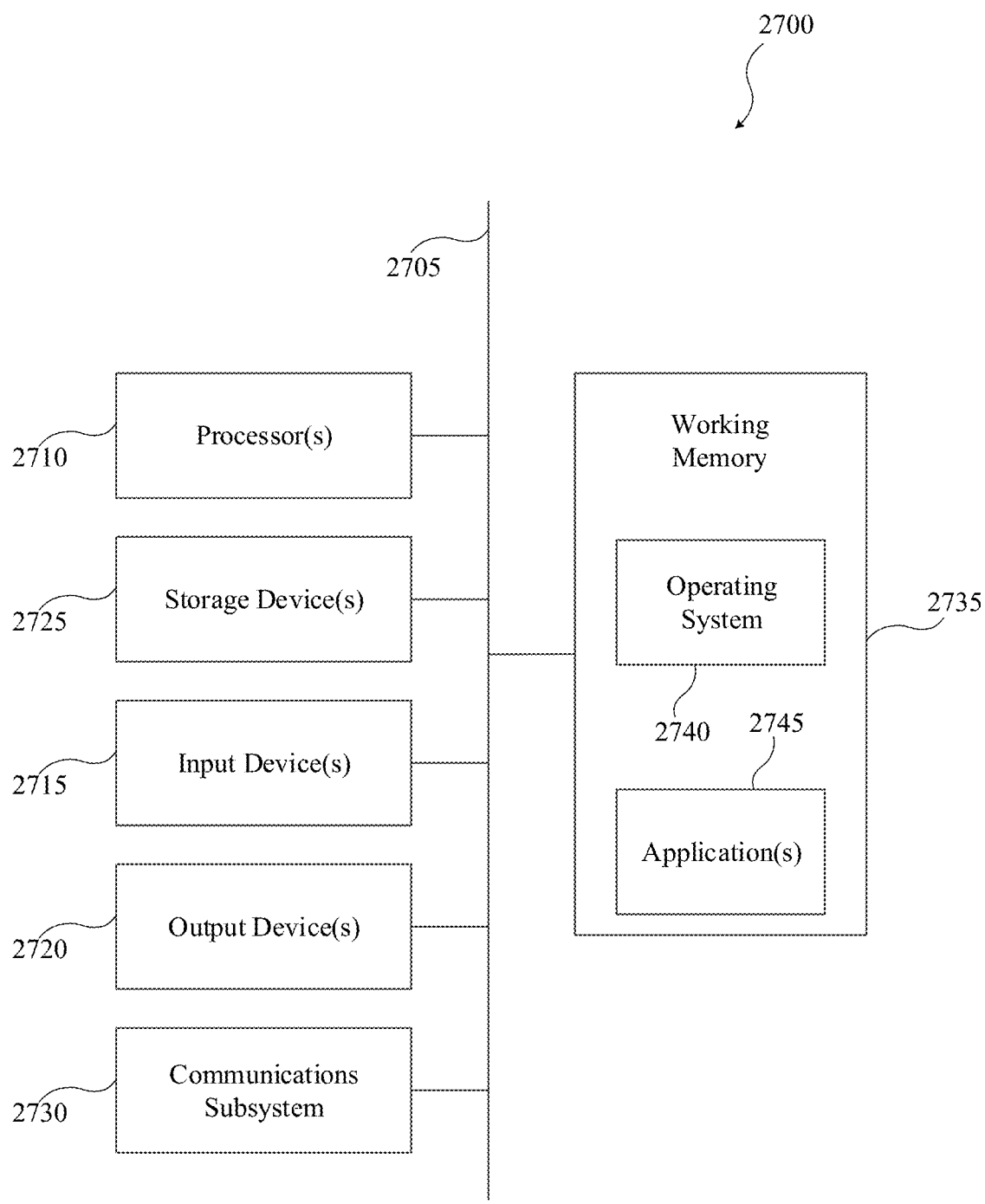
FIG. 27 is a block diagram of a computational system that can be used to with or to perform some embodiments described in this document.

The computational system 2700, shown in FIG. 27 can be used to perform any of the embodiments of the invention. For example, computational system 2700 can be used to execute any or all of process 2500 and/or any of the feedback and control processes discussed above. As another example, computational system 2700 can perform any calculation, identification and/or determination described in this document. Computational system 2700 includes hardware elements that can be electrically coupled via a bus 2705 (or may otherwise be in communication, as appropriate). The hardware elements can include one or more processors 2710, including without limitation one or more general-purpose processors and/or one or more special-purpose processors (such as digital signal processing chips, graphics acceleration chips, and/or the like); one or more input devices 2715, which can include without limitation a mouse, a keyboard and/or the like; and one or more output devices 2720, which can include without limitation a display device, a printer and/or the like.

The computational system 2700 may further include (and/or be in communication with) one or more storage devices 2725, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 2700 might also include a communications subsystem 2730, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 2730 may permit data to be exchanged with a network (such as the network described below, to name one example), and/or any other devices described in this document. In many embodiments, the computational system 2700 will further include a working memory 2735, which can include a RAM or ROM device, as described above.

The computational system 2700 also can include software elements, shown as being currently located within the working memory 2735, including an operating system 2740 and/or other code, such as one or more application programs 2745, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 2725 described above.

In some cases, the storage medium might be incorporated within the computational system 2700 or in communication with the computational system 2700. In other embodiments, the storage medium might be separate from a computational system 2700 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 2700 and/or might take the form of source and/or installable code, which, upon compilation and/or installation on the computational system 2700 (e.g., using any of a variety of generally available compilers, installation programs, compression/decompression utilities, etc.) then takes the form of executable code.

The above general description and the associated optimization/operating space description may generally apply to all of the circuits disclosed in the description or any of the drawings in one form or another. All the circuits may operate in a similar way; for example, where a brief positive pulse may reset the system and cancel the buildup of charge on the wafer from the previously flowing ion current; where the current in the droop inductor (e.g., droop inductor 187) may set the voltage on the wafer and/or may reduce, eliminate, or reverse any voltage droop; where the current may be set by balancing of the energy that flows into the droop inductor with the energy that flows out of the droop inductor (e.g., by balancing the positive volt seconds across the inductor with the negative volt seconds); and/or where the net energy balance of the energy that flows into and out of the droop inductor may be set by the energy recovery circuit, whether the energy recovery circuit is active or passive in nature.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained in software to be used in programming or configuring a computing device.

Embodiments of the methods disclosed may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage pulsing power supply system comprising:
   a DC power supply;
   a switch circuit electrically coupled with the DC power supply, the switch circuit comprising a plurality of switch modules arranged in a full bridge configuration, the switching circuit produces a plurality of pulses having a positive pulse portion, a negative pulse portion, and an amplitude greater than about 10 kV;
   a transformer comprising:
      a transformer core;
      a primary windings wound around the transformer core; and
      a secondary winding wound around the transformer core;
   a droop control circuit electrically coupled with the switch circuit and the primary winding, the droop control circuit comprising:
      a droop diode electrically coupled in series between the switch circuit and the primary winding that allows the negative pulse portion of the plurality of pulses to pass from the switching circuit to the primary winding of the transformer; and
      a droop inductor and a droop element arranged in series across the droop diode that allows the negative pulse portion of the plurality of pulses to pass from the switching circuit to the primary winding of the transformer and stores energy from the negative pulse portion of the plurality of pulses; and
   an energy recovery circuit electrically coupled with the droop element and the high voltage power supply and comprising one or more switch modules that open and close to add or remove charge to or from the droop element, wherein the one or more switch modules are arranged in a full bridge or half bridge configuration; and
   an output electrically coupled with the secondary winding that outputs the plurality of pulses with a substantially flat negative pulse portion.

2. The high voltage pulsing power supply according to claim 1, wherein the droop element comprises a capacitor or a resistor.

3. The high voltage pulsing power supply according to claim 1, wherein the droop inductor has an inductance between about 1 µH and about 10 mH.

4. The high voltage pulsing power supply according to claim 1, wherein the high voltage pulsing power supply is coupled with a plasma chamber having a plasma, and wherein the output produces an ion energy distribution that is substantially flat for a substantial portion of ion energies and peaked in a narrow band of ion energies.

5. The high voltage pulsing power supply according to claim 1, wherein the energy recovery circuit includes a diode and inductor arranged in series between the droop element and the high voltage power supply.

6. The high voltage pulsing power supply according to claim 1, wherein the energy recovery circuit includes a DC-DC converter.

7. The high voltage pulsing power supply according to claim 1, further comprising a plasma chamber having one or more electrodes, the one or more electrodes electrically coupled with the output, wherein the plurality of pulses produce an ion energy distribution within the plasma that is substantially flat for a substantial portion of ion energies and peaked in a narrow band of ion energies.

8. A plasma system comprising:
   a DC power supply;
   a switch circuit electrically coupled with the DC power supply, the switch circuit comprising a plurality of switch modules arranged in a full bridge configuration, the switching circuit produces a plurality of pulses having a positive pulse portion, a negative pulse portion, and an amplitude greater than about 10 kV;
   a transformer comprising:
      a transformer core;
      a primary windings wound around the transformer core; and
      a secondary winding wound around the transformer core;
   a droop control circuit electrically coupled with the switch circuit and the primary winding, the droop control circuit comprising:
      a droop diode electrically coupled in series between the switch circuit and the primary winding that allows the negative pulse portion of the plurality of pulses to pass from the switching circuit to the primary winding of the transformer; and
      a droop inductor and a droop capacitor arranged in series across the droop diode that allows the negative pulse portion of the plurality of pulses to pass from the switching circuit to the primary winding of the transformer and stores energy from the negative pulse portion of the plurality of pulses;
   an energy recovery circuit electrically coupled with the droop capacitor and the high voltage power supply, the energy recovery circuit comprising one or more switch modules that open and close to add or remove charge to or from the droop capacitor; and
   a plasma chamber having one or more electrodes, the one or more electrodes electrically coupled with the secondary winding, wherein the plurality of pulses produce an ion energy distribution within the plasma that is substantially flat for a substantial portion of ion energies and peaked in a narrow band of ion energies.

9. The high voltage pulsing power supply according to claim 8, wherein the plurality of pulses comprises a substantially flat negative pulse portion.

10. The high voltage pulsing power supply according to claim 8, wherein the droop inductor has an inductance between about 1 µH and about 10 mH.

11. The high voltage pulsing power supply according to claim 8, wherein the energy recovery circuit includes a DC-DC converter.

12. The high voltage pulsing power supply according to claim 8, wherein the energy recovery circuit includes a transformer between the plurality of switch modules and the DC-DC converter.

13. The high voltage pulsing power supply according to claim 8, wherein the energy recovery circuit comprises an energy recovery inductor and a diode arranged in series between the high voltage power supply and the one or more switch modules.

14. The high voltage pulsing power supply according to claim 8, wherein the one or more switch modules of the energy recovery circuit are arranged in a full bridge or half bridge configuration.

15. A high voltage pulsing power supply system comprising:
   a DC power supply;
   a switch circuit electrically coupled with the DC power supply, the switch circuit comprising a plurality of switch modules arranged in a full bridge configuration, the switching circuit produces a plurality of pulses having a positive pulse portion, a negative pulse portion, and an amplitude greater than about 10 kV;
   a transformer comprising:
      a transformer core;
      a primary windings wound around the transformer core; and
      a secondary winding wound around the transformer core;
   a droop control circuit electrically coupled with the switch circuit and the primary winding, the droop control circuit comprising:
      a droop diode electrically coupled in series between the switch circuit and the primary winding that allows the negative pulse portion of the plurality of pulses to pass from the switching circuit to the primary winding of the transformer; and
      a droop inductor and a droop capacitor arranged in series across the droop diode that allows the negative pulse portion of the plurality of pulses to pass from the switching circuit to the primary winding of the transformer and stores energy from the negative pulse portion of the plurality of pulses;
   an energy recovery circuit electrically coupled with the droop capacitor, the energy recovery circuit comprising a plurality of switch modules arranged in a half-bridge or full-bridge arrangement and a DC-DC converter, the plurality of switch modules open and close to add or remove charge to or from the droop capacitor; and
   an output electrically coupled with the secondary winding that outputs the plurality of pulses with a substantially flat negative pulse portion.

16. The high voltage pulsing power supply according to claim 15, further comprising a plasma chamber having one or more electrodes, the one or more electrodes electrically coupled with the output, wherein the plurality of pulses produce an ion energy distribution within the plasma that is substantially flat for a substantial portion of ion energies and peaked in a narrow band of ion energies.

17. The high voltage pulsing power supply according to claim 15, wherein the droop inductor has an inductance between about 1 µH and about 10 mH.

18. The high voltage pulsing power supply according to claim 15, wherein the energy recovery circuit comprises an energy recovery inductor and a diode arranged in series between the high voltage power supply and the DC-DC converter.

* * * * *